(12) United States Patent
Shin et al.

(10) Patent No.: US 9,093,369 B2
(45) Date of Patent: Jul. 28, 2015

(54) THREE-DIMENSIONAL RESISTIVE RANDOM ACCESS MEMORY DEVICES, METHODS OF OPERATING THE SAME, AND METHODS OF FABRICATING THE SAME

(71) Applicant: Samsung Electronics Co., Ltd., Suwon-si (KR)

(72) Inventors: Yoocheol Shin, Ywaseong-si (KR); Min Kyu Yang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 43 days.

(21) Appl. No.: 13/783,663

(22) Filed: Mar. 4, 2013

(65) Prior Publication Data
US 2013/0328005 A1   Dec. 12, 2013

(30) Foreign Application Priority Data

Jun. 7, 2012   (KR) ..................... 10-2012-0061129
Sep. 5, 2012   (KR) ..................... 10-2012-0098463

(51) Int. Cl.
*H01L 29/02* (2006.01)
*H01L 27/24* (2006.01)
*H01L 45/00* (2006.01)

(52) U.S. Cl.
CPC ........ *H01L 27/2436* (2013.01); *H01L 27/2454* (2013.01); *H01L 27/2481* (2013.01); *H01L 45/08* (2013.01); *H01L 45/1233* (2013.01); *H01L 45/146* (2013.01)

(58) Field of Classification Search
CPC ..................................... H01L 45/141
USPC .......... 257/1–5, 326, 317, 324, 758, E31.027; 438/129, 268, 382
See application file for complete search history.

(56) References Cited

U.S. PATENT DOCUMENTS

| 7,742,331 | B2 | 6/2010 | Watanabe |
| 2010/0178729 | A1 | 7/2010 | Yoon et al. |
| 2011/0068409 | A1 | 3/2011 | Kim et al. |
| 2011/0149656 | A1 | 6/2011 | Tang et al. |
| 2011/0199813 | A1 | 8/2011 | Yoo et al. |

(Continued)

FOREIGN PATENT DOCUMENTS

| KR | 1020110064551 | 6/2011 | |
| KR | 1020110121938 | 11/2011 | |
| WO | WO/2011056281 | * 12/2011 | ............ H01L 27/115 |

OTHER PUBLICATIONS

Yoshioka, et al., "High Density NAND Phase Change Memory With Block-Erase Architecture to Compromise Write and Disturb Requirements", IEEE 2012.

(Continued)

*Primary Examiner* — Mark A Laurenzi
(74) *Attorney, Agent, or Firm* — Onello & Mello, LLP

(57) ABSTRACT

A semiconductor device includes a substrate extending in a horizontal direction. An active pillar is present on the substrate extending in a vertical direction relative to the horizontal direction of extension of the substrate. A variable resistive pattern is present on the substrate extending in the vertical direction along the active pillar, an electrical resistance of the variable resistive pattern being variable in response to an oxidation or reduction thereof. A gate is present at a sidewall of the active pillar.

22 Claims, 48 Drawing Sheets

(56) References Cited

U.S. PATENT DOCUMENTS

2011/0235408 A1  9/2011  Minemura et al.
2012/0032245 A1  2/2012  Hwang et al.
2012/0104484 A1  5/2012  Lee et al.
2013/0228739 A1* 9/2013  Sasago et al. .................... 257/4

OTHER PUBLICATIONS

Sasago, et al., "Phase-Change Memory Driven by Poly-Si Mos Transistor With Low Cost and High-Programming Gigabyte-Per-Second Throughout", 2011 Symposium on VLSI Technology Disgest of Technical Papers.

* cited by examiner

THREE-DIMENSIONAL RESISTIVE RANDOM ACCESS MEMORY DEVICES, METHODS OF OPERATING THE SAME, AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0098463, filed on Sep. 5, 2012, the entire content of which is incorporated by reference herein.

BACKGROUND

1. Technical Field

The present disclosure herein relates to semiconductor devices and, more particularly, to three-dimensional resistive random access memory (3D RRAM) devices, methods of operating the same and methods of fabricating the same.

2. Description of Related Art

Three-dimensional integrated circuit (3D-IC) memory technologies have been proposed in an effort to increase the capacity of semiconductor memory devices. In various 3D-IC memory technology configurations, a plurality of memory cells are arranged in three dimensions. While fine-pattern technologies or multi-level cell (MLC) technologies have been considered in the furtherance of higher integration of memory devices, such fine-pattern technologies are commonly associated with ever-higher fabrication costs, and MLC technologies carry with them certain limitations in increasing the number of data bits which can be stored in a single memory cell. Accordingly, 3D-IC memory technology approaches have become attractive as candidates of process design technologies for achieving increased memory capacity.

Recently, 'punch-and-plug' technology has been proposed as an example of 3D-IC memory technologies capable of greatly increasing memory capacity. Such punch-and-plug technology involves sequentially stacking a plurality of thin layers on a substrate and forming plugs that penetrate the plurality of thin layers.

SUMMARY

Various embodiments of the inventive concepts are directed to three-dimensional resistive random access memory (3D RRAM) devices, methods of operating the same and methods of fabricating the same.

According to some embodiments, a semiconductor device comprises: a substrate extending in a horizontal direction: an active pillar on the substrate extending in a vertical direction relative to the horizontal direction of extension of the substrate; a variable resistive pattern on the substrate extending in the vertical direction along the active pillar, an electrical resistance of the variable resistive pattern being variable in response to an oxidation or reduction thereof; and a gate at a sidewall of the active pillar.

In some embodiments, the active pillar is a cup-shaped structure including sidewalls and a base.

In some embodiments, the variable resistive pattern is a cup-shaped structure including sidewalls and a base.

In some embodiments, the variable resistive pattern is at an inner region of the sidewalls of the active pillar and on the base of the active pillar.

In some embodiments, the variable resistive pattern is a hollow structure including sidewalls at an inner region of the sidewalls of the active pillar.

In some embodiments, the active pillar is a cup-shaped structure including sidewalls and a base, and wherein the sidewalls of the active pillar comprise first and second active layers.

In some embodiments, the semiconductor device further comprises a pad of single crystal material between the active pillar and the substrate.

In some embodiments, the pad of single crystal material has outer sidewalls that are aligned with outer sidewalls of the active pillar.

In some embodiments, a bottom portion of the active pillar is in contact with the substrate and wherein a bottom portion of the resistive pattern is spaced apart from the bottom portion of the active pillar in the vertical direction.

In some embodiments, the resistive pattern has a thickness in the horizontal direction that is less than about 20 nm.

In some embodiments, the variable resistive pattern is a hollow structure having sidewalls and wherein the active pillar is at an inner region of the sidewalls of the variable resistive pattern.

In some embodiments, the semiconductor device further comprises: a plurality of interlayer dielectric layers on the substrate; a plurality of gate patterns, each gate pattern between a neighboring lower interlayer dielectric layer and a neighboring upper interlayer dielectric layer; wherein the active pillar and the variable resistive pattern extends in the vertical direction through the plurality of interlayer dielectric layers and the plurality of gate patterns; wherein: an upper-most gate pattern of the plurality of gate patterns comprises an upper select gate of an upper select transistor; a lower-most gate pattern of the plurality of gate patterns comprises a lower select gate of a lower select transistor; and remaining gate patterns of the plurality of gate patterns between the upper select gate and the lower select gate comprise control gates of memory cell transistors of a common string of the semiconductor device; and wherein the semiconductor device comprises a semiconductor memory device.

In some embodiments: control gates of memory cell transistors sharing a same layer of the device arranged in a first horizontal direction of the semiconductor device are connected to provide word lines of the semiconductor memory device; memory cell transistors of a common string of the semiconductor device are coupled together in series by the vertical channel; and upper portions of vertical channels arranged in a second horizontal direction of the semiconductor device are connected to provide bit lines of the semiconductor memory device.

In some embodiments: the upper-most gate pattern comprises first and second upper-most gate patterns for first and second upper select gates of first and second upper select transistors of the semiconductor memory device; and the lower-most gate pattern comprises first and second lower-most gate patterns for first and second lower select gates of first and second lower select transistors of the semiconductor memory device.

In some embodiments: the active pillar is adjacent, in the horizontal direction, the upper select gate of the upper select transistor, the lower select gate of the lower select transistor, and the control gates of the memory cell transistors; and the variable resistive pattern is adjacent, in the horizontal direction, the control gates of the memory cell transistors, and is not adjacent, in the horizontal direction, the upper select gate of the upper select transistor and the lower select gate of the lower select transistor.

In some embodiments, the semiconductor device further comprises a pad of single crystal material between the active pillar and the substrate.

In some embodiments: the active pillar is adjacent, in the horizontal direction, the upper select gate of the upper select transistor, the lower select gate of the lower select transistor, and the control gates of the memory cell transistors; and the variable resistive pattern is adjacent, in the horizontal direction, the control gates of the memory cell transistors and the lower select gate of the lower select transistor, and is not adjacent, in the horizontal direction, the upper select gate of the upper select transistor.

In some embodiments, the variable resistive pattern is a hollow structure having sidewalls and wherein the active pillar is at an inner region of the sidewalls of the variable resistive pattern.

In some embodiments, the semiconductor device further comprises a pad of single crystal material between the active pillar and the substrate, wherein: the pad of single crystal material is adjacent, in the horizontal direction, the lower select gate of the lower select transistor; the active pillar is adjacent, in the horizontal direction, the control gates of the memory cell transistors and the upper select gate of the upper select transistor; and the variable resistive pattern is adjacent, in the horizontal direction, the control gates of the memory cell transistors, and is not adjacent, in the horizontal direction, the lower select gate of the lower select transistor and the upper select gate of the upper select transistor.

In some embodiments, the semiconductor device further comprises a pad of single crystal material between the active pillar and the substrate, wherein: the pad of single crystal material is adjacent, in the horizontal direction, the lower select gate of the lower select transistor; the active pillar is adjacent, in the horizontal direction, the control gates of the memory cell transistors and the upper select gate of the upper select transistor; and the variable resistive pattern is adjacent, in the horizontal direction, the control gates of the memory cell transistors and the upper select gate of the upper select transistor, and is not adjacent, in the horizontal direction, the lower select gate of the lower select transistor.

In some embodiments: the active pillar is adjacent, in the horizontal direction, the lower select gate of the lower select transistor the control gates of the memory cell transistors and the upper select gate of the upper select transistor; and the variable resistive pattern is adjacent, in the horizontal direction, the control gates of the memory cell transistors, and is not adjacent, in the horizontal direction, the lower select gate of the lower select transistor and the upper select gate of the upper select transistor.

In some embodiments: the active pillar is adjacent, in the horizontal direction, the lower select gate of the lower select transistor the control gates of the memory cell transistors and the upper select gate of the upper select transistor; and the variable resistive pattern is adjacent, in the horizontal direction, the control gates of the memory cell transistors and the upper select gate of the upper select transistor, and is not adjacent, in the horizontal direction, the lower select gate of the lower select transistor.

In some embodiments: the active pillar is adjacent, in the horizontal direction, the lower select gate of the lower select transistor the control gates of the memory cell transistors and the upper select gate of the upper select transistor; and the variable resistive pattern is adjacent, in the horizontal direction, the lower select gate of the lower select transistor and the control gates of the memory cell transistors, and is not adjacent, in the horizontal direction, the upper select gate of the upper select transistor.

According to some embodiments, a semiconductor device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material on the substrate and extending in a vertical direction through the plurality of interlayer dielectric layers and the plurality of gate patterns; and a vertical channel of variable resistive material along the vertical channel of semiconductor material; wherein the vertical channel of variable resistive material has a variable electrical resistance in response to an oxidation or reduction thereof.

In some embodiments, a current flow in the vertical channel is bidirectional, a first direction of current flow during a program operation of the semiconductor device and a second direction of current flow opposite the first direction during an erase operation of the semiconductor device.

In some embodiments: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels of semiconductor material arranged in a second horizontal direction of the semiconductor device are connected to provide bit lines of the semiconductor device; and the semiconductor device comprises a semiconductor memory device.

In some embodiments, a current path is present along the vertical channel of semiconductor material between the substrate and an upper portion of the vertical channel of semiconductor material and wherein the lower select transistor and the upper select transistor control operation of the current path.

In some embodiments, the vertical channel of semiconductor material has an inner sidewall and an outer sidewall.

In some embodiments, the vertical channel of variable resistive material is at the inner sidewall of the vertical channel of semiconductor material.

In some embodiments, the vertical channel of variable resistive material is at the outer sidewall of the vertical channel of semiconductor material.

In some embodiments, the vertical channel of semiconductor material is a cup-shaped structure including sidewalls and a base.

In some embodiments, the vertical channel of variable resistive material is a cup-shaped structure including sidewalls and a base.

In some embodiments, the vertical channel of variable resistive material is at an inner region of the sidewalls of the vertical channel of semiconductor material and on the base of the vertical channel of semiconductor material.

In some embodiments, the vertical channel of variable resistive material is a hollow structure including sidewalls at an inner region of the sidewalls of the vertical channel of semiconductor material.

In some embodiments, the vertical channel of semiconductor material is a cup-shaped structure including sidewalls and a base, and wherein the sidewalls of the vertical channel of semiconductor material comprise first and second active layers.

In some embodiments, the semiconductor device further comprises a pad of single crystal material between the vertical channel of semiconductor material and the substrate.

In some embodiments, the pad of single crystal material has outer sidewalls that are aligned with outer sidewalls of the vertical channel of semiconductor material.

In some embodiments, a bottom portion of the vertical channel of semiconductor material is in contact with the substrate and wherein a bottom portion of the vertical channel of variable resistive material is spaced apart from the bottom portion of the vertical channel of semiconductor material in the vertical direction.

In some embodiments, the vertical channel of variable resistive material has a thickness in the horizontal direction that is less than about 20 nm.

In some embodiments, the vertical channel of variable resistive material is a hollow structure having sidewalls and wherein the vertical channel of semiconductor material is at an inner region of the sidewalls of the vertical channel of variable resistive material.

In some embodiments: an upper-most gate pattern of the plurality of gate patterns comprises an upper select gate of an upper select transistor; a lower-most gate pattern of the plurality of gate patterns comprises a lower select gate of a lower select transistor; and remaining gate patterns of the plurality of gate patterns between the upper select gate and the lower select gate comprise control gates of memory cell transistors of a common string of the semiconductor device; and the semiconductor device comprises a semiconductor memory device.

In some embodiments: control gates of memory cell transistors sharing a same layer of the device arranged in a first horizontal direction of the semiconductor device are connected to provide word lines of the semiconductor memory device; memory cell transistors of a common string of the semiconductor device are coupled together in series by the vertical channel; and upper portions of vertical channels of semiconductor material arranged in a second horizontal direction of the semiconductor device are connected to provide bit lines of the semiconductor memory device.

In some embodiments: the upper-most gate pattern comprises first and second upper-most gate patterns for first and second upper select gates of first and second upper select transistors of the semiconductor memory device; and the lower-most gate pattern comprises first and second lower-most gate patterns for first and second lower select gates of first and second lower select transistors of the semiconductor memory device.

In some embodiments: the vertical channel of semiconductor material is adjacent, in the horizontal direction, the upper select gate of the upper select transistor, the lower select gate of the lower select transistor, and the control gates of the memory cell transistors; and the vertical channel of variable resistive material is adjacent, in the horizontal direction, the control gates of the memory cell transistors, and is not adjacent, in the horizontal direction, the upper select gate of the upper select transistor and the lower select gate of the lower select transistor.

In some embodiments, the semiconductor device further comprises a pad of single crystal material between the vertical channel of semiconductor material and the substrate.

In some embodiments: the vertical channel of semiconductor material is adjacent, in the horizontal direction, the upper select gate of the upper select transistor, the lower select gate of the lower select transistor, and the control gates of the memory cell transistors; and the vertical channel of variable resistive material is adjacent, in the horizontal direction, the control gates of the memory cell transistors and the lower select gate of the lower select transistor, and is not adjacent, in the horizontal direction, the upper select gate of the upper select transistor.

In some embodiments, the vertical channel of variable resistive material is a hollow structure having sidewalls and wherein the vertical channel of semiconductor material is at an inner region of the sidewalls of the vertical channel of variable resistive material.

In some embodiments, the semiconductor device further comprises a pad of single crystal material between the vertical channel of semiconductor material and the substrate, wherein: the pad of single crystal material is adjacent, in the horizontal direction, the lower select gate of the lower select transistor; the vertical channel of semiconductor material is adjacent, in the horizontal direction, the control gates of the memory cell transistors and the upper select gate of the upper select transistor; and the vertical channel of variable resistive material is adjacent, in the horizontal direction, the control gates of the memory cell transistors, and is not adjacent, in the horizontal direction, the lower select gate of the lower select transistor and the upper select gate of the upper select transistor.

In some embodiments, the semiconductor device further comprises a pad of single crystal material between the vertical channel of semiconductor material and the substrate, wherein: the pad of single crystal material is adjacent, in the horizontal direction, the lower select gate of the lower select transistor; the vertical channel of semiconductor material is adjacent, in the horizontal direction, the control gates of the memory cell transistors and the upper select gate of the upper select transistor; and the vertical channel of variable resistive material is adjacent, in the horizontal direction, the control gates of the memory cell transistors and the upper select gate of the upper select transistor, and is not adjacent, in the horizontal direction, the lower select gate of the lower select transistor.

In some embodiments: the vertical channel of semiconductor material is adjacent, in the horizontal direction, the lower select gate of the lower select transistor the control gates of the memory cell transistors and the upper select gate of the upper select transistor; and the vertical channel of variable resistive material is adjacent, in the horizontal direction, the control gates of the memory cell transistors, and is not adjacent, in the horizontal direction, the lower select gate of the lower select transistor and the upper select gate of the upper select transistor.

In some embodiments: the vertical channel of semiconductor material is adjacent, in the horizontal direction, the lower select gate of the lower select transistor the control gates of the memory cell transistors and the upper select gate of the upper select transistor; and the vertical channel of variable resistive material is adjacent, in the horizontal direction, the control gates of the memory cell transistors and the upper select gate of the upper select transistor, and is not adjacent, in the horizontal direction, the lower select gate of the lower select transistor.

In some embodiments: the vertical channel of semiconductor material is adjacent, in the horizontal direction, the lower select gate of the lower select transistor the control gates of the memory cell transistors and the upper select gate of the upper select transistor; and the vertical channel of variable resistive material is adjacent, in the horizontal direction, the lower select gate of the lower select transistor and the control gates of the memory cell transistors, and is not adjacent, in the horizontal direction, the upper select gate of the upper select transistor.

According to some embodiments, a method of forming a semiconductor device comprises: providing a stack of alternate interlayer dielectric layers and sacrificial layers in a vertical direction on a substrate extending in a horizontal direction; forming an opening in the interlayer dielectric layers and the sacrificial layers; forming a vertical channel of semiconductor material in the opening, the vertical channel of semiconductor material extending in the vertical direction; forming a vertical channel of variable resistive material in the opening, the vertical channel of variable resistive material extending in the vertical direction, the vertical channel of variable resistive material having a variable electrical resistance in response to an oxidation or reduction thereof; and replacing the sacrificial layers with conductive patterns.

In some embodiments, forming the vertical channel of semiconductor material in the opening comprises forming the vertical channel of semiconductor material to have sidewalls at sidewalls of the opening.

In some embodiments, forming the vertical channel of variable resistive material in the opening comprises forming the vertical channel of variable resistive material at an inner region of the sidewalls of the vertical channel of semiconductor material In some embodiments, forming the vertical channel of variable resistive material in the opening comprises forming the vertical channel of variable resistive material to have sidewalls at sidewalls of the opening.

In some embodiments, forming the vertical channel of semiconductor material in the opening in the opening comprises forming the vertical channel of semiconductor material at an inner region of the sidewalls of the vertical channel of variable vertical channel of semiconductor material resistive material.

In some embodiments, the vertical channel of semiconductor material has a thickness in the horizontal direction that is less than about 20 nm.

In some embodiments, forming the vertical channel of semiconductor material in the opening comprises forming the vertical channel of semiconductor material in the opening in contact with the substrate.

In some embodiments, the method further comprises, prior to forming the vertical channel of semiconductor material in the opening, forming pad of single crystal material on the substrate in the opening, and forming the vertical channel of semiconductor material in the opening on the pad.

According to some embodiments, a method of controlling a semiconductor memory device is provided. The semiconductor memory device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material on the substrate and extending in a vertical direction through the plurality of interlayer dielectric layers and the plurality of gate patterns, the vertical channel having an outer sidewall and an inner sidewall; and a vertical channel of variable resistive material at the inner sidewall of the vertical channel of semiconductor material. The method comprises: selectively programming a selected one of a plurality of memory cells; and selectively erasing the programmed selected one of the plurality of memory cells; wherein selectively programming the selected one of the plurality of memory cells comprises programming by varying an electrical resistance of the vertical channel of variable resistive material in response to one of an oxidation and reduction thereof, and wherein selectively erasing the selected one of the plurality of memory cells comprises erasing by varying the electrical resistance of the vertical channel of variable resistive material in response to the other of an oxidation and reduction thereof.

In some embodiments, a current flow in the vertical channel of semiconductor material is bidirectional, a first direction of current flow during the selectively programming of the semiconductor device and a second direction of current flow opposite the first direction during the selectively erasing of the semiconductor device.

In some embodiments: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel of semiconductor material; upper portions of the vertical channels of semiconductor material arranged in a second horizontal direction of the semiconductor device are connected to provide bit lines of the semiconductor device; and the semiconductor device comprises a semiconductor memory device.

In some embodiments, a page of the memory cell transistors comprises memory cell transistors under control of a same control gate and wherein the selectively programming at least one of the plurality of memory cells comprises selectively programming less than the page of the memory cell transistors.

In some embodiments, a page of the memory cell transistors comprises memory cell transistors under control of a same control gate and wherein the selectively erasing at least one of the plurality of memory cells comprises selectively erasing less than the page of the memory cell transistors.

In some embodiments, selectively programming comprises: applying a low voltage to the substrate; applying a set voltage to the bit line to which the vertical channel of semiconductor material of the selected one of the plurality of the memory cells; applying an activation voltage to word lines associated with the unselected ones of the plurality of memory cells; and applying a deactivation voltage to a word line associated with the selected one of the plurality of memory cells.

In some embodiments, selectively erasing comprises: applying a reset voltage to the substrate; applying a low voltage to the bit line to which the vertical channel of semiconductor material of the selected one of the plurality of the memory cells; applying an activation voltage to word lines associated with the unselected ones of the plurality of memory cells; and applying a deactivation voltage to a word line associated with the selected one of the plurality of memory cells.

In some embodiments, selectively erasing comprises: applying a low voltage to the substrate; applying a sensing voltage to the bit line to which the vertical channel of semiconductor material of the selected one of the plurality of the memory cells; applying an activation voltage to word lines associated with the unselected ones of the plurality of memory cells; and applying a deactivation voltage to a word line associated with the selected one of the plurality of memory cells.

According to some embodiments, a memory system comprises: a memory controller that generates command and address signals; and a memory module comprising a plurality of memory devices, the memory module receiving the command and address signals and in response storing and retrieving data to and from at least one of the memory devices. Each memory device comprises: a substrate extending in a horizontal direction: an active pillar on the substrate extending in a vertical direction relative to the horizontal direction of extension of the substrate; a variable resistive pattern on the substrate extending in the vertical direction along the active pillar, an electrical resistance of the variable resistive pattern being variable in response to an oxidation or reduction thereof; and a gate at a sidewall of the active pillar.

According to some embodiments, a resistive RAM device includes a substrate, an active pillar disposed on the substrate to have a hollow structure, a variable resistive pattern contacting the active pillar, and a gate disposed to be adjacent to a sidewall of the active pillar. An electrical resistance of the variable resistive pattern is changed by oxidation or reduction thereof.

In some embodiments, the resistive RAM device may further include a buried insulation pattern filling an inner space of the active pillar. In such a case, the variable resistive pattern may be disposed between the active pillar and the buried insulation pattern.

In some embodiments, the active pillar may have a thickness of about 50 nanometers or less.

In some embodiments, the resistive RAM device may further include a gate insulation layer between the active pillar and the gate. In such a case, the variable resistive pattern may be disposed between the gate insulation layer and the active pillar.

In some embodiments, the variable resistive pattern may have a thickness of about 20 nanometers or less.

In some embodiments, an electrical resistance of the variable resistive pattern adjacent to the gate may vary according to a voltage difference between first and second field effect source/drain regions generated in the active pillar located at both sides of the gate as well as a direction of electric field applied to the variable resistive pattern adjacent to the gate.

In some embodiments, the variable resistive pattern may include a transition metal oxide layer.

In some embodiments, the variable resistive pattern may include an oxide material of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chrome (Cr), strontium (Sr), lanthanum (La), manganese (Mn), calcium (Ca), praseodymium (Pr) and silicon (Si).

In some embodiments, the resistive RAM device may further include an active pad between the substrate and the active pillar.

In some embodiments, the variable resistive pattern may include a switching layer having a variable resistive property and an oxygen exchange layer contacting the switching layer to exchange oxygen atoms with the switching layer.

In some embodiments, at least one of the switching layer and the oxygen exchange layer may include a transition metal oxide layer having a non-stoichiometric composition.

In some embodiments, the variable resistive pattern may further include a tunnel barrier layer contacting the active pillar.

In some embodiments, the tunnel barrier layer may include a transition metal oxide layer having a stoichiometric composition.

In some embodiments, the switching layer and the oxygen exchange layer may include the same transition metal oxide layer, and the tunnel barrier layer may include a transition metal oxide layer which is different from the switching layer and the oxygen exchange layer.

In some embodiments, the tunnel barrier layer may be thinner than at least one of the switching layer and the oxygen exchange layer.

According to further embodiments, a resistive RAM device includes a substrate, an active pillar protruding from the substrate and having a hollow structure, a lower selection gate adjacent to a lower sidewall of the active pillar, an upper selection gate adjacent to an upper sidewall of the active pillar, a plurality of cell gates disposed between the lower selection gate and the upper selection gate to be adjacent to a middle sidewall of the active pillar, and a variable resistive pattern contacting the active pillar to be adjacent to the plurality of cell gates. An electrical resistance of the variable resistive pattern is changed by oxidation or reduction thereof.

In some embodiments, the variable resistive pattern may extend to be adjacent to at least one of the lower selection gate and the upper selection gate.

In some embodiments, a first distance between the plurality of cell gates may be less than at least one of a second distance between the upper selection gate and the uppermost cell gate and a third distance between the lower selection gate and the lowermost cell gate.

In some embodiments, at least one of the lower selection gate and the upper selection gate may include a plurality of sub selection gates.

In some embodiments, the resistive RAM device may further include an active pad disposed between the substrate and the active pillar. The lower selection gate may be adjacent to a sidewall of the active pad.

In some embodiments, the resistive RAM device may further include a buried insulation pattern filling an inner space of the active pillar. In such a case, the variable resistive pattern may be disposed between the active pillar and the buried insulation pattern.

In some embodiments, the active pillar may have a thickness of about 50 nanometers or less.

In some embodiments, the resistive RAM device may further include a gate insulation layer between the active pillar and the cell gates. In such a case, the variable resistive pattern may be disposed between the gate insulation layer and the active pillar.

In some embodiments, the variable resistive pattern may have a thickness of about 20 nanometers or less.

In some embodiments, an electrical resistance of the variable resistive pattern adjacent to one selected from the plurality of cell gates may vary according to a voltage difference between first and second field effect source/drain regions generated in the active pillar located at both sides of the selected cell gate as well as a direction of electric field applied to the variable resistive pattern adjacent to the selected gate.

In some embodiments, the resistive RAM device may further include a common source line disposed in the substrate and at least one dummy bit line electrically connected to the common source line.

In some embodiments, the resistive RAM device may further include at least one of a lower buried insulation pattern disposed in a first space between a base portion of the active pillar and a bottom surface of the variable resistive pattern and an upper buried insulation pattern disposed in a second space on a top surface of the variable resistive pattern. The first and second spaces may be located in an inner space of the active pillar.

According to further embodiments, in a method of operating a resistive RAM device, the resistive RAM device includes a substrate, an active pillar protruding from the substrate, and a cell string including the active pillar. The cell string includes a lower selection element adjacent to a lower sidewall of the active pillar, an upper selection element adjacent to an upper sidewall of the active pillar, and a plurality of memory cells disposed between the lower selection element and the upper selection element to be adjacent to the active pillar. Each of the memory cells includes a cell transistor and a variable resistive layer, and the variable resistive layer contacts the active pillar. The method includes selectively programming one of the plurality of memory cells and erasing the programmed memory cell. Selectively programming or erasing one of the plurality of memory cells is performed by reducing or oxidizing the variable resistive layer to change an electrical resistance of the variable resistive layer.

In some embodiments, selectively programming or erasing one of the plurality of memory cells constituting the cell string may be performed by generating a voltage difference between source and drain regions of the cell transistor of the selected memory cell and by changing a direction of electric field applied to the variable resistive pattern adjacent to the selected memory cell.

In some embodiments, the cell transistor of the selected memory cell may be turned off during the program operation and the erasure operation.

In some embodiments, the program operation may form a current path in the variable resistive layer between a source region and a drain region of the cell transistor of the selected memory cell.

In some embodiments, the erasure operation may remove a current path formed in the variable resistive layer between a source region and a drain region of the cell transistor of the selected memory cell.

In some embodiments, the cell string may be a first cell string, and the resistive RAM device may further include a plurality of additional cell strings, a plurality of bit lines electrically connected to upper portions of the active pillars of the cell strings, a common source line electrically connected to lower portions of the active pillars of the cell strings, and a pair of dummy bit lines electrically connected to the common source line. Each of the additional cell strings may have the same configuration as the first cell string. The plurality of bit lines may be disposed between the pair of dummy bit lines. The number of the bit lines to which a program voltage or an erasure voltage is concurrently applied may be less than the total number of the bit lines disposed between the pair of dummy bit lines.

In some embodiments, selectively programming one of the plurality of memory cells may include forcing a current into the variable resistive layer of the selected memory cell in a first current direction to reduce an electrical resistance of the variable resistive layer, and erasing the programmed memory cell may include forcing a current into the variable resistive layer of the programmed memory cell in a second current direction opposite to the first current direction to increase an electrical resistance of the variable resistive layer.

According to further embodiments, a method of fabricating a resistive RAM device includes alternately stacking interlayer insulation layers and sacrificial layers on a substrate, patterning the interlayer insulation layers and the sacrificial layers to form an active hole exposing the substrate, forming an active pillar having a hollow structure and a variable resistive pattern contacting the active pillar in the active hole, and replacing the sacrificial layers with conductive patterns. An electrical resistance of the variable resistive pattern is changed by oxidation or reduction of the variable resistive pattern.

In some embodiments, forming the active pillar and the variable resistive pattern may include conformally forming an active layer in active hole to partially fill the active hole and forming a variable resistive layer that covers at least an inner sidewall of the active layer in the active hole.

In some embodiments, forming the active pillar and the variable resistive pattern may include forming a variable resistive layer that covers a sidewall of the active hole and forming an active layer on an inner sidewall of the variable resistive layer in the active hole and on the substrate exposed by the active hole.

In some embodiments, the method may further include forming an active pad filling a lower portion of the active hole prior to formation of the active pillar.

BRIEF DESCRIPTION OF THE DRAWINGS

The inventive concepts will become more apparent in view of the attached drawings and accompanying detailed descriptions.

DETAILED DESCRIPTION OF EMBODIMENTS

Figure 1:
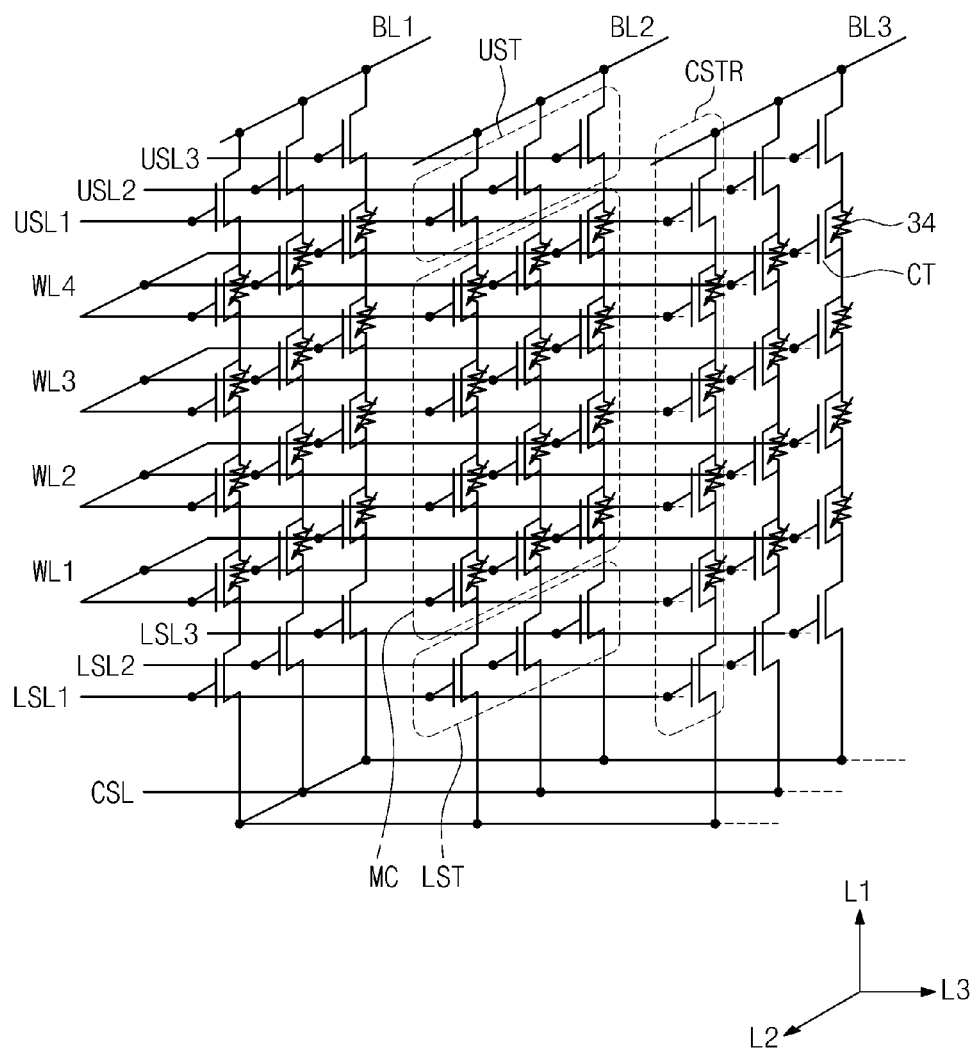
FIG. 1 is a schematic circuit diagram illustrating a resistive RAM device according to some embodiments of the present inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

The terminology used herein is for the purpose of describing particular embodiments only and is not intended to limit the inventive concepts. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, it will be further understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

Additionally, the embodiment in the detailed description will be described with sectional views and/or plan views as ideal exemplary views of the inventive concepts. In the drawing figures, the dimensions of layers and regions may be exaggerated for clarity of illustration. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. For example, an etched region illustrated as a rectangle may have rounded or curved features. Thus, the regions illustrated in the figures are schematic in nature and their shapes are not intended to illustrate the actual shape of a region of a device and are not intended to limit the scope of example embodiments.

Example embodiments will now be described more fully hereinafter with reference to the accompanying drawings. Nonvolatile memory devices according to example embodiments may include three-dimensional resistive RAM devices.

First Embodiment

Figure 2:
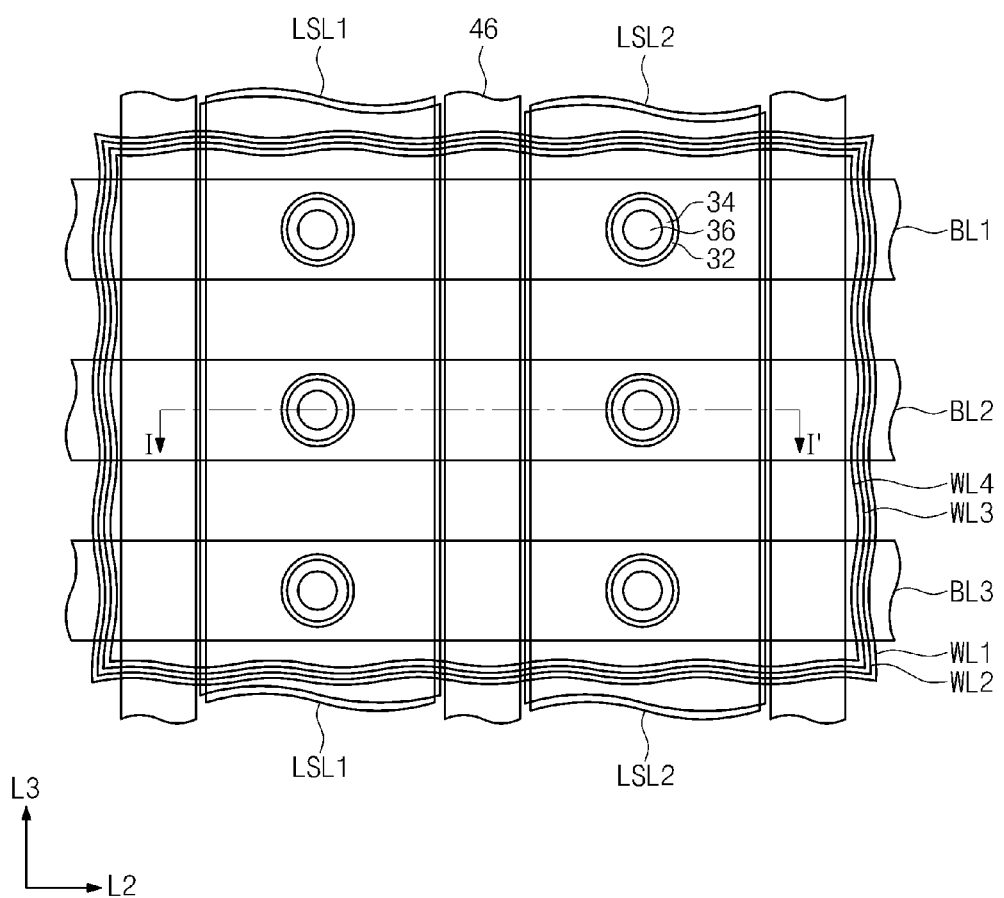
FIG. 2 is a plan view illustrating a resistive RAM device according to a first embodiment of the present inventive concepts.

FIG. 1 is a schematic circuit diagram illustrating a resistive RAM device according to some embodiments of the present inventive concepts, and FIG. 2 is a plan view illustrating a resistive RAM device according to a first embodiment. Further, FIG. 3 is a cross-sectional view taken along a line I-I' of FIG. 2.

Figure 3:
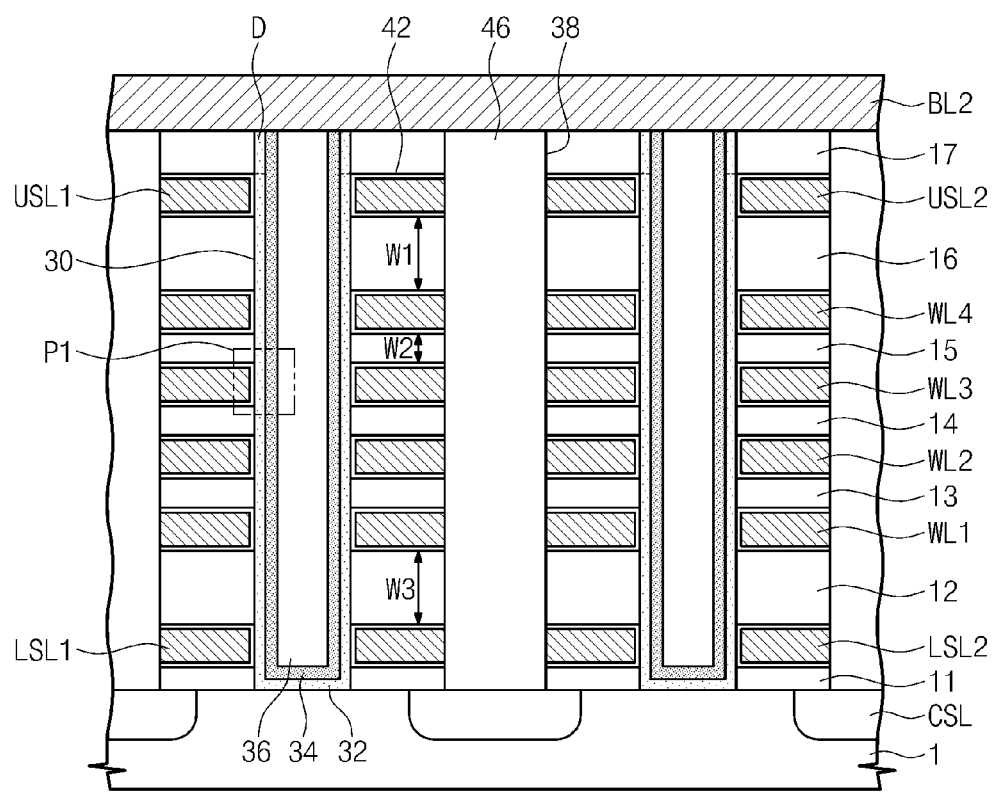
FIG. 3 is a cross-sectional view taken along a line I-I' of FIG. 2.

Referring to FIGS. 1, 2 and 3, a resistive RAM device according to an example embodiment may include common source lines CSL, bit lines BL1, BL2 and BL3, and cell strings CSTR disposed between the common source lines CSL and the bit lines BL1, BL2 and BL3.

In some embodiments, the common source lines CSL may be disposed in or on a substrate 1. In various embodiments, the substrate 1 may comprise a semiconductor substrate or an epitaxial layer disposed on a semiconductor substrate. The common source lines CSL may comprise impurity regions disposed in the substrate 1. The common source lines CSL may have a different conductivity type from the substrate 1. In some embodiments, when the substrate 1 is doped with P-type impurities, the common source lines CSL may be doped with N-type impurities.

Active pillars 32 may protrude from the substrate 1 in a first direction L1. For example, the active pillars can extend in a vertical direction relative to the horizontal direction of extension of the substrate 1. In some embodiments, such as that depicted in connection with the present embodiments, the active pillars 32 may have a hollow structure, for example, a cup shape, having sidewalls and a base. In some embodiments, the active pillars 32 may contact the substrate 1. Each of the active pillars 32 may include a P-type polysilicon material or an undoped polysilicon material. In a configuration where the active pillars 32 have a hollow structure, sidewalls of the active pillars 32 may be formed to be very thin. For example, the sidewalls can be formed to have a thickness of about 50 nanometers or less. In such an arrangement where the active pillars 32 have thin sidewalls as described above, electric fields may be effectively and/or efficiently applied to variable resistive layers 34 adjacent to the sidewalls of the active pillars 32 during operation of the resistive RAM device.

Drain regions D may be disposed in respective ones of upper portions of the active pillars 32. In some embodiments, the drain regions D may have the same conductivity type as the common source lines CSL.

In some embodiments, the bit lines BL1, BL2 and BL3 may be disposed on the active pillars 32 and may be electrically connected to the drain regions D. The bit lines BL1, BL2 and BL3 may extend in a horizontal direction of extension, namely in the horizontal second direction L2, to be positioned in parallel with each other, and may be spaced apart from each other.

A first group of the cell strings CSTR may be electrically connected in parallel to the bit line BL1, and a second group of the cell strings CSTR may be electrically connected in parallel to the bit line BL2. Further, a third group of the cell strings CSTR may be electrically connected in parallel to the bit line BL3. The cell strings CSTR may be electrically connected in parallel to at least one of the common source lines CSL having substantially the same electric potential.

Each of the cell strings CSTR may be configured to include one of the active pillars 32. In some embodiments, each of the cell strings CSTR may include a lower selection transistor LST, a gate of which can be connected to one of the common source lines CSL, an upper selection transistor UST, connected to one of the bit lines BL1, BL2 and BL3, and a plurality of memory cells MC disposed between the upper and lower selection transistors UST and LST. In each of the cell strings CSTR, the lower selection transistor LST, the plurality of memory cells MC and the upper selection transistor UST may be electrically connected in series along a current path. In each cell string CSTR, the active pillar 32 may provide channel regions of the lower selection transistor LST, the plurality of memory cells MC and the upper selection transistor UST.

Gate electrodes of the upper selection transistors UST may extend to provide upper selection lines USL1, USL2 and USL3. The upper selection transistors UST may be located at substantially the same distance from the substrate 1. The upper selection lines USL1, USL2 and USL3 may extend in a horizontal direction of extension, namely the third direction L3 so as to be in parallel with each other. In some embodiments, the first, second and third directions L1, L2 and L3 may be orthogonal to each other.

Gate electrodes of the lower selection transistors LST may extend to provide lower selection lines LSL1, LSL2 and LSL3. The lower selection transistors LST may be located at substantially the same vertical distance from the substrate 1. The lower selection lines LSL1, LSL2 and LSL3 may extend in the third direction L3 to be parallel with each other.

Each of the memory cells MC may include a cell transistor CT and a variable resistive layer 34. Gates of the cell transistors CT constituting the memory cells MC may extend to provide word lines WL1, WL2, WL3 and WL4. Each of the cell transistors CT may include an electric field effect source region and an electric field effect drain region formed in two portions of the active pillar 32, which are located at both sides of the corresponding one of the word lines WL1, WL2, WL3 and WL4. The gates of the cell transistors CT of different cell strings CSTR positioned at a same vertical height relative to the substrate 1, or in other words, at a same layer of the device, may be electrically connected to each other to constitute one of the word lines WL1, WL2, WL3 and WL4. Gates comprising the same word line, and therefore connected, have the same potential level when a voltage is applied. In some embodiments, the word lines WL1, WL2, WL3 and WL4 can be generally linear in shape and may extend in the third direction L3. In some embodiments, the word lines WL1, WL2, WL3 and WL4 can be generally planar in shape and may extend in both the second direction L2 and the third direction L3.

In some embodiments, some of all of the lower selection transistors LST, the upper selection transistors UST and the cell transistors CT may be configured as a metal-oxide-semiconductor field effect transistor (MOSFET) that employs the active pillar 32 as a channel region.

In some embodiments, the variable resistive layers 34 may be in direct contact with respective ones of inner surfaces of the active pillars 32. Inner spaces or regions that are surrounded by the variable resistive layers 34 may include buried insulation patterns 36. IN some embodiments, the buried insulation patterns 36 may include silicon oxide type materials. The variable resistive layers 34 may be disposed between the buried insulation patterns 36 and the active pillars 32. However, in other embodiments as will be described herein, other positionings for the variable resistive layers 34 are possible. In the present embodiment, each of the variable resistive layers 34 may have a cup shape that covers an inner bottom surface and an inner sidewall of one of the active pillars 32. However, in other embodiments as will be described herein, other shapes for the variable resistive layers 34 are possible.

Figure 4A:
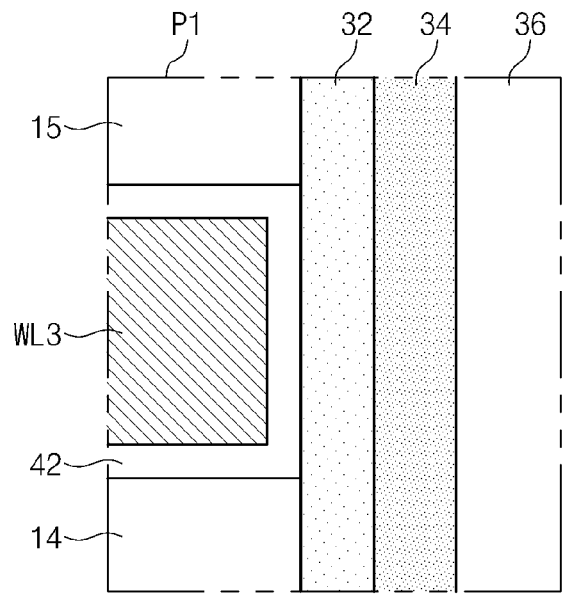
FIGS. 4A, 4B and 4C are enlarged views illustrating a portion 'P1' of FIG. 3.
Figure 4B:
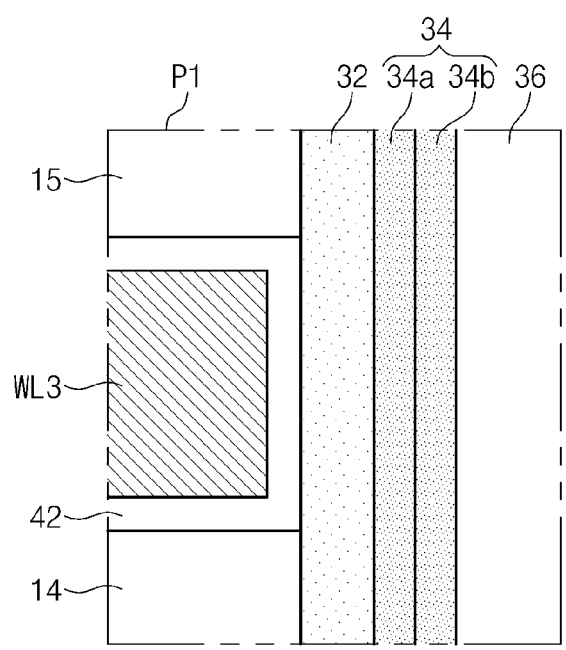
Figure 4C:
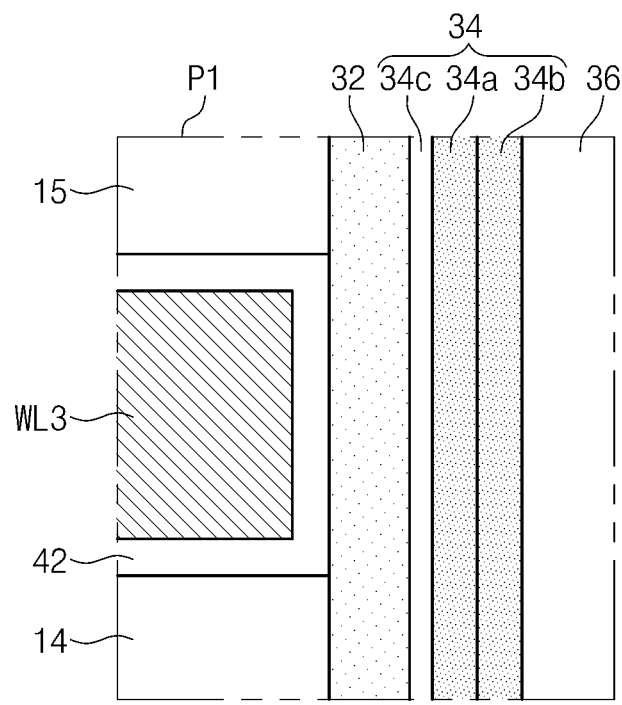

FIGS. 4A, 4B and 4C are enlarged views illustrating a portion 'P1' of FIG. 3.

Referring to FIG. 4A, in some embodiments the variable resistive layer 34 may comprise a single switching layer. A resistivity of the variable resistive layer 34 may vary according to a direction and an intensity of an electric field applied to the variable resistive layer 34 and/or a voltage difference applied between both ends of the variable resistive layer 34. For example, the electrical resistance of the variable resistive layer 34 may vary according to a voltage difference applied between the field effect source region and the field effect drain region of the cell transistor CT including the variable resistive layer 34.

In some embodiments, the variable resistive layer 34 may include a transition metal oxide layer. The variable resistive layer 34 may include an oxide material of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chrome (Cr), strontium (Sr), lanthanum (La), manganese (Mn), calcium (Ca), praseodymium (Pr) and silicon (Si). However, the variable resistive layer 34 may have a non-stoichiometric composition. For example, when the variable resistive layer 34 is a transition metal oxide material or a silicon oxide material, an oxygen content of the variable resistive layer 34 may be about 0.8 times to about 0.9 times the stoichiometric oxygen content thereof.

Referring to FIG. 4B, the variable resistive layer 34 may optionally further comprise a switching layer 34a having a variable resistive property and an oxygen exchange layer 34b that exchanges oxygen atoms with the switching layer 34a. In some embodiments, the switching layer 34a may be disposed between the active pillar 32 and the oxygen exchange layer 34b. The switching layer 34a may comprise the same material layer as the variable resistive layer 34 described with reference to FIG. 4A. That is, current paths taking the form of conductive filaments may be generated in or removed from the switching layer 34a according to a voltage difference (or according to a direction and an intensity of an applied electric field) applied between the field effect source region and the field effect drain region of the cell transistor CT including the switching layer 34a. Thus, the electrical resistance of the switching layer 34a may be reduced when the conductive filaments are generated in the switching layer 34a, and the electrical resistance of the switching layer 34a may be increased when the conductive filaments are removed from the switching layer 34a. The oxygen exchange layer 34b may be disposed to be in contact with the switching layer 34a. When the cell transistor CT including the switching layer 34a is programmed (e.g., when the conductive filaments are generated or present in the switching layer 34a), oxygen atoms in the switching layer 34a may move or migrate into the oxygen exchange layer 34b to lower the electrical resistance of the switching layer 34a. In contrast, when the cell transistor CT including the switching layer 34a is erased (e.g., when the conductive filaments are removed from, or not present in, the switching layer 34a), oxygen atoms in the oxygen exchange layer 34b may move or migrate into the switching layer 34a to increase the electrical resistance of the switching layer 34a. In some embodiments, the oxygen exchange layer 34b may further include a transition metal oxide layer having an oxygen content that is lower than the stoichiometric oxygen content thereof. However, in other embodiments, the oxygen content of the oxygen exchange layer 34b may be greater than that of the switching layer 34a.

Referring to FIG. 4C, the variable resistive layer 34 may optionally comprise a triple-layered material including the switching layer 34a illustrated in FIG. 4B, the oxygen exchange layer 34b illustrated in FIG. 4B, and further, a tunnel barrier layer 34c contacting the active pillar 32. In some embodiments, the tunnel barrier layer 34c may be disposed between the active pillar 32 and the switching layer 34a, and the switching layer 34a may be disposed between the tunnel barrier layer 34c and the oxygen exchange layer 34b. The switching layer 34a may comprise the same material layer as described with reference to FIG. 4B, and the oxygen exchange layer 34b may comprise the same material layer as described with reference to FIG. 4B. The tunnel barrier layer 34c may comprise an oxide material layer including a transition metal which is different from the transition metal contained in the switching layer 34a. In some embodiments, the tunnel barrier layer 34c may be more compositionally stable than the switching layer 34a and the oxygen exchange layer 34b. That is, a composition of the transition metal and the oxygen contained in the tunnel barrier layer 34c may have a stoichiometric composition thereof. The tunnel barrier layer 34c may operate to prevent the oxygen atoms in the switching layer 34a and the oxygen exchange layer 34b from diffusing and/or migrating into the active pillar 32 adjacent thereto. Further, the tunnel barrier layer 34c may suppress physical reactions between the active pillar 32 and the switching layer 34a (or the oxygen exchange layer 34b). Accordingly, the tunnel barrier layer 34c may act as a tunneling barrier layer. In some embodiments, the tunnel barrier layer 34c may be thinner, in a horizontal direction, than at least one of the switching layer 34a and the oxygen exchange layer 34b.

In alternative embodiments to the embodiments illustrated in FIGS. 4B and 4C, the switching layer 34a and the oxygen exchange layer 34b may be replaced in position relative to each other. Further, in other embodiments, the variable resistive layer 34 may include a plurality of switching layers 34a, a plurality of oxygen exchange layers 34b and a plurality of tunnel barrier layers 34c which are alternately or randomly stacked. Thus, in some embodiments, any number of switching layers, 34a, oxygen exchange layers 34b and tunnel barrier layers 34c can be present.

Referring again to FIGS. 1, 2 and 3, interlayer insulation layers 11 to 17 may be disposed between the bit lines BL1, BL2 and BL3, the upper selection lines USL1, USL2, USL3, the word lines WL1, WL2, WL3 and WL4, the lower selection lines LSL1, LSL2 and LSL3, and the substrate 1. In some embodiments, the interlayer insulation layers 11 to 17 may include one of silicon oxide type materials, or other suitable insulative materials.

In an of the various embodiments described herein, a gate insulation layer 42 may be disposed between the active pillars 32 and the conductive lines USL1-USL3, WL1-WL4 and LSL1-LSL3. In some embodiments, the gate insulation layer 42 may comprise a silicon oxide layer, and the silicon oxide layer used as the gate insulation layer 42 may have a stoichiometric composition ratio. That is, a composition of silicon to oxygen of the silicon oxide layer used as the gate insulation layer 42 may be 1:2. The gate insulation layer 42 may extend into horizontally oriented interfaces between the lines USL1-USL3, WL1-WL4 and LSL1-LSL3 and the interlayer insulation layers 11 to 17, as shown in the drawings.

Each of the lines USL1-USL3, WL1-WL4 and LSL1-LSL3 may include a doped polysilicon layer and/or a metal-containing layer. The metal-containing layer may include a single metal layer, a metal nitride layer and/or a metal silicide layer.

The upper selection lines USL1, USL2 and USL3 may be separated from each other by isolating insulation patterns 46 that extend in the third direction L3, or the vertical direction, as illustrated in FIGS. 2 and 3. The isolating insulation patterns 46 may also extend in a vertical direction from the substrate 1. Thus, the word lines WL1 located at the same level may be separated from each other by the isolating insulation patterns 46, and the word lines WL2 located at the same level may be separated from each other by the isolating insulation patterns 46. Similarly, the word lines WL3 located at the same level may be separated from each other by the isolating insulation patterns 46, and the word lines WL4 located at the same level may be separated from each other by the isolating insulation patterns 46. In addition, the lower selection lines LSL1, LSL2 and LSL3 may be separated from each other by the isolating insulation patterns 46. Each of the isolating insulation patterns 46 may comprise, for example, a silicon oxide layer, a silicon nitride layer and/or silicon oxynitride layer, or other suitable insulative material layer. In some embodiments, the isolating insulation patterns 46 may extend to contact the substrate 1. A vertical distance W2 between the word lines WL1, WL2, WL3 and WL4 may be less than at least one of a vertical distance W1 between the upper selection lines USL1, USL2 and USL3 and the uppermost word lines WL4 and a vertical distance W3 between the lower selection lines LSL1, LSL2 and LSL3 and the lowermost word lines WL1.

A program operation, an erasure operation and a read operation of a resistive RAM device according to some embodiments will now be described.

Figure 5A:
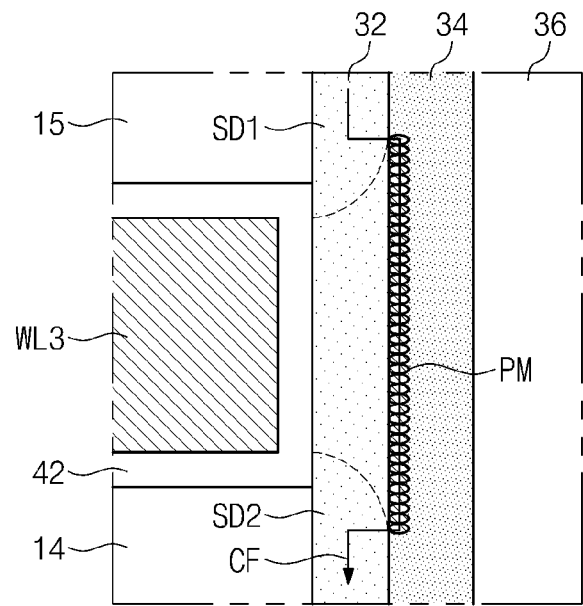
FIG. 5A is an enlarged view illustrating a portion 'P1' of FIG. 3 when a resistive RAM device according to a first embodiment is programmed, in accordance with the present inventive concepts.
Figure 5B:
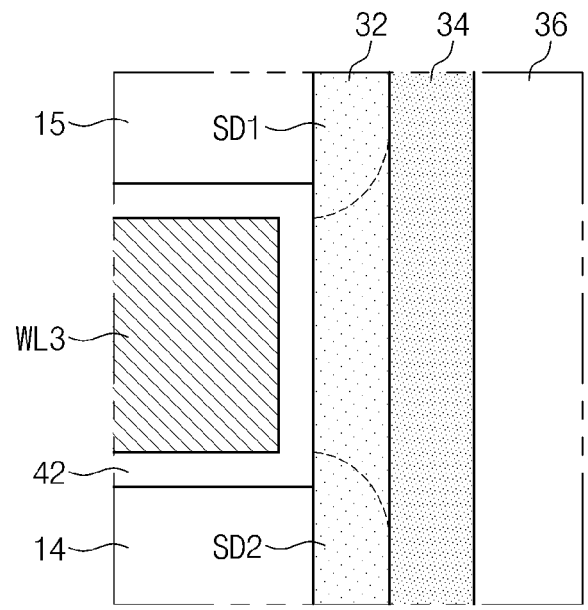
FIG. 5B is an enlarged view illustrating a portion 'P1' of FIG. 3 when a resistive RAM device according to a first embodiment is erased, in accordance with the present inventive concepts.
Figure 6:
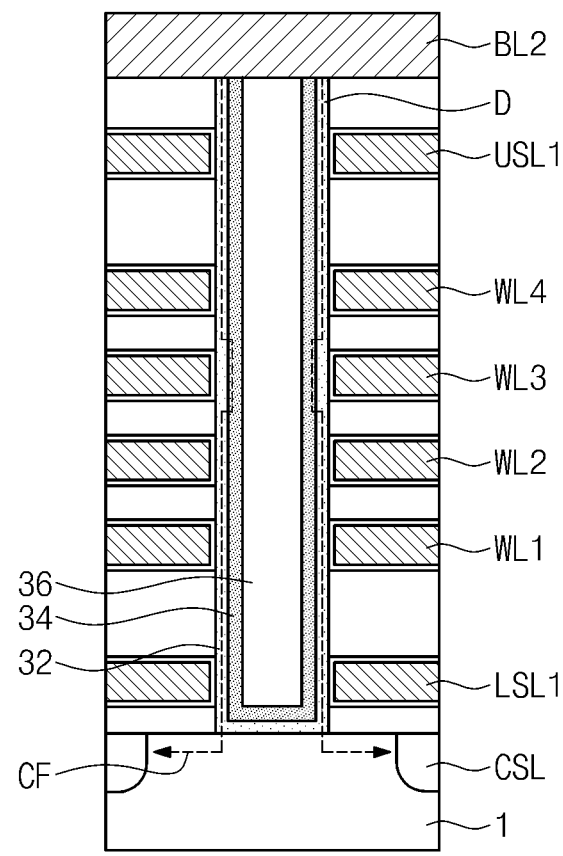
FIG. 6 illustrates a current flow in a resistive RAM device according to some embodiments of the present inventive concepts.

FIG. 5A is an enlarged view illustrating a portion 'P1' of FIG. 3 when a resistive RAM device according to a first embodiment is programmed, and FIG. 5B is an enlarged view illustrating a portion 'P1' of FIG. 3 when a resistive RAM device according to a first embodiment is erased. Further, FIG. 6 illustrates a current flow in a resistive RAM device according to some embodiments.

First, the program operation is described.

Referring to FIGS. 1, 3 and 5A, in a case where a memory cell P1 of the memory cells MC is selected to be programmed, a ground voltage or a sub-threshold voltage of the cell transistors CT may be applied to the third word line WL3 connected to the gate electrode of the selected memory cell P1 to turn off the cell transistor CT of the selected memory cell P1. Further, a high voltage having a value greater than a threshold voltage of the cell transistors CT may be applied to non selected word lines, for example, the first, second and fourth word lines WL1, WL2 and WL4 in the cell string CSTR (or a string block) including the selected memory cell P1. In addition, a high voltage having a value greater than a threshold voltage of the selection transistors UST and LST may be applied to the first upper selection line USL1 and the first lower selection line LSL1 in the string block (or the cell string CSTR) including the selected memory cell P1. Moreover, a high voltage greater than a set voltage (or a forming voltage) for generating conductive filaments in the variable resistive layer 34 of the selected memory cell P1 may be applied to the second bit line BL2 connected to the cell string CSTR including the selected memory cell P1. Furthermore, the common source lines CSL may be grounded. A ground voltage may be applied to all of word lines, upper selection lines, lower selection lines and bit lines which belong in non-selected string blocks (not shown).

Under the bias conditions described above, the upper selection transistor UST, the lower selection transistor LST and the cell transistors CT of the non selected memory cells MC in the cell string CSTR (or the string block) including the selected memory cell P1 may be turned on while the cell transistor CT of the selected memory cell P1 is turned off. Further, field effect source/drain regions SD1 and SD2 may be formed in portions of the active pillar 32 between the lines USL1, WL1, WL2, WL3, WL4 and LSL1 due to the operation of a fringe field effect Accordingly, the high voltage over the set voltage (or the forming voltage) applied to the second bit line BL2 may be conducted to the first field effect source/drain region SD1 formed in a portion of the active pillar 32 between the third word line WL3 connected to the selected memory cell P1 and the fourth word line WL4 adjacent to the selected memory cell P1, and the ground voltage applied to the common source lines CSL may be conducted to the second field effect source/drain region SD2 formed in a portion of the active pillar 32 between the third word line WL3 connected to the selected memory cell P1 and the second word line WL2 adjacent to the selected memory cell P1 (see FIG. 5A). As a result, a voltage greater than the set voltage (or the forming voltage) may be applied between the first and second field effect source/drain regions SD1 and SD2 of the selected memory cell P1, and a current may flow in a first current direction (e.g., a direction from the second bit line BL2 toward the common source lines CSL). Thus, the transition metal atoms contained in the variable resistive layer 34 may migrate into an interface between the active pillar 32 and the variable resistive layer 34 or the oxygen atoms contained in the variable resistive layer 34 may be diffused out to reduce the transition metal oxide material of the variable resistive layer 34. Therefore, electrical paths such as conductive filaments PM may be formed in the variable resistive layer 34 between the first and second field effect source/drain regions SD1 and SD2. The conductive filaments PM may be formed in the variable resistive layer at a side region adjacent to the active pillar 32, as illustrated in FIG. 5A. Thus, the selected memory cell MC including the conductive filament PM may be regarded as a programmed cell having a logic data "1" or an "on" state. The conductive filaments PM may have various shapes, and FIG. 5A illustrates merely one of the various shapes of the conductive filaments PM for the purpose of ease and convenience in explanation.

Next, the erasure operation is described.

Referring to FIGS. 1, 3 and 5B, in a case where the programmed memory cell P1 of the memory cells MC is selected to be erased, a ground voltage or a sub-threshold voltage of the cell transistors CT may be applied to the third word line WL3 connected to the gate electrode of the selected memory cell P1 to turn off the cell transistor CT of the selected memory cell P1. Further, a high voltage having a value greater than a threshold voltage of the cell transistors CT may be applied to non selected word lines, for example, the first, second and fourth word lines WL1, WL2 and WL4 in the cell string CSTR (or a string block) including the selected memory cell P1. In addition, a high voltage greater than a threshold voltage of the selection transistors UST and LST may be applied to the first upper selection line USL1 and the first lower selection line LSL1 in the string block (or the cell string CSTR) including the selected memory cell P1. Moreover, a ground voltage may be applied to the second bit line BL2 connected to the cell string CSTR including the selected memory cell P1, and the other bit lines may be floated or a reset voltage (or the forming voltage) may be applied to the other bit lines. Furthermore, a high voltage greater than the reset voltage (or the forming voltage) of the variable resistive layer 34 of the selected memory cell P1 may be applied to the common source lines CSL. A ground voltage may be applied to all of word lines, upper selection lines, lower selection lines and bit lines which belong in the non-selected string blocks (not shown).

Under the bias conditions described above, the upper selection transistor UST, the lower selection transistor LST and the cell transistors CT of the non selected memory cells MC in the cell string CSTR (or the string block) including the selected memory cell P1 may be turned on while the cell transistor CT of the selected memory cell P1 is turned off. Further, field effect source/drain regions SD1 and SD2 may be formed in portions of the active pillar 32 between the lines USL1, WL1, WL2, WL3, WL4 and LSL1 due to the presence of a fringe field effect. Accordingly, the ground voltage applied to the second bit line BL2 may be conducted to the first field effect source/drain region SD1 formed in a portion of the active pillar 32 between the third word line WL3 connected to the selected memory cell P1 and the fourth word line WL4 adjacent to the selected memory cell P1, and the high voltage over the set voltage (or the forming voltage) applied to the common source lines CSL may be conducted to the second field effect source/drain region SD2 formed in a portion of the active pillar 32 between the third word line WL3 connected to the selected memory cell P1 and the second word line WL2 adjacent to the selected memory cell P1 (see FIG. 5B). As a result, a voltage greater than the set voltage (or the forming voltage) may be applied between the first and second field effect source/drain regions SD1 and SD2 of the selected memory cell P1, and a current may flow in a second current direction opposite to the first current direction (e.g., a direction from the common source lines CSL toward the second bit line BL2). Thus, the transition metal atoms contained in the conductive filaments PM may migrate into other places in the variable resistive layer 34 or the oxygen atoms contained in the variable resistive layer 34 may migrate in a direction toward the conductive filaments PM to oxidize the conductive filaments PM. Therefore, the conductive filaments PM may be removed, as illustrated in FIG. 5B. The selected memory cell MC from which the conductive filaments PM are removed may be regarded as an erased cell having a logic data "0" or an "off" state.

The program operation and the erasure operation described above may be performed by a page of memory cells, where a page of memory cells is represented by memory cell transistors under control of a same control gate. In some embodiments, a page of memory cells is determined as those cells sharing a same word line of the device. In other embodiments, the program and erasure operations can be performed on less than a page of the memory cell transistors. For example, a page of the memory cells can comprise all memory cells sharing the same layer of a device, in cases where the word line is connected to all memory cells are connected to the same word line.

For programming and erasing operations, it is desired to perform such operations on only a portion of the cell strings. This is because during such operations, the selected strings will pull current, and an excessive amount of current will be passed through the common source line. This, in turn, could artificially raise the voltage at the common source line. By programming a subset of the strings at a time, the effects of this phenomenon are mitigated or eliminated.

The read operation (or a verification operation) will now be described.

Referring to FIGS. 1, 3 and 6, if the memory cell P1 of the memory cells MC is selected to read, a ground voltage or a sub-threshold voltage of the cell transistors CT may be applied to the third word line WL3 connected to the gate electrode of the selected memory cell P1 to turn off the cell transistor CT of the selected memory cell P1. Further, a high voltage at a value greater than a threshold voltage of the cell transistors CT may be applied to non selected word lines, for example, the first, second and fourth word lines WL1, WL2 and WL4 in the cell string CSTR (or a string block) including the selected memory cell P1. In addition, a high voltage greater than a threshold voltage of the selection transistors UST and LST may be applied to the first upper selection line USL1 and the first lower selection line LSL1 in the string block (or the cell string CSTR) including the selected memory cell P1. Moreover, a sensing voltage may be applied to the second bit line BL2 connected to the cell string CSTR including the selected memory cell P1, and the other bit lines may be floated or grounded. Furthermore, the common source lines CSL may be grounded. A ground voltage may be applied to all of word lines, upper selection lines, lower selection lines and bit lines which belong in the non-selected string blocks (not shown).

Under the bias conditions described above, no current flows through the cell transistor CT of the selected memory cell P1. However, in the event that the selected memory cell P1 is a programmed cell, a current may flow through the conductive filaments PM formed in the variable resistive layer 34 of the selected memory cell P1 as indicated by an arrow CF of FIGS. 5A and 6. The current flowing though the conductive filaments PM of the selected memory cell P1 may be sensed by a sense amplifier connected to the second bit line BL2. Thus, the selected memory cell P1 may be regarded as a programmed cell having a logic data "1". In contrast, when the selected memory cell P1 is an erased cell as described with reference to FIG. 5B, no current flows through the selected memory cell P1 because the selected memory cell P1 does not have any conductive filaments therein. In such a case, the selected memory cell P1 may be regarded as an erased cell having a logic data "0".

As described above, the cell transistor CT of the selected memory cell P1 is always turned off during all the program/erasure/read operations.

Figure 7:
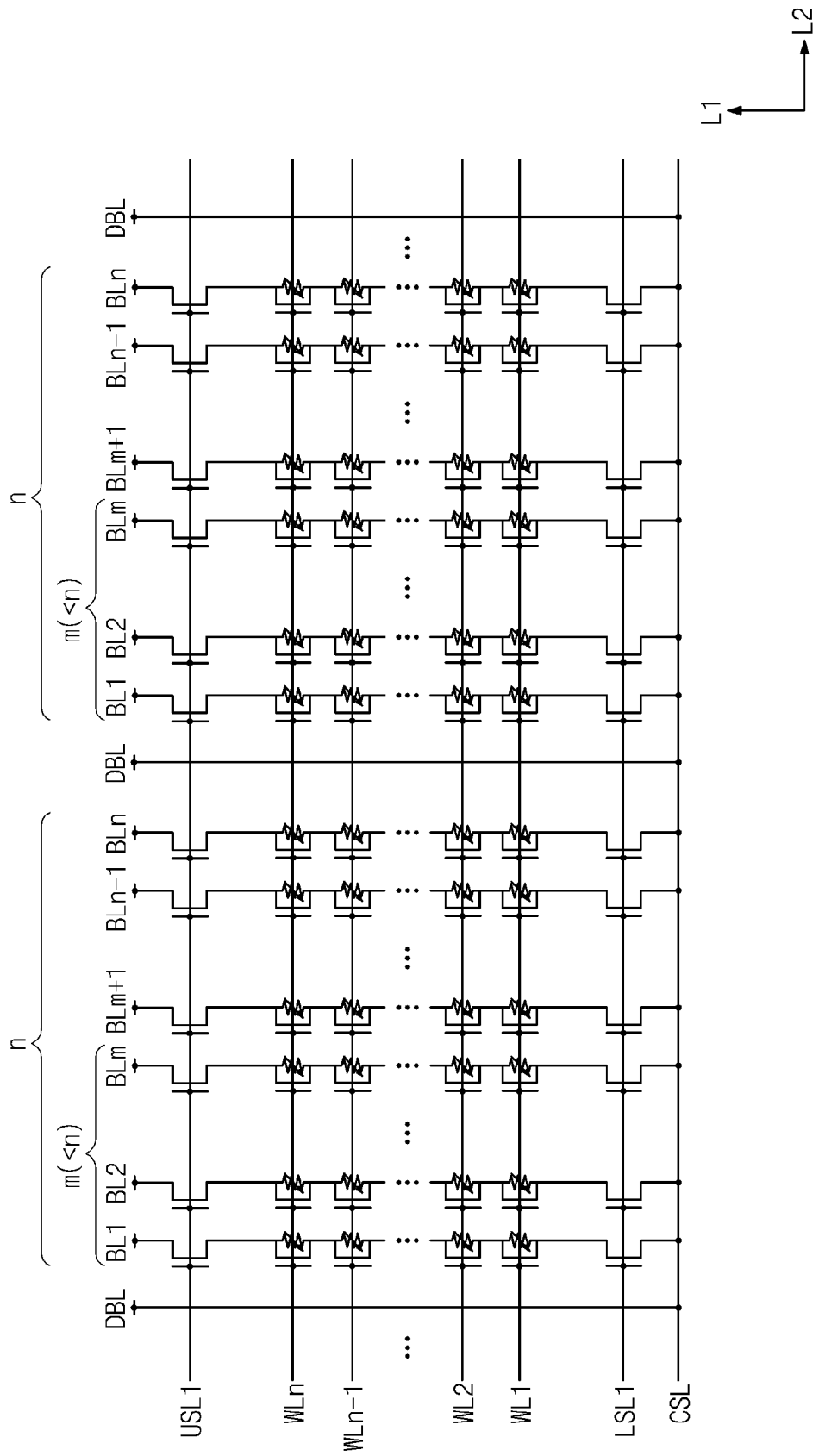
FIG. 7 is a schematic circuit diagram illustrating a resistive RAM device according to further embodiments of the present inventive concepts.

FIG. 7 is a schematic circuit diagram illustrating a resistive RAM device according to further embodiments.

Referring to FIG. 7, a resistive RAM device according to the present embodiment may include dummy bit lines DBL directly connected to a common source line CSL. N-number of bit lines BL1, BL2, . . . and BLn may be disposed in each of blocks between the dummy bit lines DBL. The dummy bit lines DBL may prevent or suppress a voltage level of the common source line CSL from fluctuating out of a specific range during program/erasure operations. When the program operation or the erasure operation is executed, a program voltage (e.g., the set voltage or the forming voltage) or an erasure voltage (e.g., a negative reset voltage or a negative forming voltage) may be concurrently applied to m-number of bit lines BL1, BL2, . . . BLm among the n-number of bit lines BL1, BL2, . . . and BLn disposed in each block. That is, the number of the bit lines to which the program voltage (or the erasure voltage) is concurrently applied during the program operation (or the erasure operation) may be less than the total number of the bit lines disposed in each block. If the number of the bit lines to which the program voltage (or the erasure voltage) is concurrently applied during the program operation (or the erasure operation) increases, an amount of current flowing through the common source line CSL may also increase during the program operation (or the erasure operation). In such a case, a voltage level of the common source line CSL may be severely fluctuated, which can, in turn, cause program errors (or erasure errors). However, according to the present embodiment, the number of the bit lines to which the program voltage (or the erasure voltage) is concurrently applied may be less than the total number of the bit lines disposed in each block, as described above. This may reduce the probability that the program errors or the erasure errors occur.

The resistive RAM device according to the embodiments may include the upper selection transistors UST connected to the uppermost cell transistors CT and the lower selection transistors LST connected to the lowermost cell transistors. If the selection transistors UST and LST are turned off, undesired cell leakage currents flowing through the cell transistors CT may be minimized.

The resistive RAM devices according to the embodiments employ the variable resistive layers 34 as data storage elements. This form of data storage element is different and advantageous over data storage elements based on charge trap layers, in the sense that nonvolatile memory devices employing the charge trap layers can require a high program voltage of about 20 Volts to inject charges into the charge trap layers. However, in order to program or erase the resistive RAM devices according to the embodiments, relatively low voltages may be applied to word lines and the selection lines to turn on the cell transistors and the selection transistors and a relatively low forming voltage of about 5 Volts may be applied to the bit lines or the common source line. That is, the resistive RAM devices according to the embodiments may be programmed or erased using exclusively relatively low voltages. Accordingly, the resistive RAM devices according to the embodiments described herein do not necessarily require high voltage circuits including high voltage transistors. Therefore, the cell array region of the resistive RAM devices according to the embodiments may be realized without the formation of high-voltage regions. Further, since the resistive RAM devices according to the embodiments are operated using relatively low voltages, spaces or distances between the word lines WL1, WL2, WL3 and WL4 can be reduced. Hence, the height of the three-dimensional resistive RAM devices according to the embodiments may also be reduced.

FIGS. 8 to 15 are cross sectional views illustrating a method of fabricating a resistive RAM device shown in FIG. 3, in accordance with embodiments of the inventive concepts.

Figure 8:
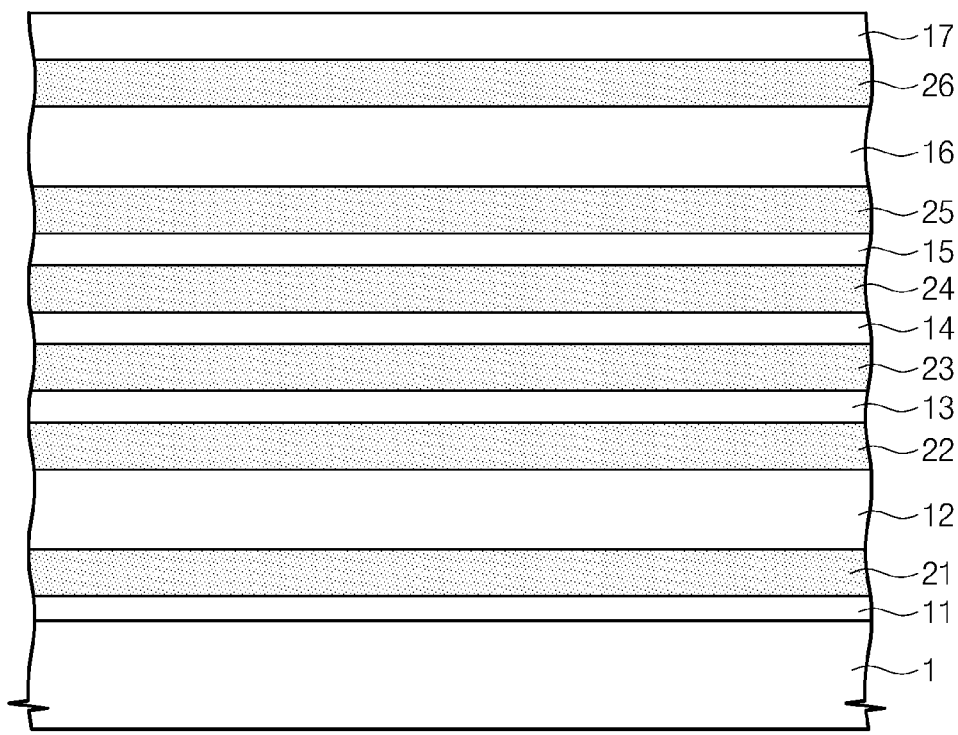
FIGS. 8 to 15 are cross sectional views illustrating a method of fabricating a resistive RAM device shown in FIG. 3, in accordance with the present inventive concepts.

Referring to FIG. 8, a plurality of interlayer insulation layers 11-17 and a plurality of sacrificial layers 21-26 may be alternately and repeatedly stacked on a substrate 1. In some embodiments, the interlayer insulation layers 11-17 may be formed of a silicon oxide type material, or other suitable insulative material. The sacrificial layers 21-26 may be formed of a material having an etch selectivity with respect to the interlayer insulation layers 11-17. For example, the sacrificial layers 21-26 may be formed of a silicon nitride layer, or other material suitable for a sacrificial layer.

Figure 9:
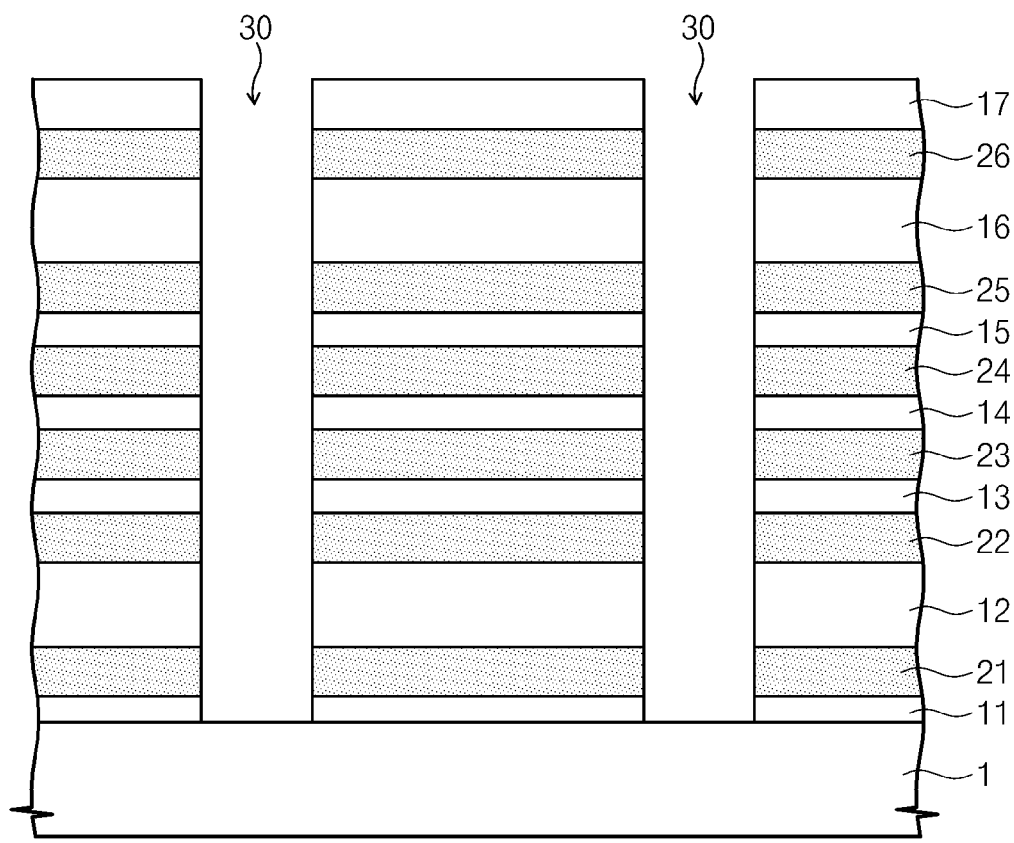

Referring to FIG. 9, the interlayer insulation layers 11-17 and the sacrificial layers 21-26 may be patterned to form active holes 30 exposing the substrate 1.

Figure 10:
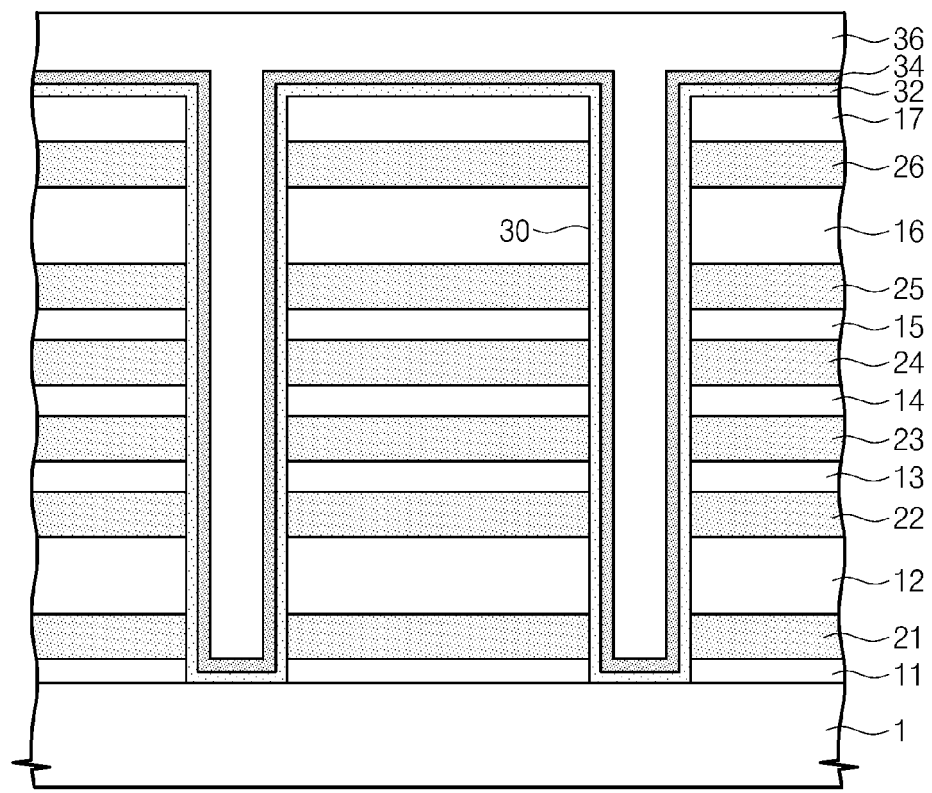

Referring to FIG. 10, an active layer 32 and a variable resistive layer 34 may be sequentially and conformally formed on the substrate including the active holes 30. In various embodiments, the active layer 32 may be formed of an undoped polysilicon layer or a doped polysilicon layer having the same conductivity type as the substrate 1. The variable resistive layer 34 may be formed of an oxide material of at least one element selected from the group consisting of zirconium (Zr), hafnium (Hf), aluminum (Al), nickel (Ni), copper (Cu), molybdenum (Mo), tantalum (Ta), titanium (Ti), tungsten (W) and silicon (Si). IN other embodiments, the variable resistive layer 34 may comprise another suitable variable resistive material. Each of the active holes 30 may be partially filled with the active layer 32 and the variable resistive layer 34. A buried insulation layer 36 may be formed on the variable resistive layer 34 to fill the active holes 30. The buried insulation layer 36 may be formed of a silicon oxide type material.

Figure 11:
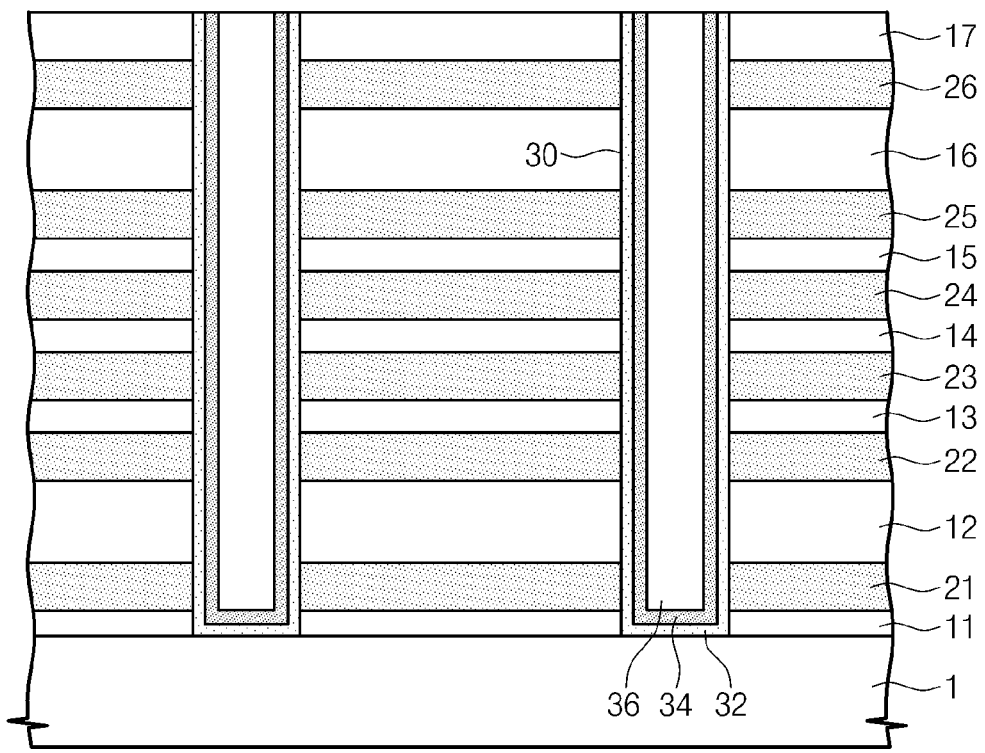

Referring to FIG. 11, the buried insulation layer 36, the variable resistive layer 34 and the active layer 32 may be planarized to expose a top surface of the seventh interlayer insulation layer 17. As a result, an active pillar 32, a variable resistive pattern 34 and a buried insulation pattern 36 may be formed in each of the active holes 30.

Figure 12:
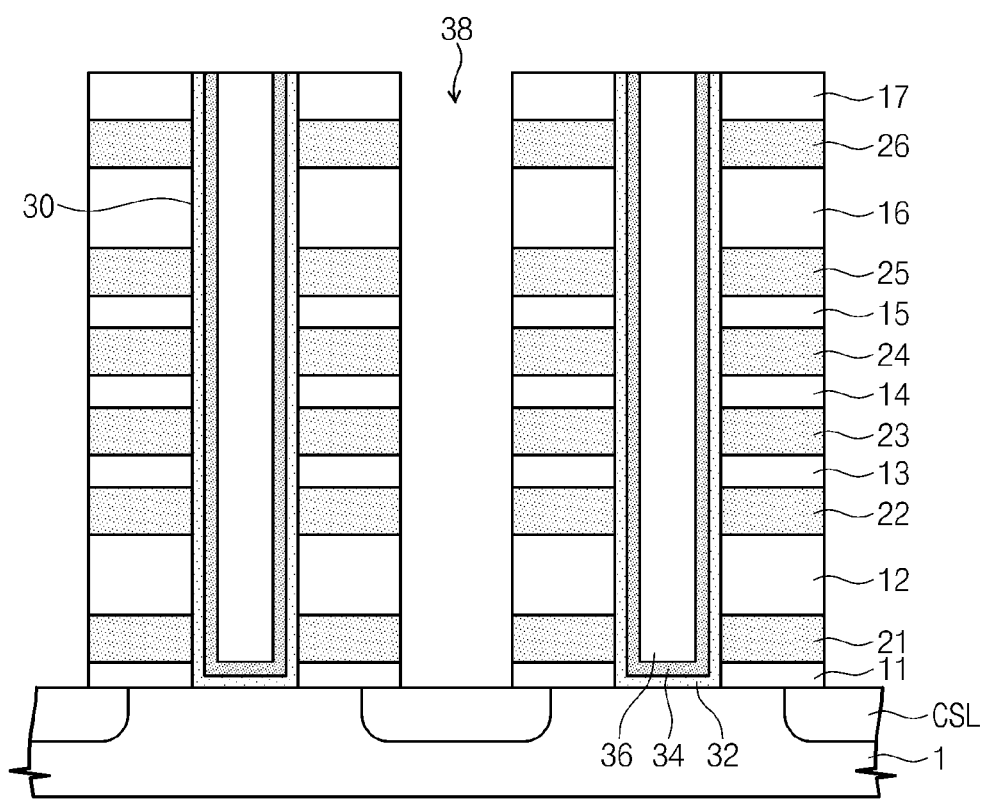

Referring to FIG. 12, the interlayer insulation layers 11-17 and the sacrificial layers 21-26 between the active holes 30 may be patterned to form grooves 38 exposing the substrate 1. The grooves 38 may be formed to extend in the third direction L3 illustrated in FIG. 2. Impurity ions may then be implanted into the substrate 1 exposed by the grooves 38, thereby forming common source lines CSL in the substrate 1.

Figure 13:
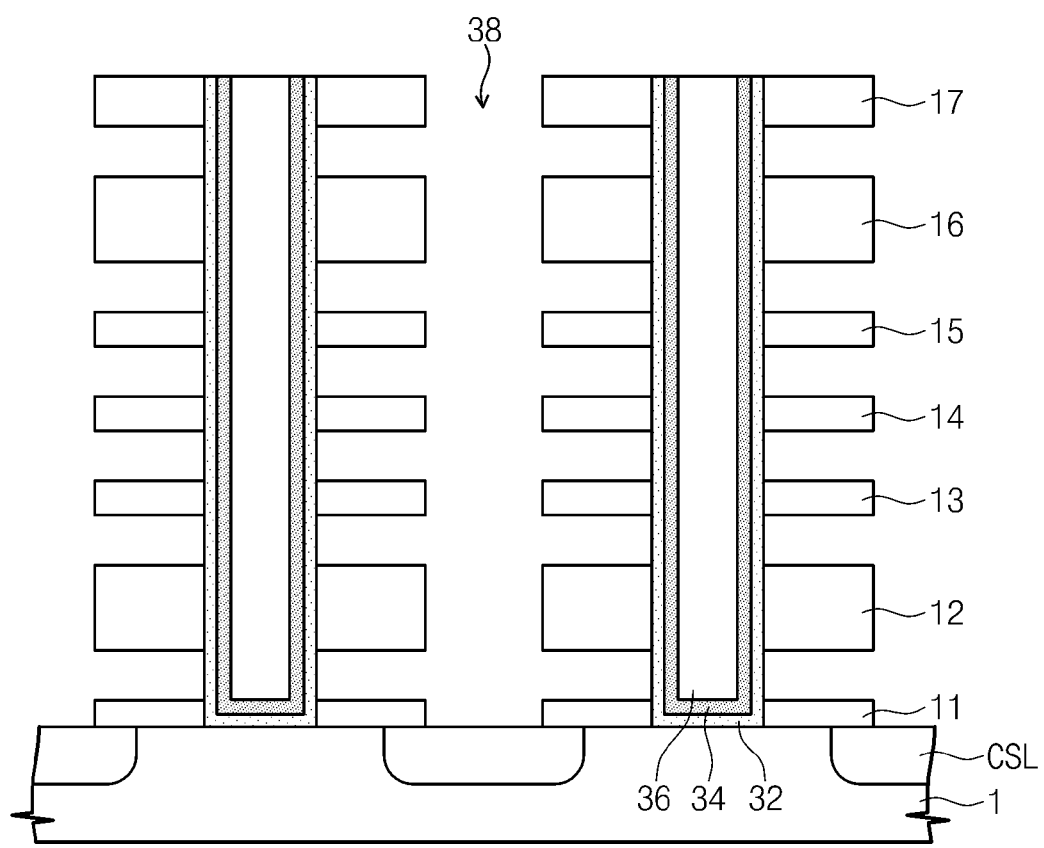

Referring to FIG. 13, the sacrificial layers 21-26 may be selectively removed to expose top and bottom surfaces of the interlayer insulation layers 11-17 and sidewalls of the active pillars 32.

Figure 14:
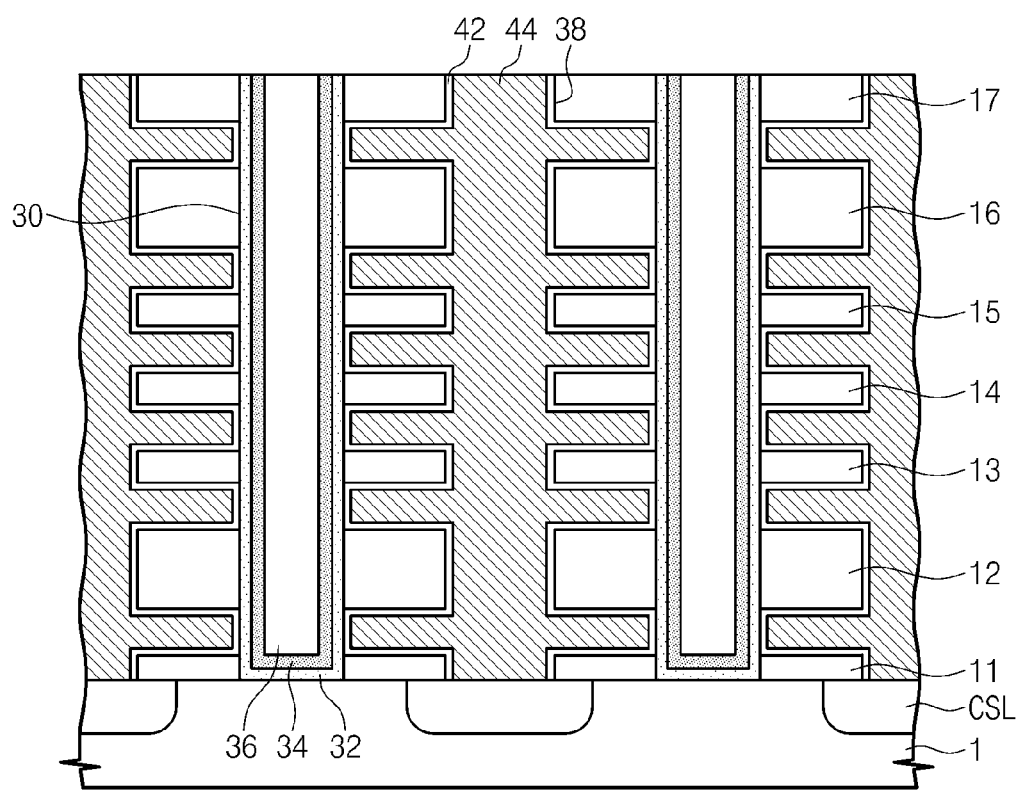

Referring to FIG. 14, a gate insulation layer 42 may be conformally formed on the resulting structure in the positions where the sacrificial layers 21-26 are removed. The gate insulation layer 42 may be formed on at least the sidewalls of the active pillars 32 and the exposed substrate 1. The gate insulation layer 42 may be formed of a silicon oxide layer. In various embodiments, the gate insulation layer 42 may be formed using a deposition process or a thermal oxidation process. A conductive layer 44 may be formed on the gate insulation layer 42 to fill the grooves 38 and spaces between the interlayer insulation layers 11-17. The conductive layer 44 may be formed to include at least one of a doped polysilicon layer, a metal layer, a metal nitride layer and a metal silicide layer.

Figure 15:
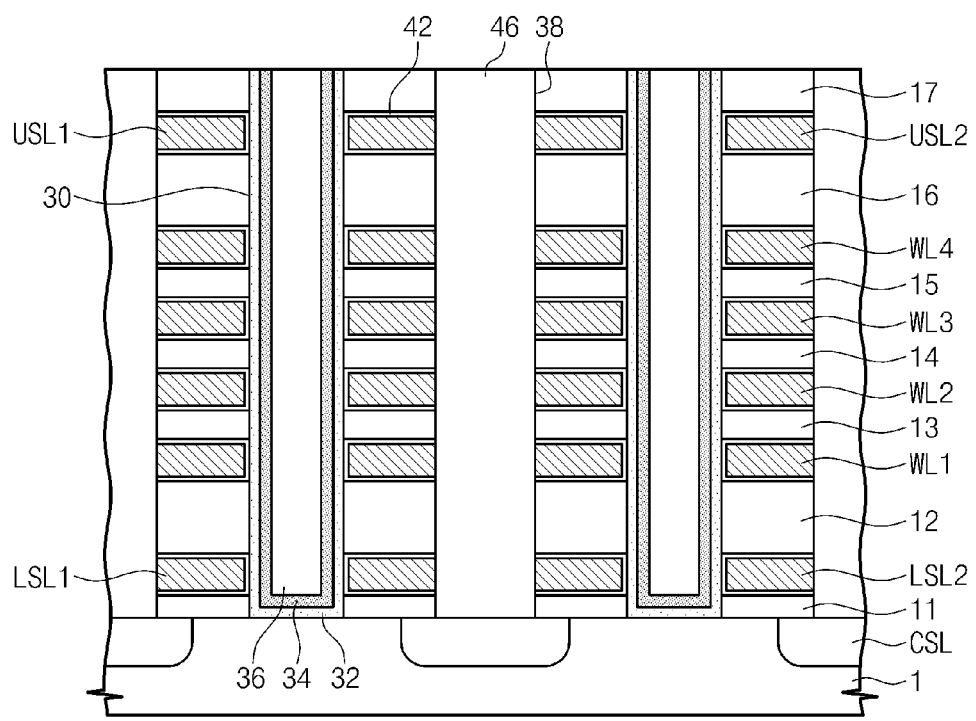

Referring to FIG. 15, the conductive layer 44 and the gate insulation layer 42 formed in the grooves 38 may be selectively removed to form lower selection lines LSL1-LSL3, word lines WL1-WL4 and upper selection lines USL1-USL3, and isolating insulation patterns 46 may be formed in respective ones of the empty grooves 38. As such, the lower selection lines LSL1-LSL3, the word lines WL1-WL4 and the upper selection lines USL1-USL3 may be separated and isolated from each other.

Referring again to FIG. 3, drain regions D may be formed in respective ones of upper portions of the active pillars 32 using an ion implantation process. A conductive layer may be formed on the substrate including the drain regions D and the conductive layer may be patterned to form bit lines BL1-BL3 extending in the second direction L2 illustrated in FIG. 2.

According to the embodiment described above, the variable resistive layers 34 may be formed to contact the active pillars 32. Thus, a resistive RAM device according to the present embodiment may be more readily fabricated.

Second Embodiment

Figure 16:
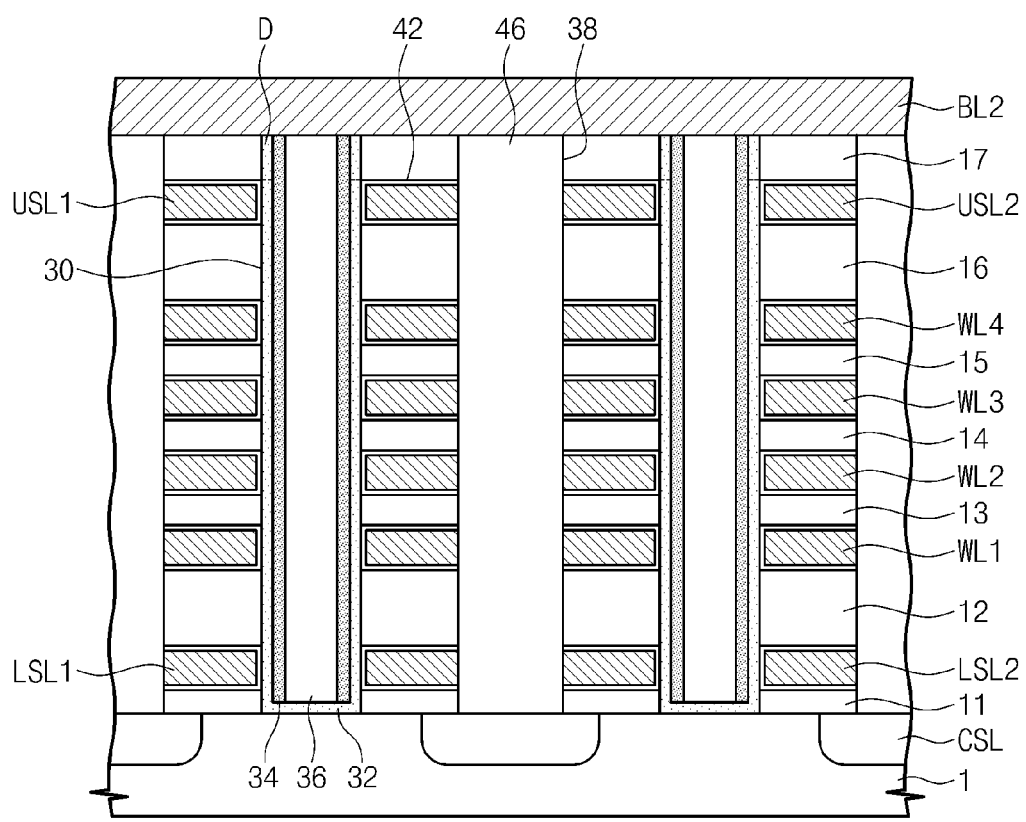
FIG. 16 is a cross-sectional view illustrating a resistive RAM device according to a second embodiment of the present inventive concepts.

FIG. 16 is a cross-sectional view illustrating a resistive RAM device according to a second embodiment of the present inventive concepts.

Referring to FIG. 16, the present embodiment is different from the previous embodiment illustrated in FIG. 3 in terms of a shape of the variable resistive patterns 34. That is, the resistive RAM device according to the present embodiment may include spacer-shaped variable resistive patterns 34 covering only inner sidewalls of the active pillars 32, and not a bottom surface of the active pillars. In this manner, the resulting variable resistive patterns 34 are generally cylindrical in shape, and not cup-shaped as shown in the embodiment of FIG. 15

The resistive RAM device according to the present embodiment may be fabricated by forming the active layer 32 and the variable resistive layer 34 as illustrated in FIG. 10, by anisotropically etching the variable resistive layer 34 to form the spacer-shaped variable resistive patterns 34 and by forming the buried insulation pattern 36 in respective ones of the active holes 30.

Third Embodiment

Figure 17:
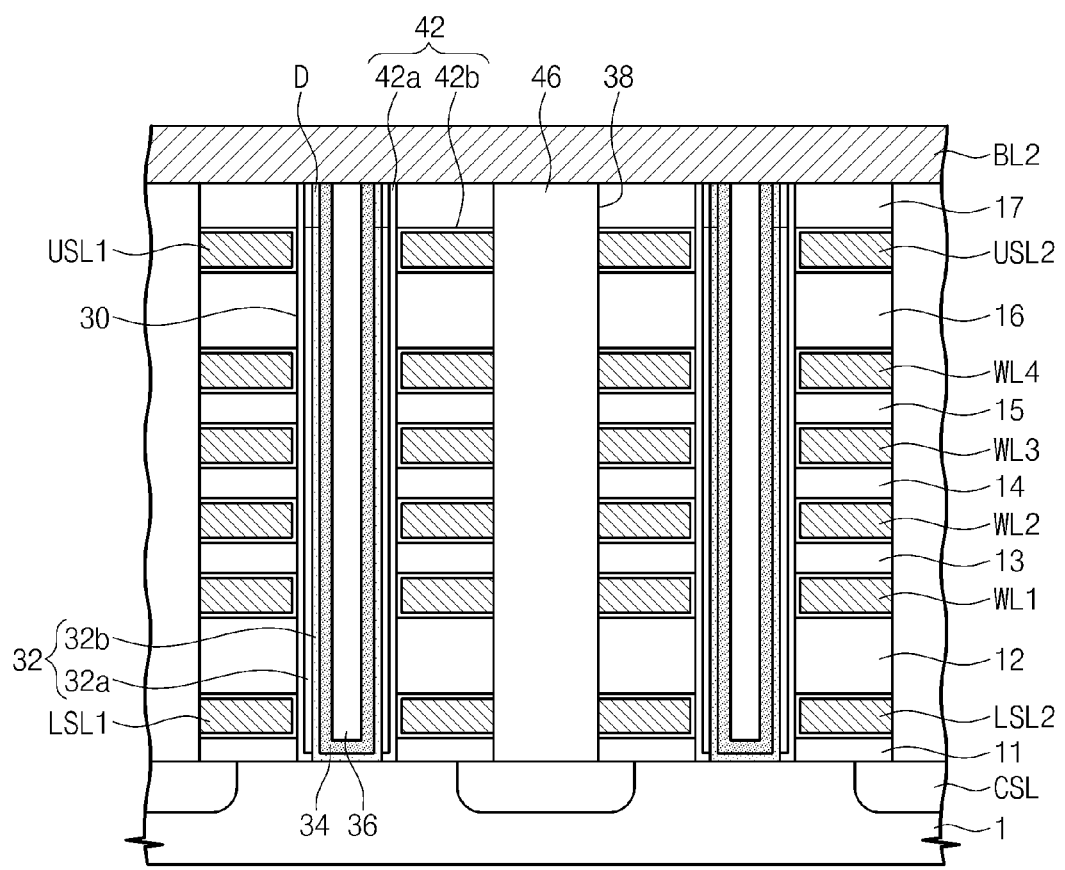
FIG. 17 is a cross-sectional view illustrating a resistive RAM device according to a third embodiment of the present inventive concepts.

FIG. 17 is a cross-sectional view illustrating a resistive RAM device according to a third embodiment of the present inventive concepts.

Referring to FIG. 17, a resistive RAM device according to the present embodiment may include active pillars 32 and a gate insulation layer 42. Each of the active pillars 32 may include a first active layer 32a and a second active layer 32b, and the gate insulation layer 42 may include a first gate insulation layer 42a and a second gate insulation layer 42b. The first gate insulation layer 42a may cover a sidewall of the active hole 30 and may have a spacer shape. Further, the first gate insulation layer 42a may have an L-shaped cross section.

The first gate insulation layer 42a may also cover sidewalls of the interlayer insulation layers 11-17 in the active hole 30. The second gate insulation layer 42b may extend in a horizontal direction to be vertically positioned between the interlayer insulation layers 11-17 and the lines LSL1-LSL2, WL1-WL4 and USL1-USL3. The first active layer 32a may have a sidewall spacer shape and may cover an inner sidewall of the first gate insulation layer 42a opposite to the second gate insulation layer 42b. The second active layer 32b may cover an inner sidewall of the first active layer 32a opposite to the first gate insulation layer 42a and may extend onto the substrate 1 exposed by the active hole 30. In some embodiments, the first and second active layers 32a and 32b may be formed of the same material layer. The first and second gate insulation layers 42a and 42b may be formed of the same material layer.

The other elements of the present embodiment may have the same or similar configurations as illustrated in the first embodiment.

Figure 18:
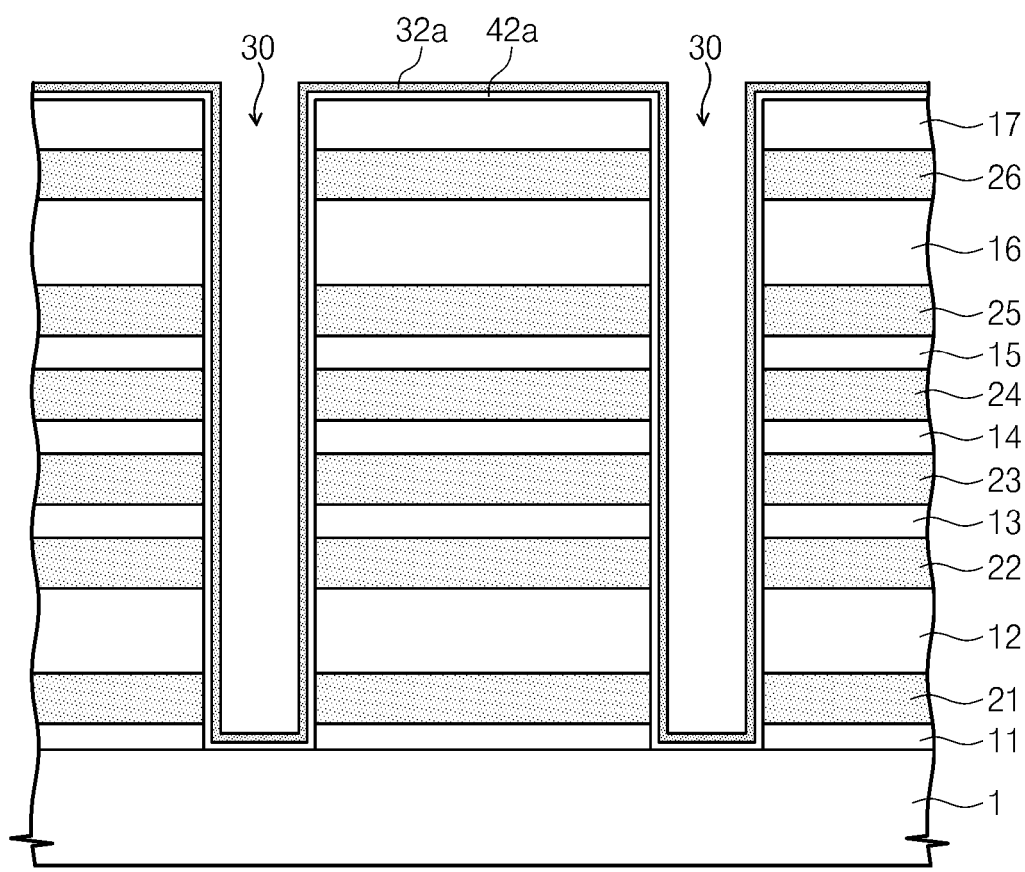
FIGS. 18, 19 and 20 are cross sectional views illustrating a method of fabricating a resistive RAM device shown in FIG. 17 in accordance with the present inventive concepts.
Figure 19:
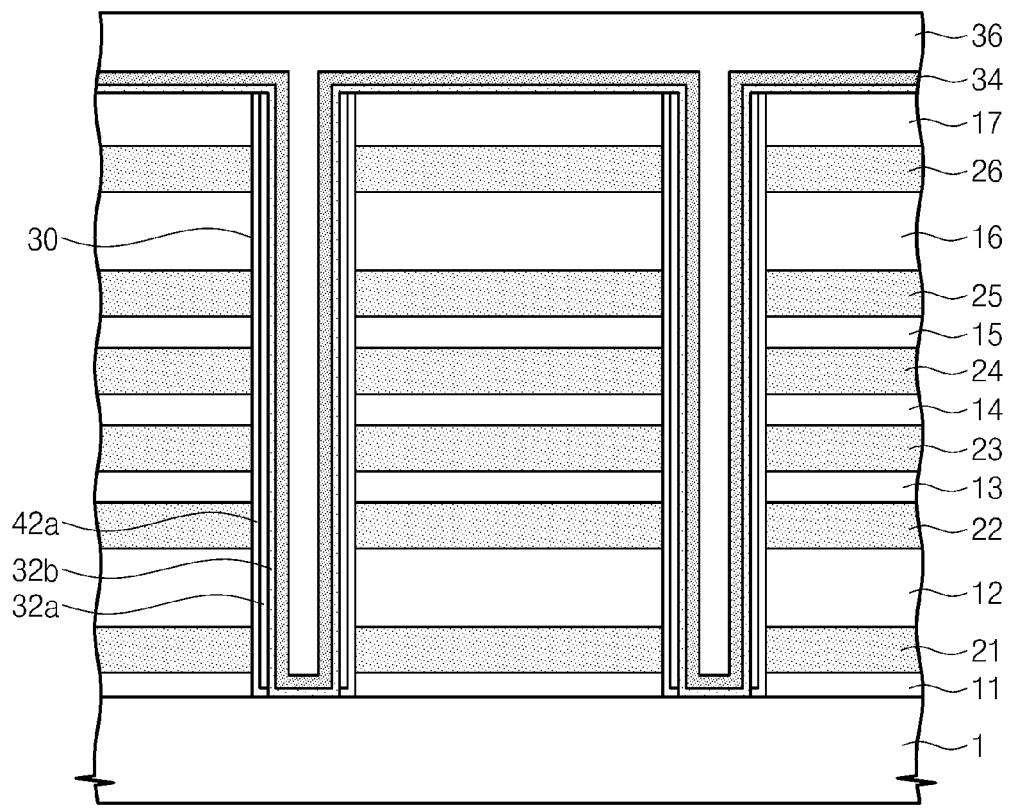
Figure 20:
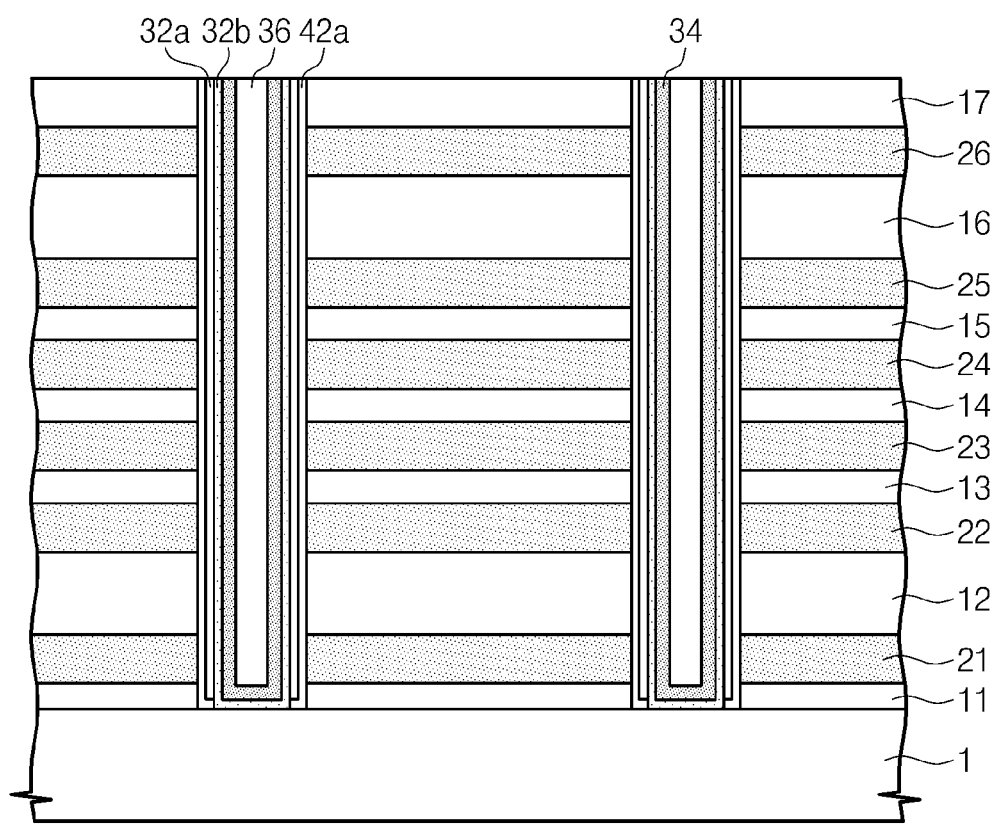

FIGS. 18, 19 and 20 are cross sectional views illustrating a method of fabricating a resistive RAM device as shown in FIG. 17, in accordance with the present inventive concepts.

Referring to FIG. 18, as illustrated in FIG. 9, the interlayer insulation layers 11-17 and the sacrificial layers 21-26 may be patterned to form the active holes 30 exposing the substrate 1. A first gate insulation layer 42a and a first active layer 32a may be sequentially and conformally formed on the substrate including the active holes 30. The first gate insulation layer 42a may be formed of a silicon oxide layer. The first active layer 32a may be formed of a doped polysilicon layer or an undoped polysilicon layer.

Referring to FIG. 19, the first active layer 32a and the first gate insulation layer 42a may be anisotropically etched to form a spacer-shaped first active layer 32a and a spacer-shaped first gate insulation layer 42a in each of the active holes 30. A second active layer 32b, a variable resistive layer 34 and a buried insulation layer 36 may be formed on the substrate including the spacer-shaped first active layers 32a and the spacer-shaped first gate insulation layers 42a. In some embodiments, the second active layer 32b and the variable resistive layer 34 may be conformally formed and the buried insulation layer 36 may be formed to fill the active holes 30.

Referring to FIG. 20, the buried insulation layer 36, the variable resistive layer 34 and the second active layer 32b may be planarized to expose a top surface of the uppermost interlayer insulation layer (e.g., the seventh interlayer insulation layer 17), thereby forming a cup-shaped second active layer 32b, a cup-shaped variable resistive layer 34 and a buried insulation pattern 36 in each of the active holes 30.

Subsequently, as described with reference to FIG. 17, the interlayer insulation layers 11-17 and the sacrificial layers 21-26 may be patterned to form grooves 38 exposing the substrate 1 and the sacrificial layers 21-26 may be removed. A second gate insulation layer 42b may then be conformally formed on the substrate where the sacrificial layers 21-26 are removed. Subsequently, the same or similar processes as described in the first embodiment may be applied to the substrate including the second gate insulation layer 42b.

Fourth Embodiment

Figure 21:
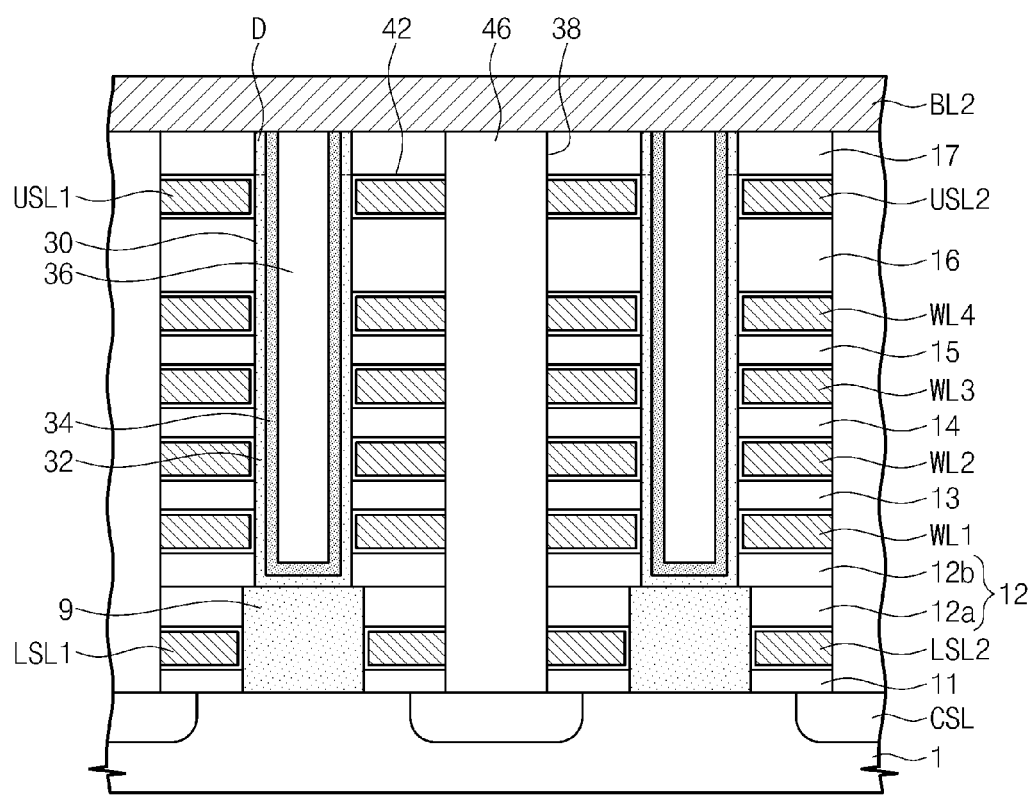
FIG. 21 is a cross-sectional view illustrating a resistive RAM device according to a fourth embodiment of the present inventive concepts.

FIG. 21 is a cross-sectional view illustrating a resistive RAM device according to a fourth embodiment of the present inventive concepts.

Referring to FIG. 21, a resistive RAM device according to the present embodiment may include active pads 9 disposed between the active pillars 32 and the substrate 1. In some embodiments, the active pads 9 may be formed of the same material as the active pillars 32. In various embodiments, the width of the active pads 9 may be greater than that of the active pillars 32. The second interlayer insulation layer 12 adjacent to the interfaces between the active pads 9 and the active pillars 32 may be a double-layered material including a first sub interlayer insulation layer 12a and a second sub interlayer insulation layer 12b. Top surfaces of the active pads 9 may be coplanar with a top surface of the first sub interlayer insulation layer 12a. The lower selection lines LSL1-LSL3 may be disposed to be adjacent to sidewalls of the active pads 9. An outer sidewall of each variable resistive layer 34 may be surrounded by the word lines WL1-WL4 and one of the upper selection lines USL1-USL3. The other elements of the present embodiment may have the same or similar configurations as illustrated in the first embodiment.

Figure 22:
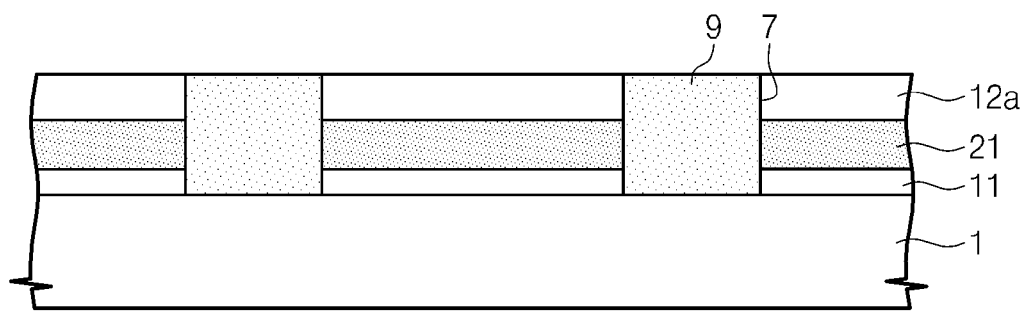
FIGS. 22, 23 and 24 are cross sectional views illustrating a method of fabricating a resistive RAM device shown in FIG. 21, in accordance with the present inventive concepts.
Figure 23:
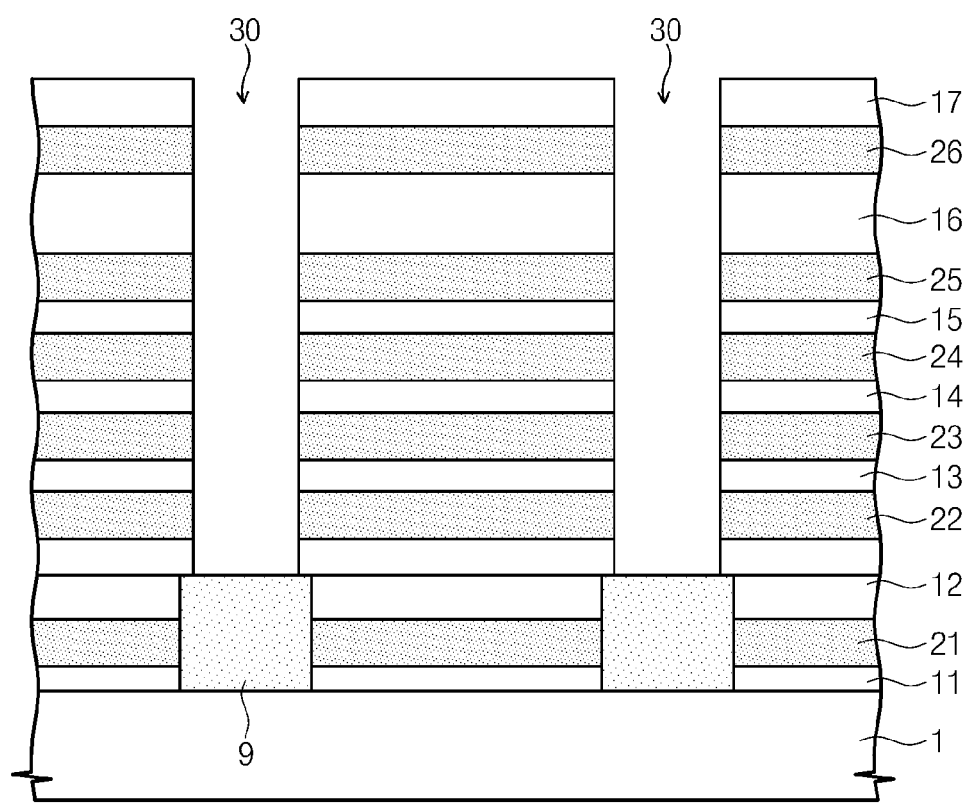
Figure 24:
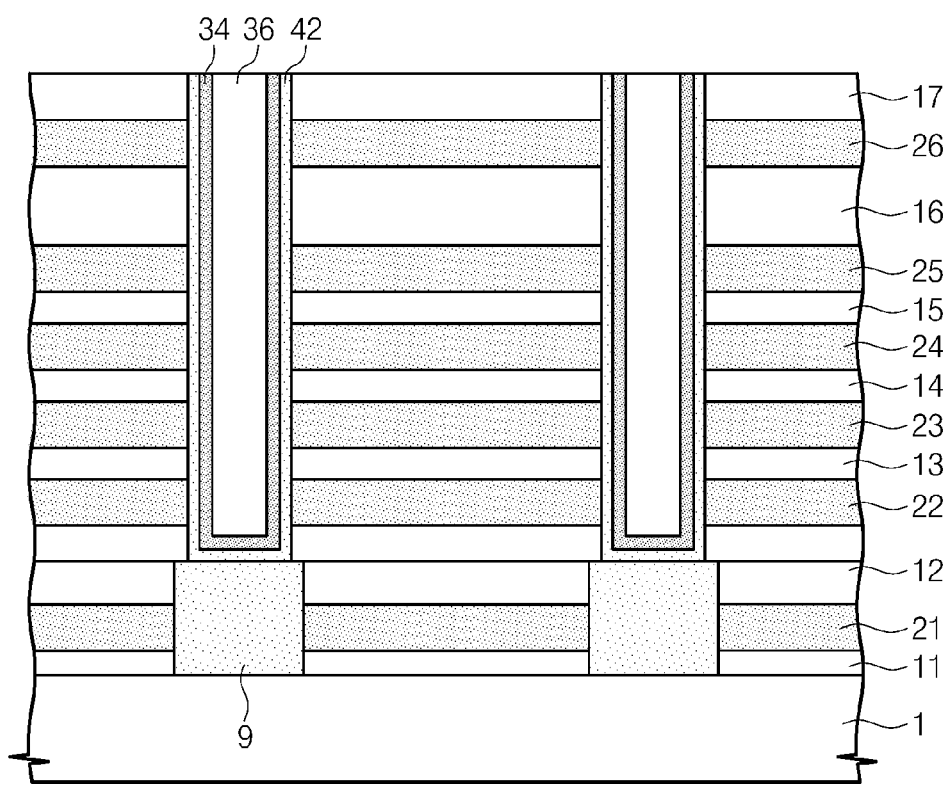

FIGS. 22, 23 and 24 are cross sectional views illustrating a method of fabricating a resistive RAM device shown in FIG. 21.

Referring to FIG. 22, a first interlayer insulation layer 11, a first sacrificial layer 21 and a first sub interlayer insulation layer 12a may be sequentially formed on a substrate 1. The first sub interlayer insulation layer 12a, the first sacrificial layer 21 and the first interlayer insulation layer 11 may be patterned to form lower active holes 7 exposing the substrate 1. Active pads 9 may then be formed in respective ones of the lower active holes 7. The active pads 9 may be formed by depositing a polysilicon layer on the first sub interlayer insulation layer 12a to fill the lower active holes 7 and by planarizing the polysilicon layer. In some embodiments, the polysilicon layer or the active pads 9 may be subjected to a thermal annealing process to form a single crystalline silicon layer or single crystalline active pads.

Referring to FIG. 23, a second sub interlayer insulation layer 12b may be formed on the substrate including the active pads 9, and second to sixth sacrificial layers 22-26 and third to seventh interlayer insulation layers 13-17 may be alternately formed on the second sub interlayer insulation layer 12b. The third to seventh interlayer insulation layers 13-17, the second to sixth sacrificial layers 22-26 and the second sub interlayer insulation layer 12b may be patterned to form active holes 30 exposing respective ones of the active pads 9. During formation of the active holes 30, the active pads 9 may act as etch stop layers.

Referring to FIG. 24, an active pillar 32, a variable resistive pattern 34 and a buried insulation pattern 36 may be formed in each of the active holes 30 using the same processes as described in the first embodiment. Subsequently, the same or similar processes as described in the first embodiment may be applied to the substrate including the active pillars 32, the variable resistive patterns 34 and the buried insulation patterns 36.

In the resistive RAM device fabricated according to the present embodiment, the active pads 9 may operate to improve the current flow between the active pillars 32 and the substrate 1 (e.g., the common source lines CSL of FIG. 21). This effect may be described more fully herein.

As illustrated in FIG. 18, when the active holes 30 are formed by etching the interlayer insulation layers 11-17 and the sacrificial layers 21-26, the substrate 1 may be over etched to fully open the deep active holes 30. Thus, the substrate 1 under the active holes 30 may be recessed. That is, bottom surfaces of the active holes 30 may be located at a lower level than an initial top surface of the substrate 1. In such a case, if the first gate insulation layer 42a is formed in the active holes 30 as described in the third embodiment (see FIGS. 17 and 18), lower portions of the first gate insulation layer 42a in the active holes 30 may be formed to downwardly protrude from the initial top surface of the substrate 1. These protrusions of the first gate insulation layer 42a may disturb the current flow between the active pillars 32 formed in the active holes 30 and the common source lines CSL formed in the substrate 1. Thus, in the event that the active pads 9 are formed on the substrate 1 prior to formation of the active holes 30 and the gate insulation layer 42, the gate insulation layer may not disturb the current flow between the active pillars 32 and the common source lines CSL.

Fifth Embodiment

Figure 25:
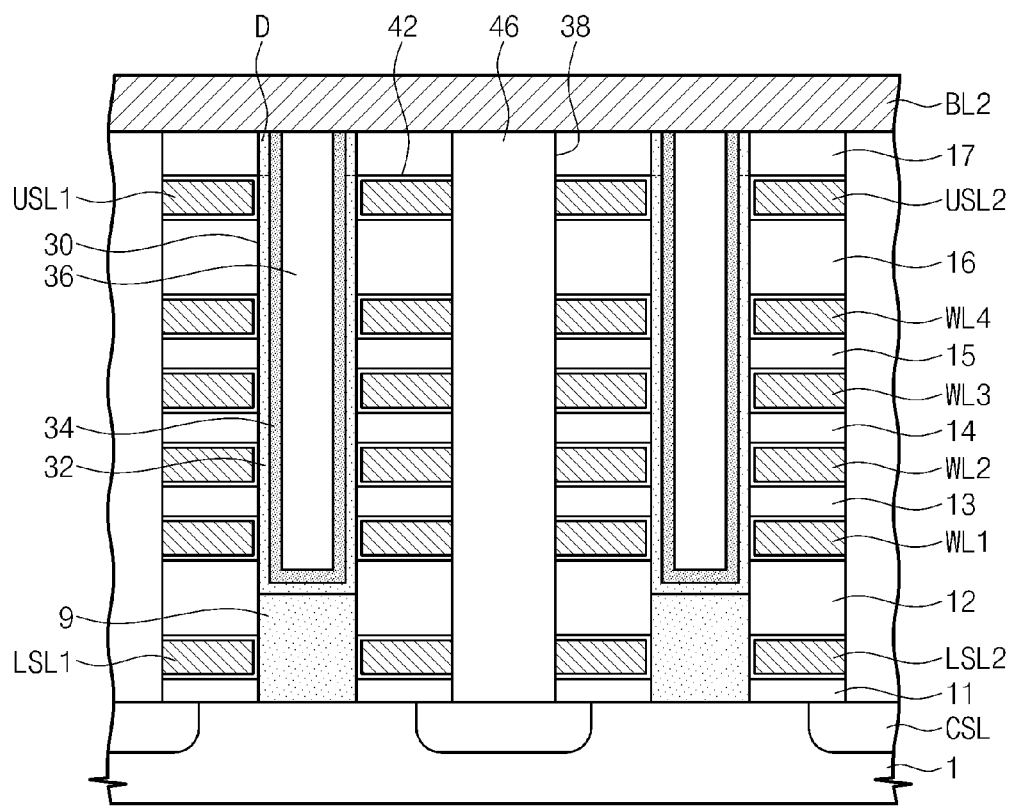
FIG. 25 is a cross-sectional view illustrating a resistive RAM device according to a fifth embodiment of the present inventive concepts.

FIG. 25 is a cross-sectional view illustrating a resistive RAM device according to a fifth embodiment of the present inventive concepts.

Referring to FIG. 25, a resistive RAM device according to the present embodiment may include active pads 9 disposed between active pillars 32 and a substrate 1, and the active pads 9 and the active pillars 32 may be disposed in active holes 30 exposing the substrate 1. In each active hole 30, a sidewall of the active pad 9 may be vertically aligned with an outer sidewall of the active pillar 32. Lower selection lines LSL1-LSL3 may surround the sidewalls of the active pads 9. Word lines WL1-WL4 and upper selection lines USL1-USL3 may surround outer sidewalls of the active pillars 32, and variable resistive patterns 34 may be disposed in respective ones of the active pillars 32. The other elements of the present embodiment may have the same or similar configurations as illustrated in the first embodiment or some of the other embodiments described herein.

Figure 26:
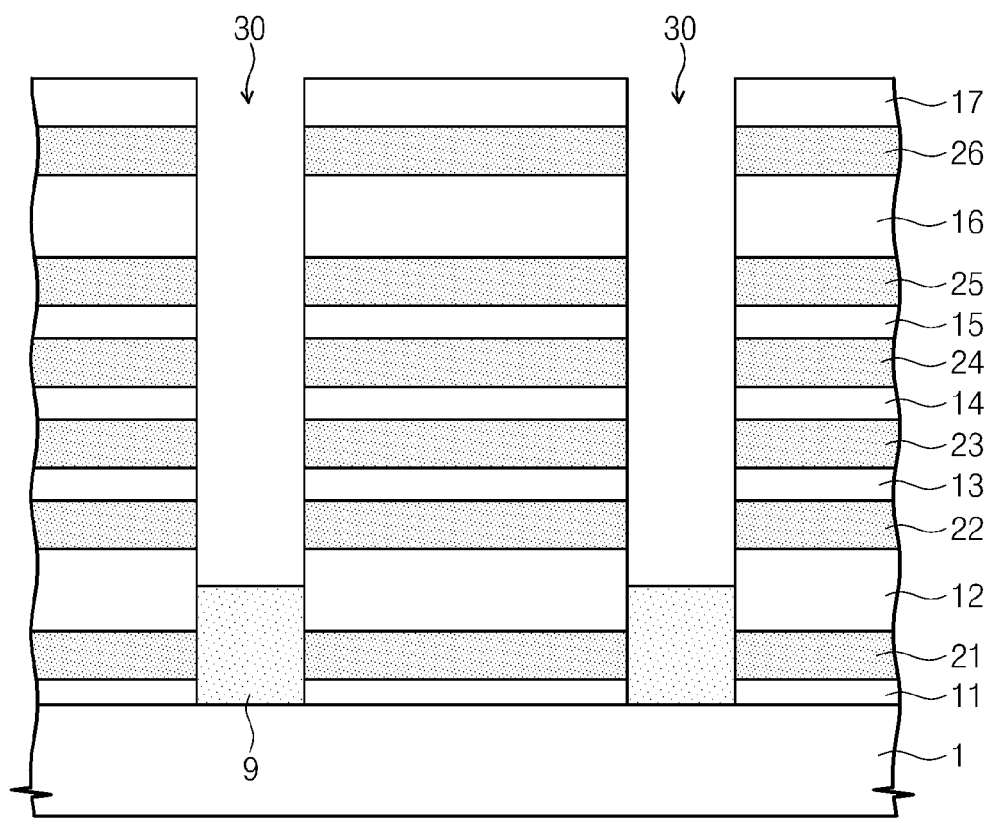
FIG. 26 is a cross-sectional view illustrating a method of fabricating a resistive RAM device shown in FIG. 25, in accordance with the present inventive concepts.

FIG. 26 is a cross-sectional view illustrating a method of fabricating a resistive RAM device shown in FIG. 25.

Referring to FIG. 26, as illustrated in FIG. 9, the interlayer insulation layers 11-17 and the sacrificial layers 21-26 may be patterned to form the active holes 30 exposing the substrate 1. Semiconductor epitaxial layers may be grown on the exposed substrate 1 using a selective epitaxial growth (SEG) process, thereby forming active pads 9 in respective ones of the active holes 30. Active pillars and variable resistive patterns may then be formed in the active holes 30 using the same or similar manners as described in the first embodiment. Subsequent processes may be the same or similar as described in the first embodiment.

Sixth Embodiment

Figure 27:
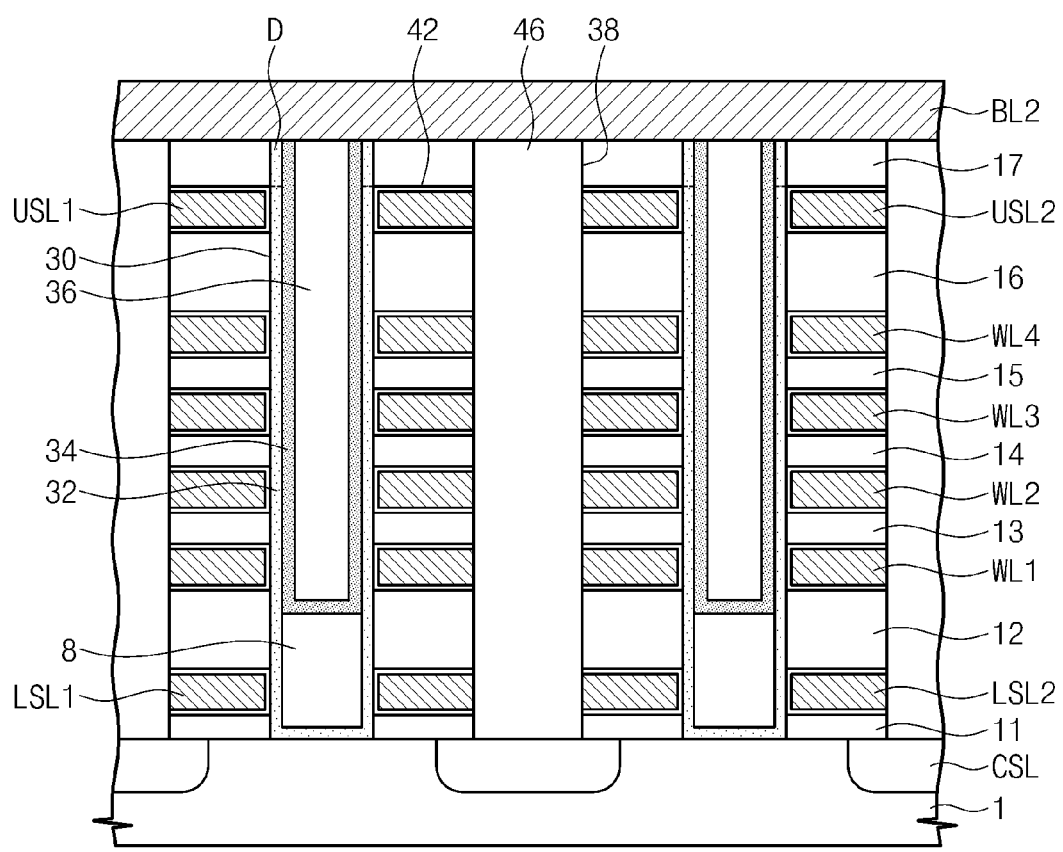
FIG. 27 is a cross-sectional view illustrating a resistive RAM device according to a sixth embodiment of the present inventive concepts.

FIG. 27 is a cross-sectional view illustrating a resistive RAM device according to a sixth embodiment of the present inventive concepts.

Referring to FIG. 27, a resistive RAM device according to the present embodiment may include an active pillar 32 and a variable resistive pattern 34 which are disposed in each of active holes 30. The variable resistive pattern 34 may be disposed in the active pillar 32 so as to have a cup shape, and the variable resistive pattern 34 may also have a cup shape. Further, the resistive RAM device according to the present embodiment may include a lower buried insulation pattern 8 which is disposed between a base portion of the active pillar 32 and a bottom surface of the variable resistive pattern 34. The bottom surfaces of the variable resistive patterns 34 may be located at a level between lower selection lines LSL1-LSL3 and first word lines WL1. The lower buried insulation patterns 8 may be formed of an insulation material such as a silicon oxide layer, a silicon nitride layer or a silicon oxynitride layer, or other suitable insulating material layer. The other elements of the present embodiment may have the same or similar configurations as illustrated in the first embodiment. In this manner, in the present embodiment, the lower select transistor does not include a variable resistive layer pattern 34.

FIGS. 28, 29, 30 and 31 are cross-sectional views illustrating a method of fabricating a resistive RAM device shown in FIG. 27.

Figure 28:
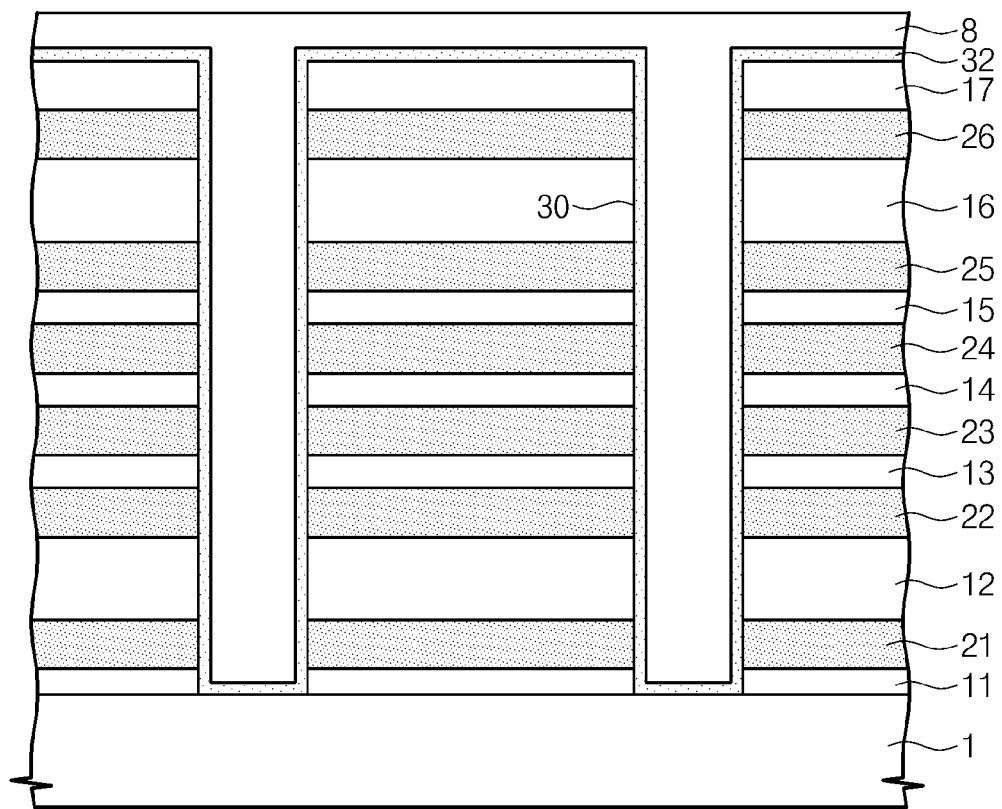
FIGS. 28, 29, 30 and 31 are cross sectional views illustrating a method of fabricating a resistive RAM device shown in FIG. 27, in accordance with the present inventive concepts.

Referring to FIG. 28, as illustrated in FIG. 9, the interlayer insulation layers 11-17 and the sacrificial layers 21-26 may be patterned to form the active holes 30 exposing the substrate 1. An active layer 32 may be conformally formed on the substrate including the active holes 30. A lower buried insulation layer 8 may be formed on the active layer 32 to fill the active holes 30.

Figure 29:
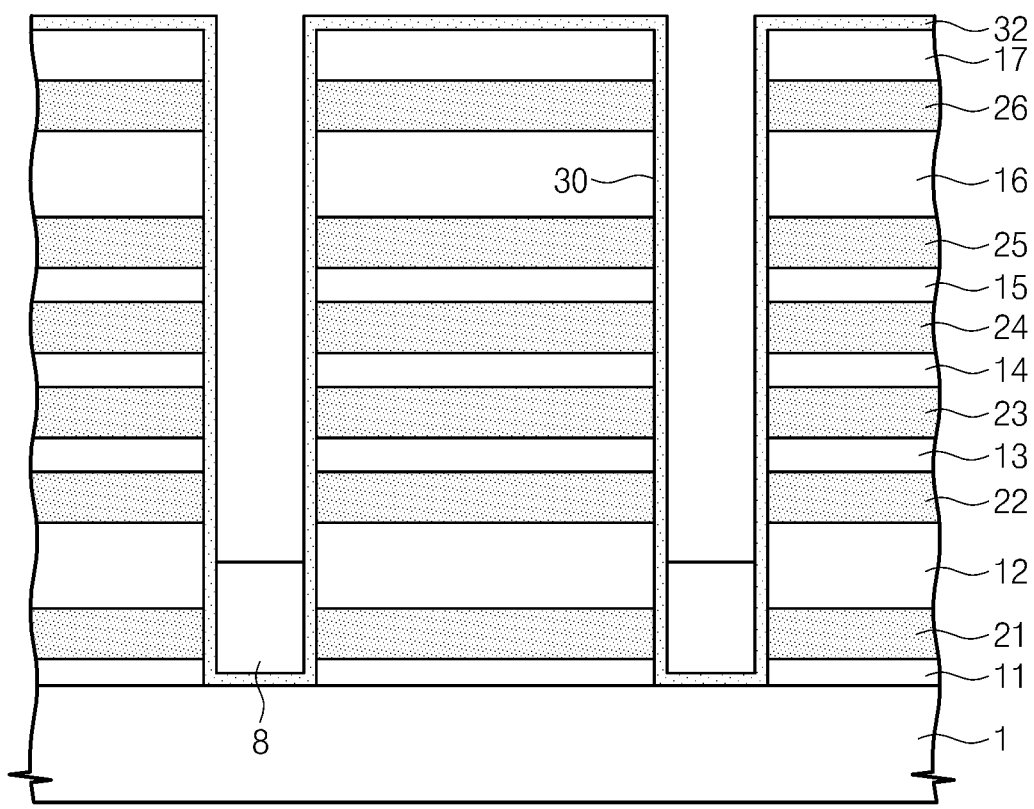

Referring to FIG. 29, the lower buried insulation layer 8 may be etched back to form lower buried insulation patterns 8 in respective ones of lower portions of the active holes 30. The lower buried insulation patterns 8 may be formed such that top surfaces of the lower buried insulation patterns 8 are located at a level between the between lower selection lines LSL1-LSL3 and the first word lines WL1. Thus, portions of the active layer 32 located at a higher level than the lower buried insulation patterns 8 may be exposed.

Figure 30:
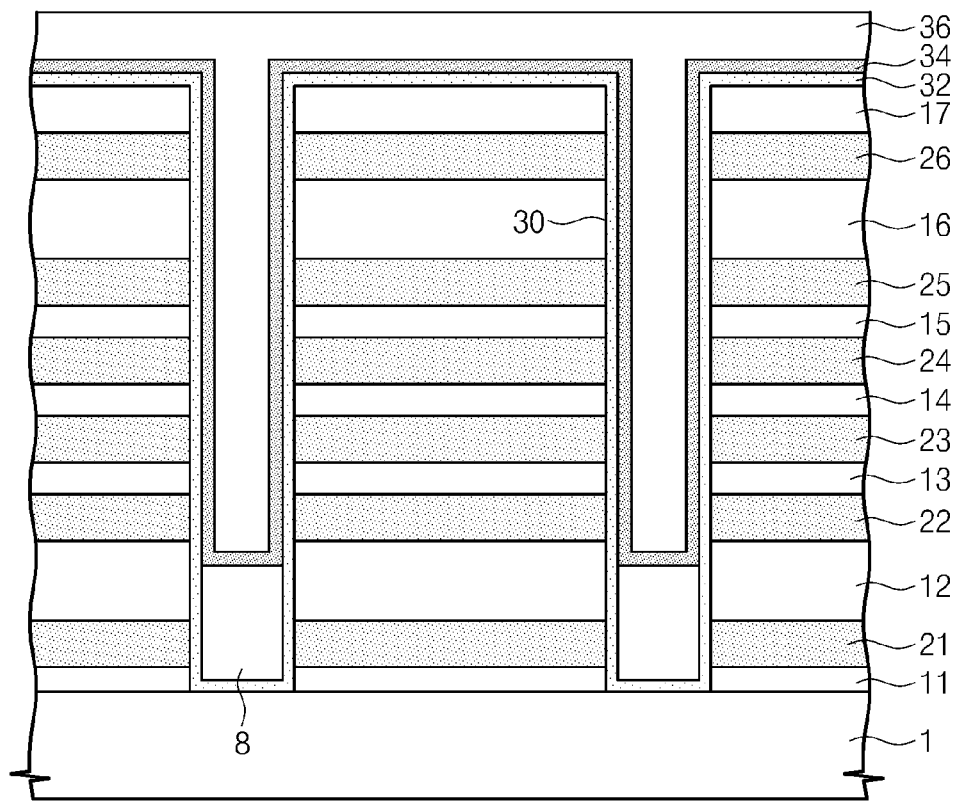

Referring to FIG. 30, a variable resistive layer 34 may be conformally formed on the exposed active layer 32 and the lower buried insulation patterns 8, and a buried insulation layer 36 may be formed on the variable resistive layer 34 to fill the active holes 30.

Figure 31:
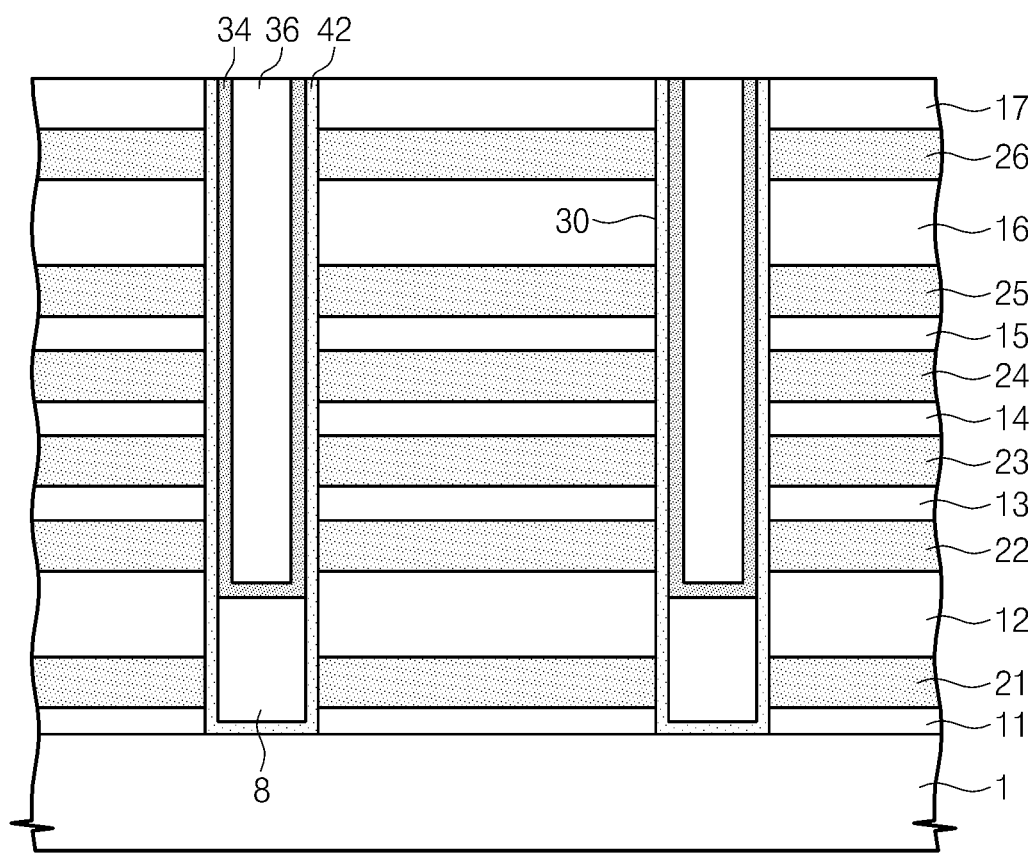

Referring to FIG. 31, the buried insulation layer 36, the variable resistive layer 34 and the active layer 32 may be planarized to expose a top surface of the uppermost interlayer insulation layer 17. Subsequent processes may then be performed using the same or similar manners as described in the first embodiment.

Seventh Embodiment

Figure 32:
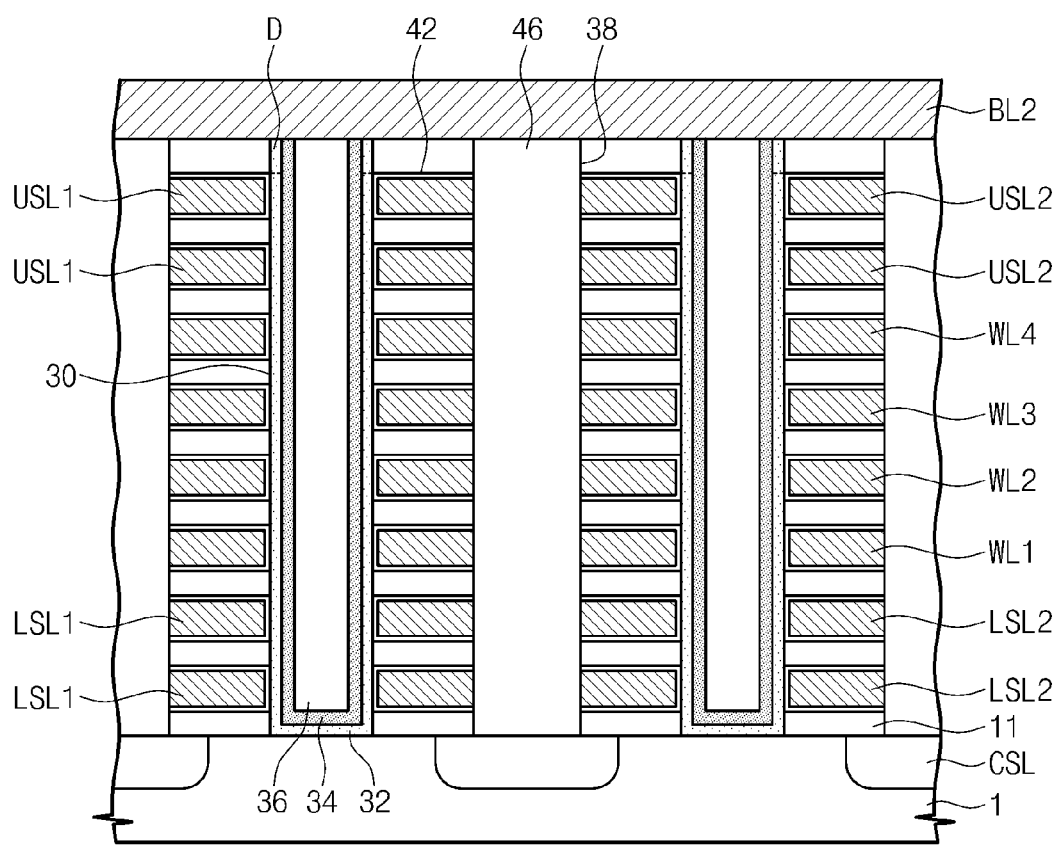
FIG. 32 is a cross-sectional view illustrating a resistive RAM device according to a seventh embodiment of the present inventive concepts.

FIG. 32 is a cross-sectional view illustrating a resistive RAM device according to a seventh embodiment of the present inventive concepts.

Referring to FIG. 32, a resistive RAM device according to the present embodiment may include a pair of first lower selection lines LSL1 vertically separated and stacked and a pair of second lower selection lines LSL2 vertically separated and stacked. Similarly, the resistive RAM device according to the present embodiment may also include a pair of first upper selection lines USL1 vertically separated and stacked and a pair of second upper selection lines USL2 vertically separated and stacked. The other elements of the present embodiment may have the same or similar configurations as illustrated in the first embodiment.

Eighth Embodiment

Figure 33:
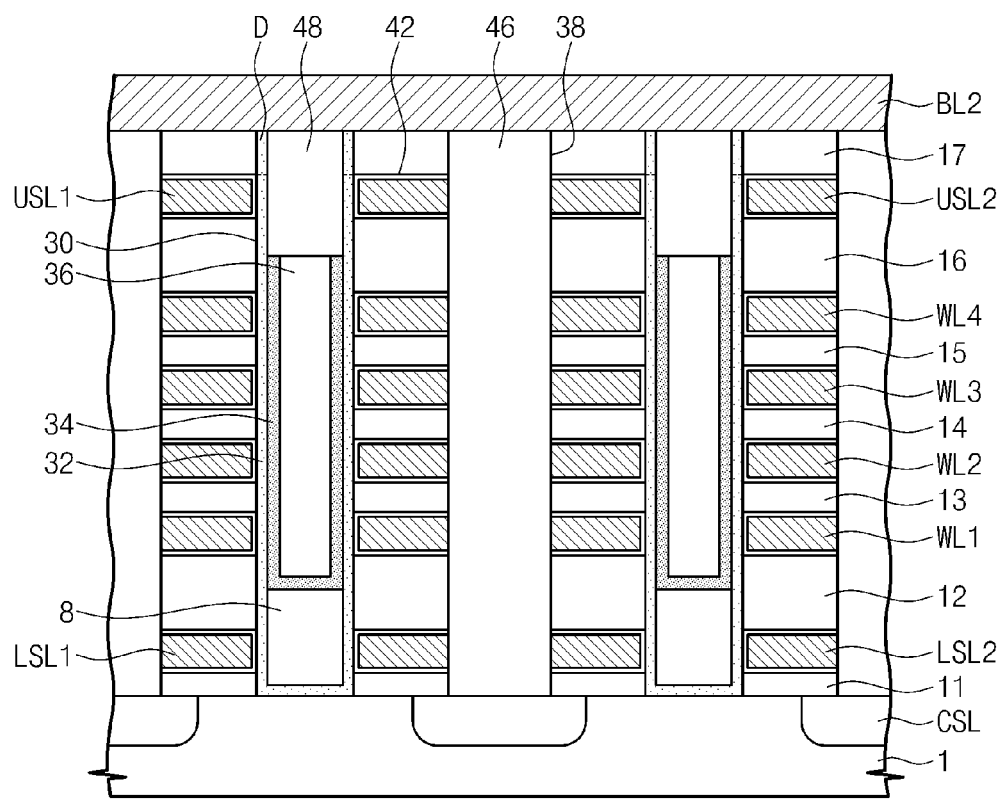
FIG. 33 is a cross-sectional view illustrating a resistive RAM device according to an eighth embodiment of the present inventive concepts.

FIG. 33 is a cross-sectional view illustrating a resistive RAM device according to an eighth embodiment of the present inventive concepts.

The present embodiment is similar to the sixth embodiment described with reference to FIG. 27. Thus, to avoid duplicate explanation, differences between the present embodiment and the sixth embodiment illustrated in FIG. 27 will be primarily described.

Referring to FIG. 33, top surfaces of the variable resistive patterns 34 and the buried insulation patterns 36 may be located at a level between the uppermost word lines (e.g., the fourth word lines WL4) and the upper selection lines USL1-USL3. Further, the active holes 30 between the bit lines BL1-BL3 and the buried insulation patterns 36 may be filled with upper buried insulation patterns 48. In this manner, in the present embodiment, the lower select transistor and the upper select transistor do not include a variable resistive layer pattern 34. The other elements of the present embodiment may have the same or similar configurations as illustrated in the sixth embodiment.

Figure 34:
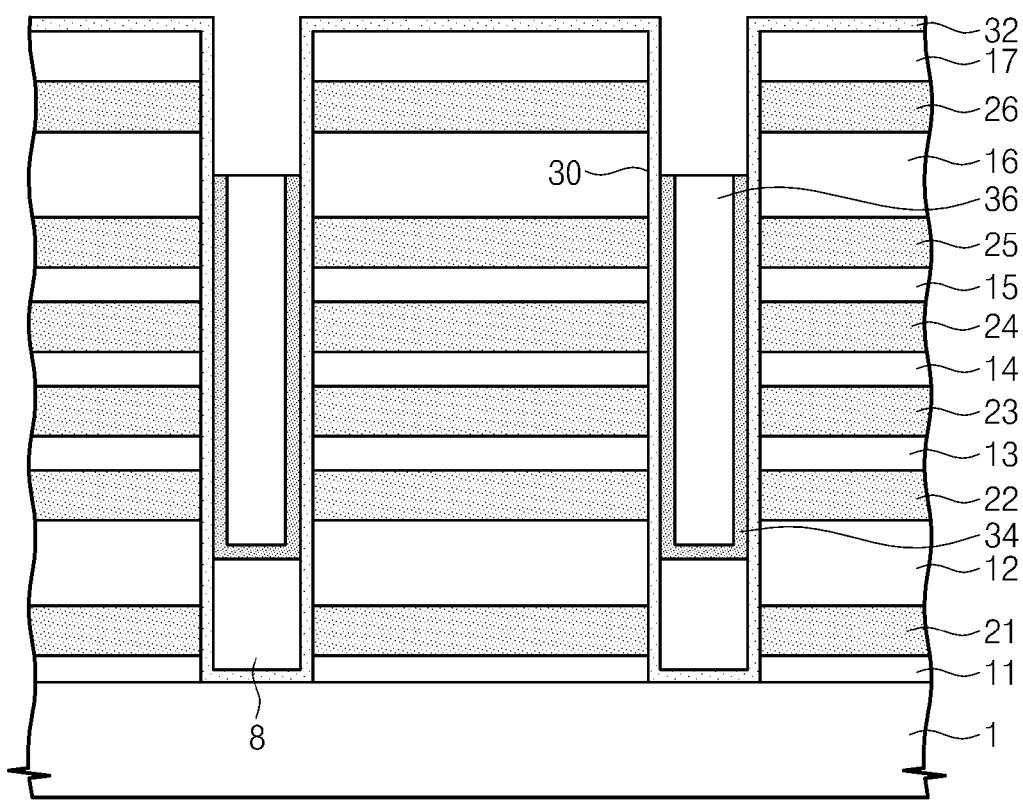
FIGS. 34 and 35 are cross sectional views illustrating a method of fabricating a resistive RAM device shown in FIG. 33, in accordance with the present inventive concepts.
Figure 35:
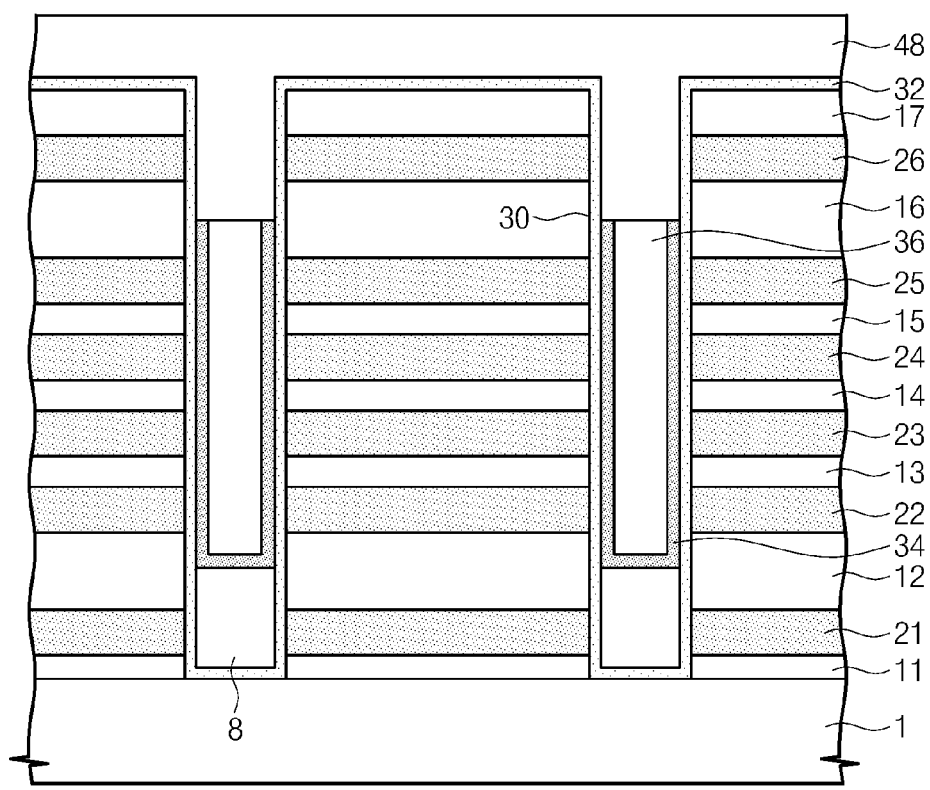

FIGS. 34 and 35 are cross sectional views illustrating a method of fabricating a resistive RAM device shown in FIG. 33.

Referring to FIG. 34, the buried insulation layer 36 and the variable resistive layer 34 illustrated in FIG. 30 may be etched back and recessed to form variable resistive patterns 34 and buried insulation patterns 36 in the active holes 30. The variable resistive patterns 34 and the buried insulation patterns 36 may be formed such that top surfaces of the variable resistive patterns 34 and the buried insulation patterns 36 may be located at a level between the uppermost word lines (e.g., the fourth word lines WL4) and the upper selection lines USL1-USL3. The active layer 32 may operate as an etch stop layer when the buried insulation layer 36 and the variable resistive layer 34 are etched back and recessed. Thus, the uppermost interlayer insulation layer (e.g., the seventh interlayer insulation layer 17) may still be covered with the active layer 32 even after the buried insulation layer 36 and the variable resistive layer 34 are etched back and recessed.

Referring to FIG. 35, an upper buried insulation layer 48 may be deposited on the active layer 32 to fill the active holes 30 on the buried insulation patterns 36. The upper buried insulation layer 48 and the active layer 32 may be planarized to expose a top surface of the uppermost interlayer insulation layer 17 and to form upper buried insulation patterns 48 in respective ones of the active holes 30. Subsequent processes may then be performed using the same or similar manners as described in the first embodiment.

Ninth Embodiment

Figure 36:
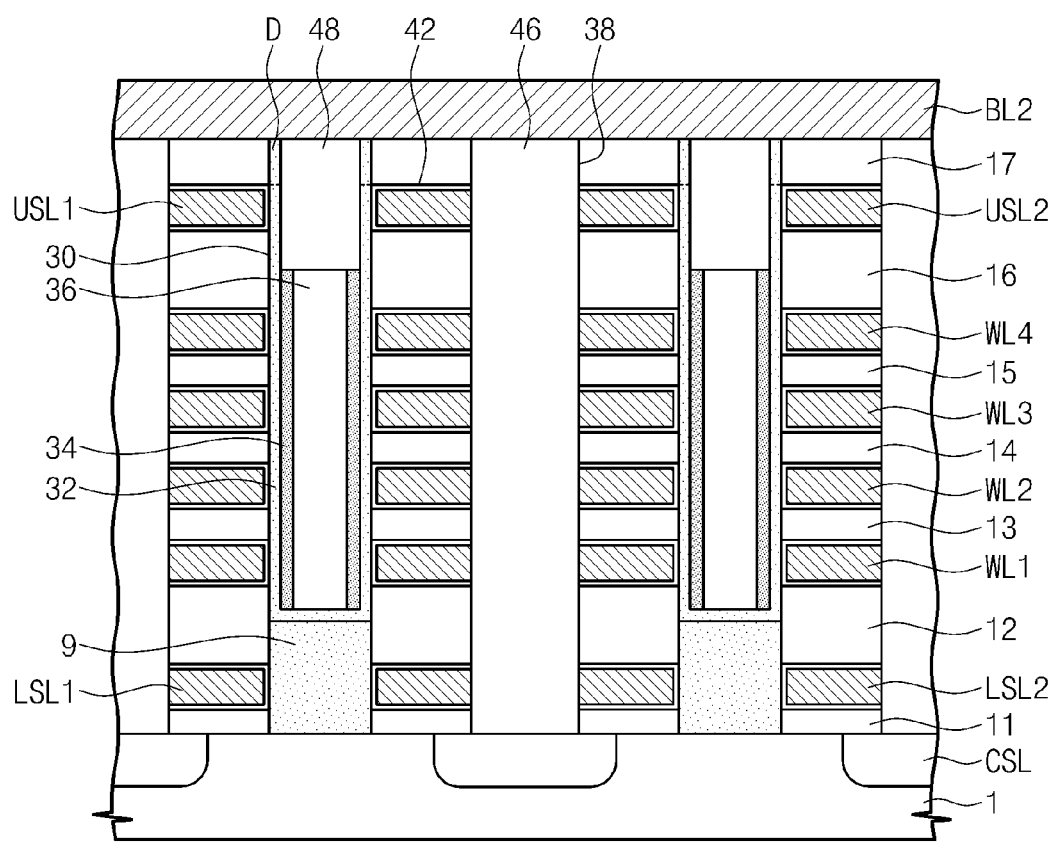
FIG. 36 is a cross-sectional view illustrating a resistive RAM device according to a ninth embodiment of the present inventive concepts.

FIG. 36 is a cross-sectional view illustrating a resistive RAM device according to a ninth embodiment of the present inventive concepts.

Referring to FIG. 36, a resistive RAM device according to the present embodiment may include active pads 9 disposed between active pillars 32 and a substrate 1, and the active pads 9 and the active pillars 32 may be disposed in active holes 30 exposing the substrate 1. Variable resistive patterns 34 may cover inner sidewalls of the active pillars 32 and may have spacer shapes. Top surfaces of the variable resistive patterns 34 may be located at a level between the upper selection lines USL1-USL3 and the uppermost word lines WL4, and bottom surfaces of the variable resistive patterns 34 may be located at a level between the lower selection lines LSL1-LSL3 and the lowermost word lines WL1. The active holes 30 surrounded by the variable resistive patterns 34 may be filled with buried insulation patterns 36, and the active holes 30 between the bit lines BL1-BL3 and the buried insulation patterns 36 may be filled with upper buried insulation patterns 48. The other elements of the present embodiment may have the same or similar configurations as described in the fifth and eighth embodiments. Further, the other elements of the present embodiment may be formed using the same or similar manners as described in the fifth and eighth embodiments.

Tenth Embodiment

Figure 37:
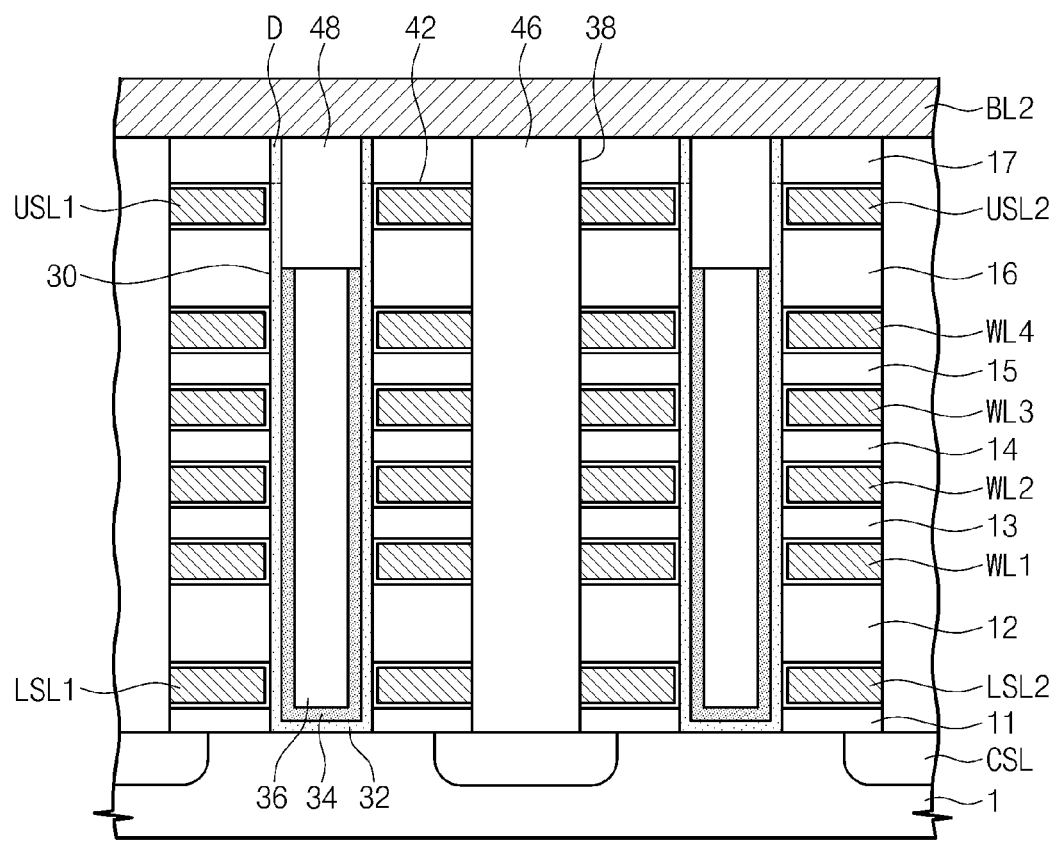
FIG. 37 is a cross-sectional view illustrating a resistive RAM device according to a tenth embodiment of the present inventive concepts.

FIG. 37 is a cross-sectional view illustrating a resistive RAM device according to a tenth embodiment of the present inventive concepts.

Referring to FIG. 37, a resistive RAM device according to the present embodiment may include a variable resistive pattern 34 and a buried insulation pattern 36 disposed in each of active holes 30, and the variable resistive pattern 34 and the buried insulation pattern 36 in each active hole 30 may be surrounded by word lines WL1-WL4 and one of lower selection line LSL1-LSL3. That is, top surfaces of the variable resistive pattern 34 and the buried insulation pattern 36 may be located at a level between upper selection lines USL1-USL3 and the uppermost word lines (e.g., the fourth word line WL4). The active holes 30 on the buried insulation patterns 36 and the variable resistive patterns 34 may be filled with upper buried insulation patterns 48. The other elements of the present embodiment may have the same or similar configurations as described in the first embodiment. In this manner, in the present embodiment, the upper select transistor does not include a variable resistive layer pattern 34. Further, the other elements of the present embodiment may be formed using the same or similar manners as described in the first embodiment.

Eleventh Embodiment

Figure 38:
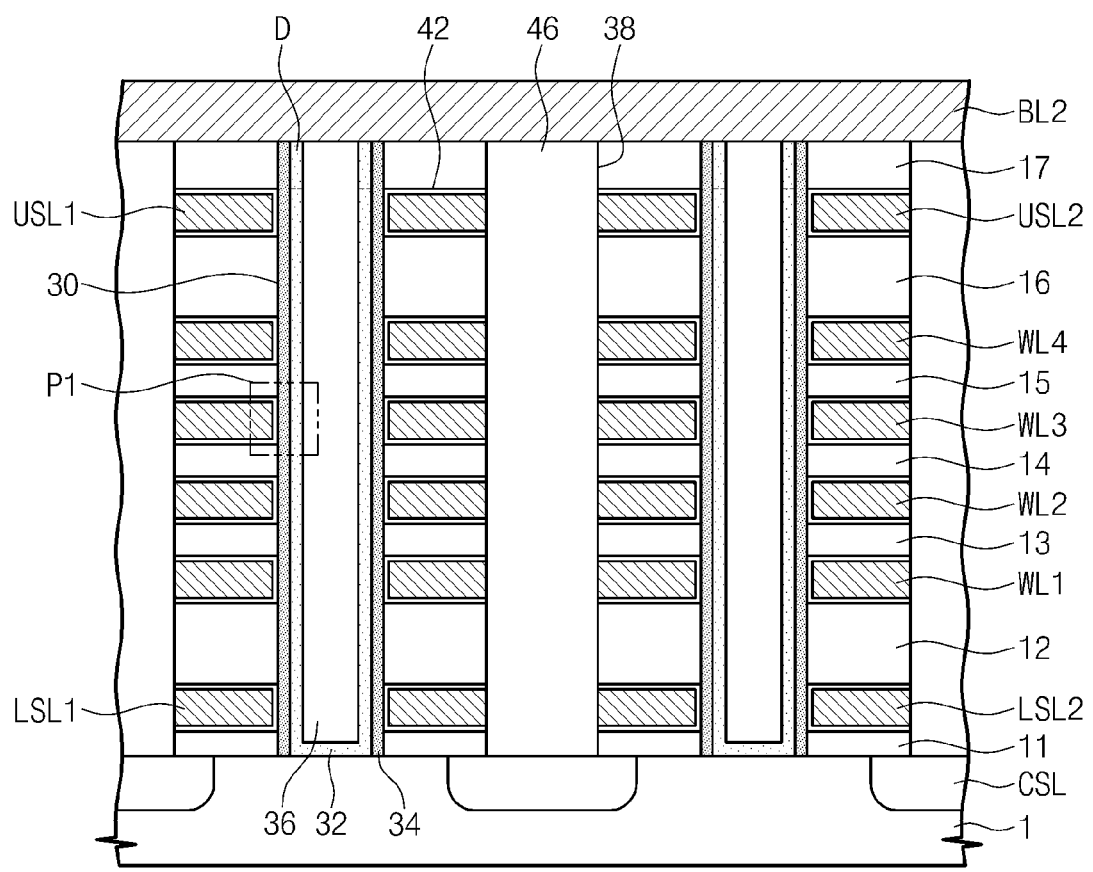
FIG. 38 is a cross-sectional view illustrating a resistive RAM device according to an eleventh embodiment of the present inventive concepts.
Figure 39:
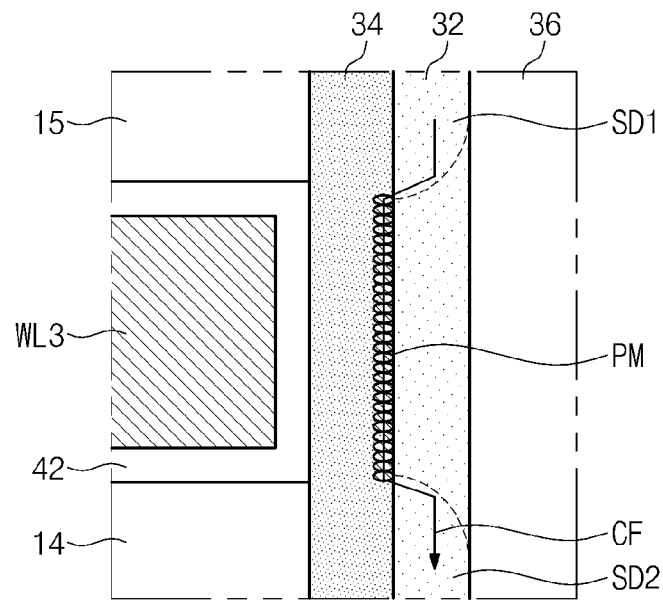
FIG. 39 is an enlarged view illustrating a portion 'P2' of FIG. 38 when a resistive RAM device according to an eleventh embodiment is programmed, in accordance with the present inventive concepts.
Figure 40:
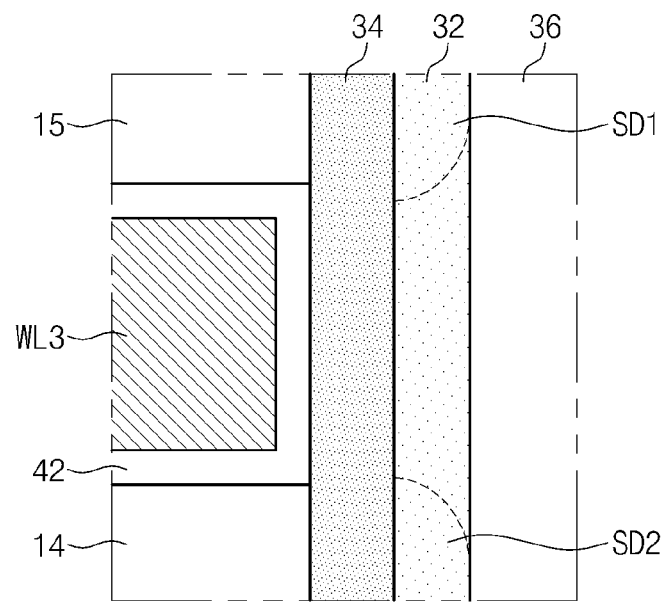
FIG. 40 is an enlarged view illustrating a portion 'P2' of FIG. 38 when a resistive RAM device according to an eleventh embodiment is erased, in accordance with the present inventive concepts.

FIG. 38 is a cross-sectional view illustrating a resistive RAM device according to an eleventh embodiment, in accordance with the present inventive concepts. FIG. 39 is an enlarged view illustrating a portion 'P2' of FIG. 38 when a resistive RAM device according to an eleventh embodiment is programmed, and FIG. 40 is an enlarged view illustrating a portion 'P2' of FIG. 38 when a resistive RAM device according to an eleventh embodiment is erased.

Referring to FIG. 38, a resistive RAM device according to the present embodiment may include spacer-shaped variable resistive patterns 34 covering respective ones of sidewalls of active holes 30 and cup-shaped active pillars 32 covering respective ones of inner sidewalls of the variable resistive patterns 34. Further, gate insulation layers 42 may cover portions of an outer sidewall of each variable resistive pattern 34. That is, the variable resistive patterns 34 may be disposed between the gate insulation layers 42 and the active pillars 32. In the present embodiment, each of sidewalls of the variable resistive patterns 34 may be very thin, for example, having a thickness of about 20 nanometers or less. If the variable resistive patterns 34 have thin sidewalls as described above, electric fields may be effectively and/or efficiently applied to the active pillars 32 adjacent to the variable resistive patterns 34 during operation of the resistive RAM device. The other elements of the present embodiment may have the same or similar configurations as described in the first embodiment.

The resistive RAM device shown in FIG. 38 may be programmed, erased and read in a similar manner as that described in the first embodiment. When the resistive RAM device according to the present embodiment is programmed, conductive filaments PM may be formed in the variable resistive patterns 34 as illustrated in FIG. 39. Further, when the resistive RAM device according to the present embodiment is erased, the conductive filaments PM formed in the variable resistive patterns 34 may be removed as illustrated in FIG. 40. When the programmed memory cell illustrated in FIG. 39 is selected to read out the data stored therein, a cell current may flow through the conductive filaments PM as indicated by an arrow 'CF' of FIG. 39 even though the cell transistor of the selected memory cell is turned off.

To fabricate the resistive RAM device illustrated in FIG. 38, active holes 30 may be formed in the same manner as that described herein, for example, in connection with the embodiment of FIG. 9, and variable resistive patterns 34 may be formed on sidewalls of the active holes 30. The variable resistive patterns 34 may be formed to have spacer shapes in the sense that they do not cover bottom portions of the holes. Thus, portions of the substrate 1 positioned under the active holes 30 may be exposed after formation of the variable resistive patterns 34. Active pillars 32 having cup shapes may then be formed in respective ones of the active holes 30 and surrounded by the variable resistive patterns 34. The other elements of the present embodiment may be formed using the same or similar manners as described in the first embodiment.

FIGS. 41, 42, 43, 44 and 45 are cross sectional views illustrating resistive RAM devices according to further modified embodiments of the eleventh embodiment.

Figure 41:
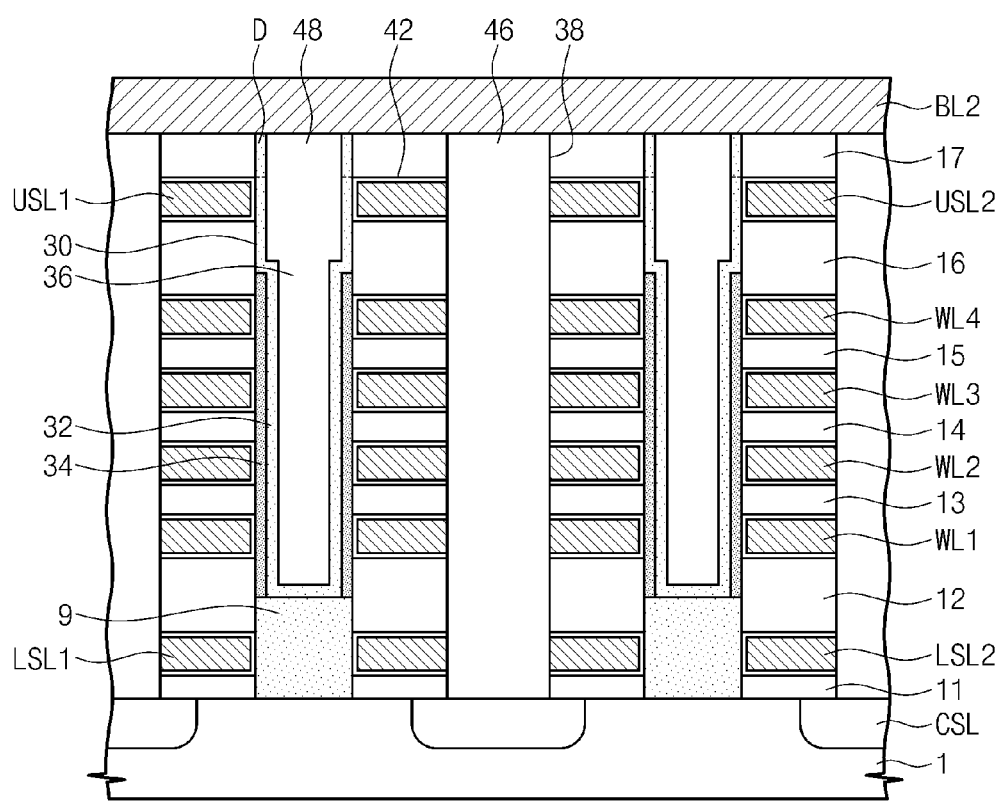
FIGS. 41, 42, 43, 44 and 45 are cross sectional views illustrating resistive RAM devices according to some modified embodiments of the eleventh embodiment.

Referring to FIG. 41, a resistive RAM device according to the present modified embodiment may include active pads 9 disposed between active pillars 32 and a substrate 1, and the active pads 9 and the active pillars 32 may be disposed in active holes 30 exposing the substrate 1. Variable resistive patterns 34 may be disposed between the active pillars 32 and sidewalls of the active holes 30. The variable resistive patterns 34 may extend to cover gate insulation layers 42 surrounding word lines WL1-WL4. Top surfaces of the variable resistive patterns 34 may be located at a level between the uppermost word lines (e.g., the fourth word lines WL4) and upper selection lines USL1-USL3, and bottom surfaces of the variable resistive patterns 34 may be located at a level between the lowermost word lines (e.g., the first word lines WL1) and lower selection lines LSL1-LSL3. The other elements of the present modified embodiment may have the same or similar configurations as illustrated in FIG. 38.

Figure 42:
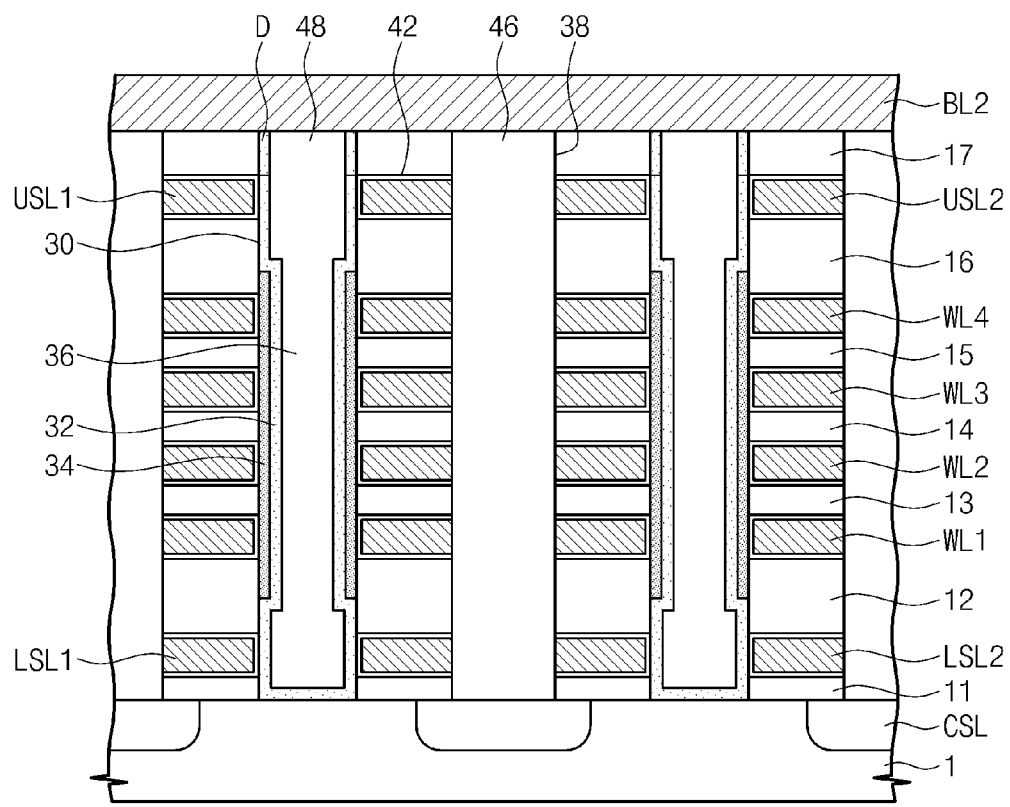

Referring to FIG. 42, a resistive RAM device according to the present modified embodiment may be similar to the resistive RAM device illustrated in FIG. 41. However, the resistive RAM device according to the present embodiment may not include the active pads 9 of the resistive RAM device illustrated in FIG. 41. Thus, the active pillars 32 may extend in a vertical direction to directly contact the substrate 1. The other elements of the present modified embodiment may have the same or similar configurations as illustrated in FIG. 41.

Figure 43:
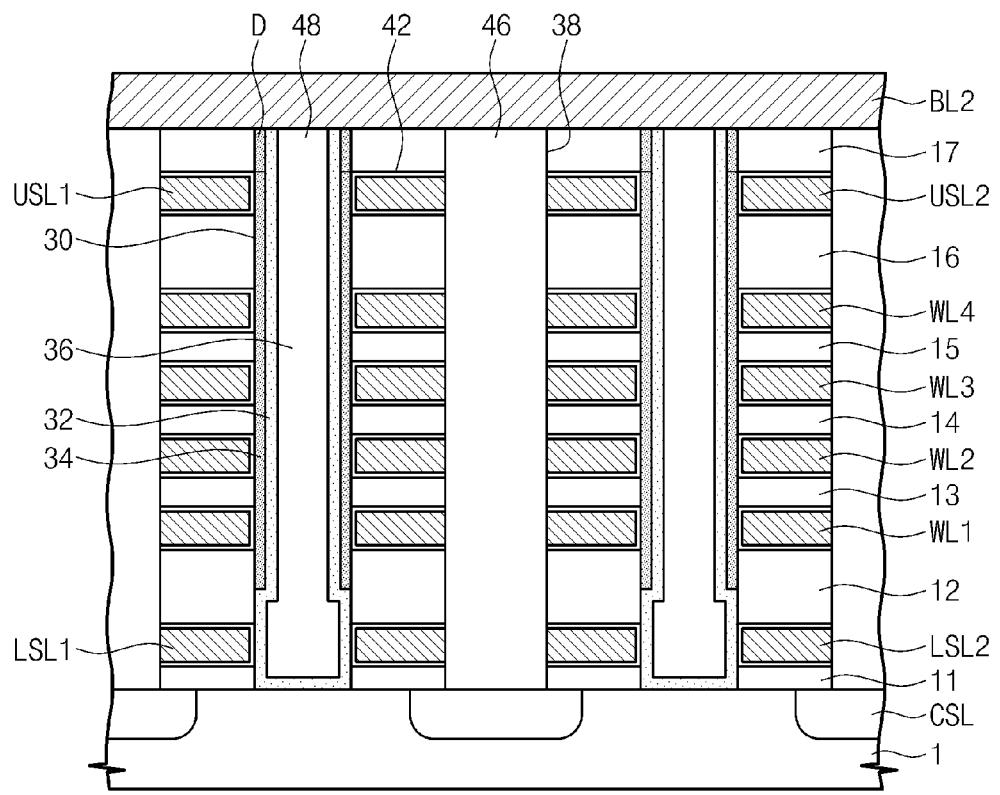

Referring to FIG. 43, a resistive RAM device according to the present modified embodiment may be similar to the resistive RAM device illustrated in FIG. 42. However, the variable resistive patterns 34 of the present modified embodiment may upwardly extend into interfaces between the upper selection lines USL1-USL3 and the active pillars 32. The other elements of the present modified embodiment may have the same or similar configurations as illustrated in FIG. 42.

Figure 44:
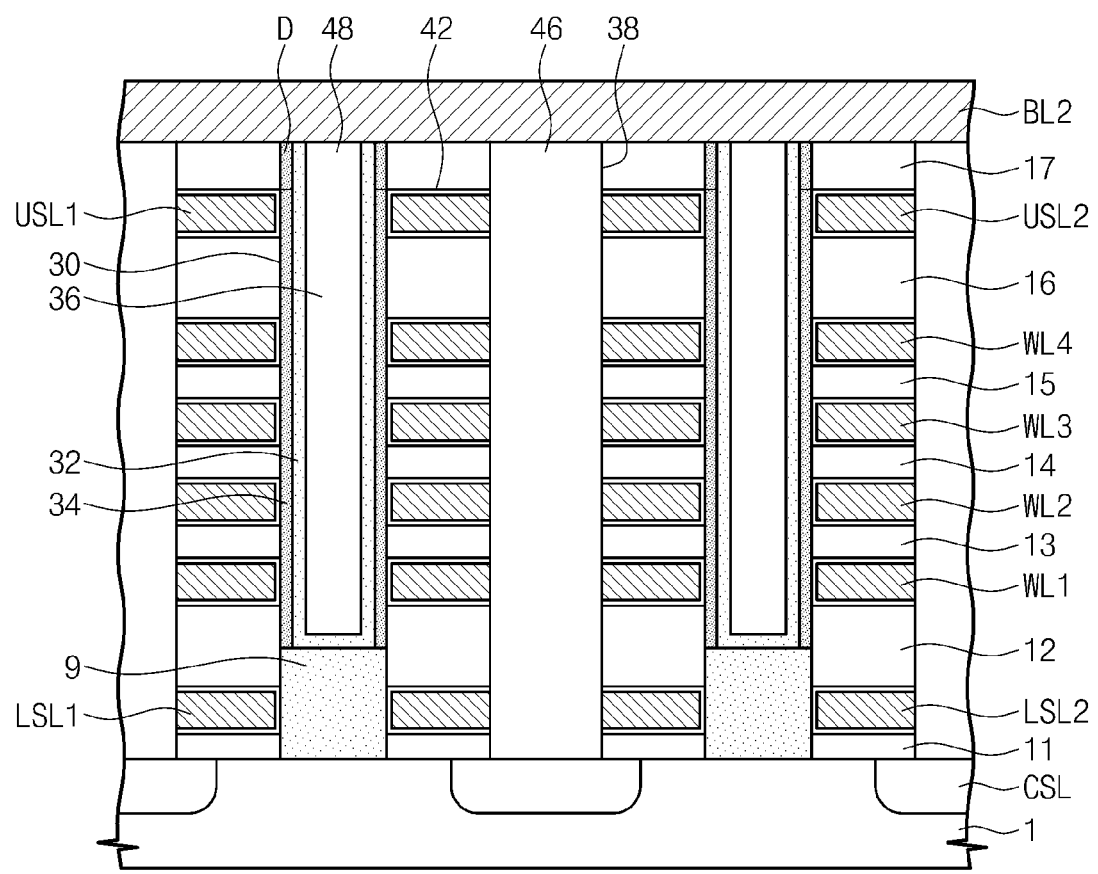

Referring to FIG. 44, a resistive RAM device according to the present modified embodiment may be similar to the resistive RAM device illustrated in FIG. 43. However, the resistive RAM device according to the present modified embodiment may include active pads 9 disposed between the variable resistive patterns 34 and the substrate 1. The other elements of the present modified embodiment may have the same or similar configurations as illustrated in FIG. 43.

Figure 45:
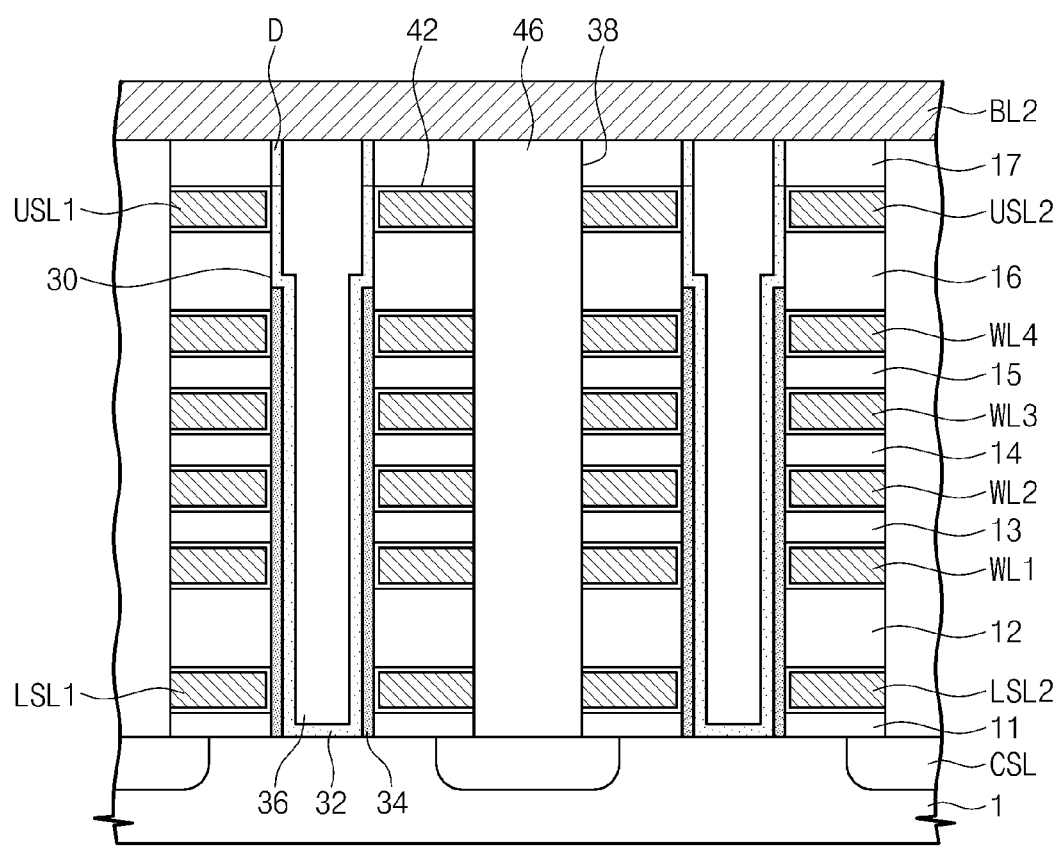

Referring to FIG. 45, a resistive RAM device according to the present modified embodiment may be similar to the resistive RAM device illustrated in FIG. 38. However, the variable resistive patterns 34 of the present modified embodiment may not extend to cover sidewalls of the upper selection lines USL1-USL3. That is, top surfaces of the variable resistive patterns 34 may be located at a level between the uppermost word lines (e.g., the fourth word lines WL4) and the upper selection lines USL1-USL3. The other elements of the present modified embodiment may have the same or similar configurations as illustrated in FIG. 38.

The resistive RAM devices illustrated in FIGS. 41, 42, 43, 44 and 45 may be fabricated in a same or similar manner as those described in the first to eleventh embodiments.

Figure 46:
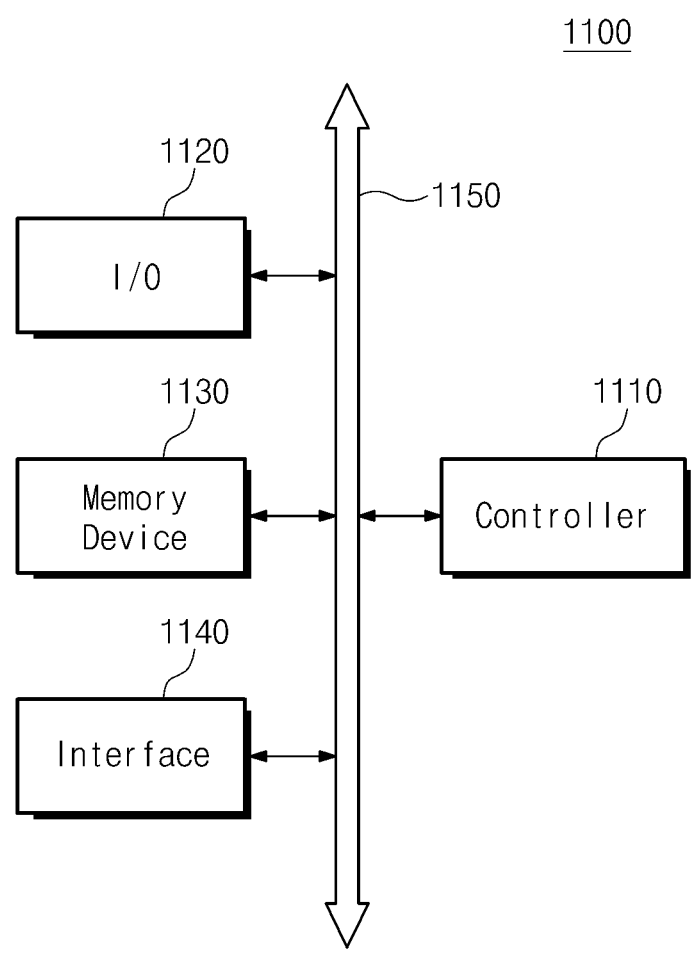
FIG. 46 is a schematic block diagram illustrating an example of memory systems including resistive RAM devices according to some embodiments of the present inventive concepts.

FIG. 46 is a schematic block diagram illustrating an example of memory systems including resistive RAM devices according to some embodiments.

Referring to FIG. 46, a memory system 1100 may be employed in personal digital assistants (PDAs), portable computers, web tablets, wireless phones, mobile phones, digital music players or memory cards. The memory system 1100 may also be employed in other electronic products that receive or transmit information data by wireless.

The memory system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one of a microprocessor, a digital signal processor (DSP), a microcontroller or the like. The memory device 1130 may store commands executed by the controller 1110. The I/O unit 1120 may receive data or signals from an external device or may transmit data or signals to the external device. The I/O unit 1120 may include a keypad, a keyboard or a display unit.

The memory device 1130 may include at least one of the resistive RAM devices according to the example embodiments described above. The memory device 1130 may further include another type of semiconductor memory devices which are different from the resistive RAM devices described in the above embodiments. For example, the memory device 1130 may further include another type of nonvolatile memory device or a volatile memory device.

The interface unit 1140 may transmit electrical data to a communication network or may receive electrical data from the communication network.

Figure 47:
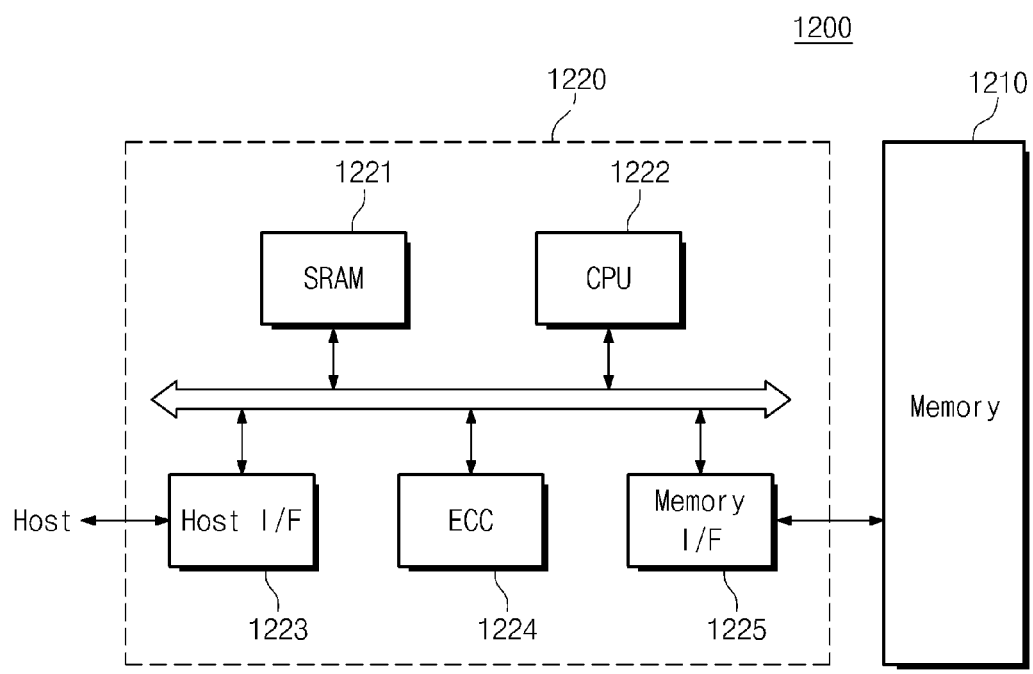
FIG. 47 is a schematic block diagram illustrating an example of memory cards including resistive RAM devices according to some embodiments of the present inventive concepts.

FIG. 47 is a schematic block diagram illustrating an example of memory cards including the resistive RAM devices according to the embodiments.

Referring to FIG. 47, a memory card 1200 may include a memory device 1210 having at least one of the resistive RAM devices according to the example embodiments described above. The memory card 1200 may be used as a data storage media for storing a large capacity of data. The memory card 1200 may further include a memory controller 1220 that controls data communication between a host and the memory device 1210.

The memory controller 1220 may include a static random access memory (SRAM) device 1221, a central processing unit (CPU) 1222, a host interface unit 1223, an error check and correction (ECC) block 1224 and a memory interface unit 1225. The SRAM device 1221 may be used as an operation memory of the CPU 1222. The host interface unit 1223 may be configured to include a data communication protocol between the memory card 1200 and the host. The ECC block 1224 may detect and correct errors of data which are read out from the memory device 1210. The memory interface unit 1225 may connect the memory controller 1220 to the memory device 1210. The central processing unit (CPU) 1222 may control overall operations for data communication of the memory controller 1220. Even though not shown in the drawings, the memory card 1200 may further include a read only memory (ROM) device that stores code data to interface with the host.

Figure 48:
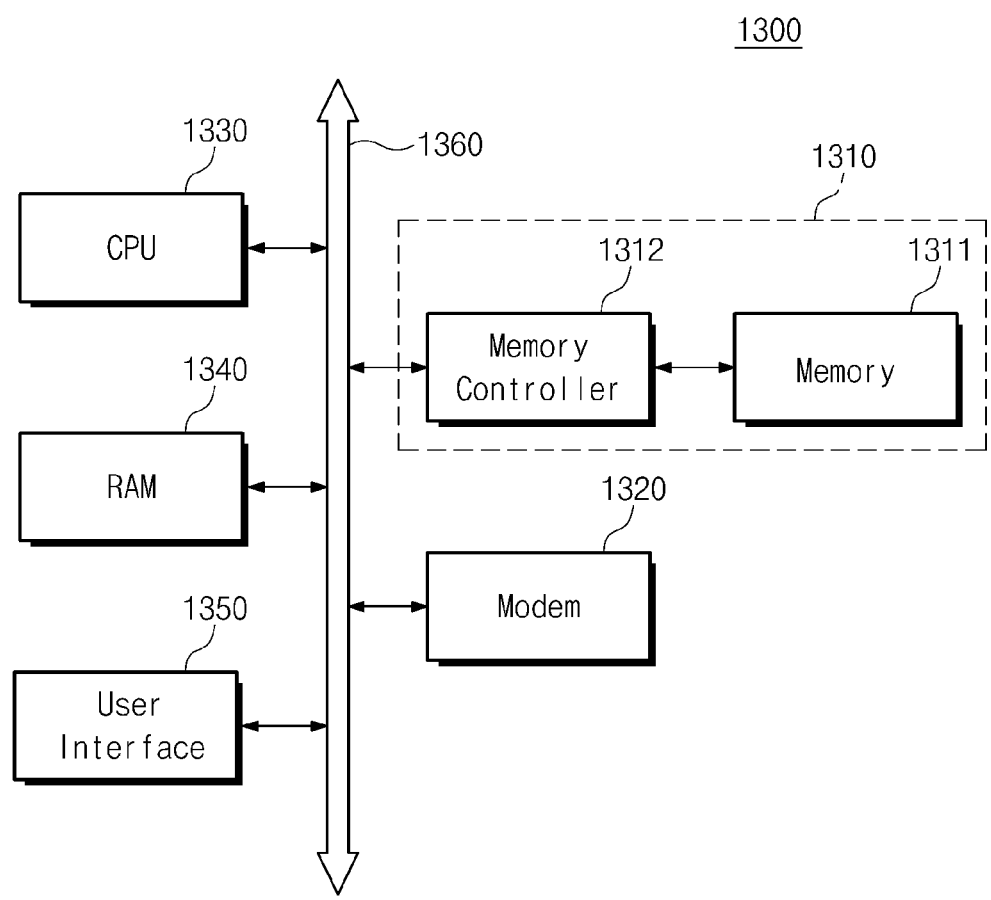
FIG. 48 is a schematic block diagram illustrating an example of information processing systems including resistive RAM devices according to some embodiments of the present inventive concepts.

FIG. 48 is a block diagram illustrating an example of information processing systems including the resistive RAM devices according to the embodiments.

Referring to FIG. 48, an information processing system 1300 may be a mobile system, a desk top computer or the like. The information processing system 1300 may include a memory unit 1310 having at least one of the resistive RAM devices according to the example embodiments described above. The information processing system 1300 may further include a modulator-demodulator (MODEM) 1320, a central processing unit (CPU) 1330, a random access memory (RAM) device 1340 and a user interface unit 1350. At least two of the memory unit 1310, the MODEM 1320, the CPU 1330, the RAM device 1340 and a user interface unit 1350 may communicate with each other through a data bus 1360. The memory unit 1310 may have substantially the same configuration as the memory card 1200 illustrated in FIG. 47. That is, the memory unit 1310 may include a memory device 1311 and a memory controller 1312 that controls overall operations of the memory device 1311.

The memory unit 1310 may store data processed by the CPU 1330 or data transmitted from an external system. The memory unit 1310 may be configured to include a solid state disk (SSD). In this case, the memory unit 1310 constituting the information processing system 1300 may stably and reliably store a large capacity of data. If the reliability of the memory unit 1310 is improved, the information processing system 1300 may save sources that are required to check and correct data. As a result, the information processing system 1300 may provide fast data communication. Even though not shown in the drawings, the information processing system 1300 may further include a camera image processor, an application chipset and/or an input/output unit.

The three-dimensional resistive RAM devices according to the example embodiments described above may be encapsulated using various packaging techniques. For example, the resistive RAM devices according to the aforementioned example embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the embodiments discussed above, selection transistors may be electrically connected in series to memory cells including variable resistive patterns. Thus, if the selection transistors are turned off, undesired cell leakage currents flowing through the cell transistors may be minimized.

Further, transition metal oxide layers instead of charge trap layers may be used as variable resistive layers operating as data storage elements. Thus, a program voltage, an erasure voltage and a read voltage may be lowered as compared with nonvolatile memory devices employing charge trap layers as the data storage elements.

Moreover, a plurality of dummy bit lines may be electrically connected in parallel to a common source line, and n-number of bit lines may be disposed in each of string blocks between the dummy bit lines. In this design configuration, a program voltage or an erasure voltage may be concurrently applied to m-number of bit lines among the n-number of bit lines disposed in one of the string blocks during a program mode or an erasure mode (the number 'm' is less than the number 'n'). Accordingly, the probability that the program errors or the erasure errors occur can be reduced because the common source line maintain a stable voltage level even though the program operation or the erasure operation is executed.

In addition, the variable resistive layers may be formed to contact active pillars which are used as channel layers of the cell transistors. Thus, resistive RAM devices including the variable resistive layers may be more readily fabricated.

While the inventive concepts have been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device comprising:
a substrate extending in a horizontal direction:
an active pillar on the substrate extending in a vertical direction relative to the horizontal direction of extension of the substrate;
a variable resistive pattern on the substrate extending in the vertical direction along the active pillar, an electrical resistance of the variable resistive pattern being variable in response to an oxidation or reduction thereof; and
a gate at a sidewall of the active pillar;
wherein the variable resistive pattern is a cup-shaped structure including sidewalls and a base.

2. The semiconductor device of claim 1 wherein the active pillar is a cup-shaped structure including sidewalls and a base.

3. The semiconductor device of claim 2 wherein the variable resistive pattern is at an inner region of the sidewalls of the active pillar and on the base of the active pillar.

4. The semiconductor device of claim 2 wherein the variable resistive pattern is a hollow structure including sidewalls at an inner region of the sidewalls of the active pillar.

5. A semiconductor device comprising:
a substrate extending in a horizontal direction:
an active pillar on the substrate extending in a vertical direction relative to the horizontal direction of extension of the substrate;
a variable resistive pattern on the substrate extending in the vertical direction along the active pillar, an electrical resistance of the variable resistive pattern being variable in response to an oxidation or reduction thereof; and
a gate at a sidewall of the active pillar,
wherein the active pillar is a cup-shaped structure including sidewalls and a base, and wherein the sidewalls of the active pillar comprise first and second active layers.

6. The semiconductor device of claim 1 further comprising a pad of single crystal material between the active pillar and the substrate.

7. The semiconductor device of claim 6 wherein the pad of single crystal material has outer sidewalls that are aligned with outer sidewalls of the active pillar.

8. The semiconductor device of claim 1 wherein a bottom portion of the active pillar is in contact with the substrate and wherein a bottom portion of the resistive pattern is spaced apart from the bottom portion of the active pillar in the vertical direction.

9. The semiconductor device of claim 1 wherein the resistive pattern has a thickness in the horizontal direction that is less than about 20 nm.

10. The semiconductor device of claim 1 wherein the variable resistive pattern is a hollow structure having sidewalls and wherein the active pillar is at an inner region of the sidewalls of the variable resistive pattern.

11. The semiconductor device of claim 1 further comprising:
   a plurality of interlayer dielectric layers on the substrate;
   a plurality of gate patterns, each gate pattern between a neighboring lower interlayer dielectric layer and a neighboring upper interlayer dielectric layer;
   wherein the active pillar and the variable resistive pattern extends in the vertical direction through the plurality of interlayer dielectric layers and the plurality of gate patterns;
   wherein:
      an upper-most gate pattern of the plurality of gate patterns comprises an upper select gate of an upper select transistor;
      a lower-most gate pattern of the plurality of gate patterns comprises a lower select gate of a lower select transistor; and
      remaining gate patterns of the plurality of gate patterns between the upper select gate and the lower select gate comprise control gates of memory cell transistors of a common string of the semiconductor device; and
   wherein the semiconductor device comprises a semiconductor memory device.

12. The semiconductor device of claim 11 wherein:
   control gates of memory cell transistors sharing a same layer of the device arranged in a first horizontal direction of the semiconductor device are connected to provide word lines of the semiconductor memory device;
   memory cell transistors of a common string of the semiconductor device are coupled together in series by the vertical channel; and
   upper portions of vertical channels arranged in a second horizontal direction of the semiconductor device are connected to provide bit lines of the semiconductor memory device.

13. The semiconductor device of claim 11 wherein:
   the upper-most gate pattern comprises first and second upper-most gate patterns for first and second upper select gates of first and second upper select transistors of the semiconductor memory device; and
   the lower-most gate pattern comprises first and second lower-most gate patterns for first and second lower select gates of first and second lower select transistors of the semiconductor memory device.

14. The semiconductor device of claim 11 wherein:
   the active pillar is adjacent, in the horizontal direction, the upper select gate of the upper select transistor, the lower select gate of the lower select transistor, and the control gates of the memory cell transistors; and
   the variable resistive pattern is adjacent, in the horizontal direction, the control gates of the memory cell transistors, and is not adjacent, in the horizontal direction, the upper select gate of the upper select transistor and the lower select gate of the lower select transistor.

15. The semiconductor device of claim 14 further comprising a pad of single crystal material between the active pillar and the substrate.

16. The semiconductor device of claim 11 wherein:
   the active pillar is adjacent, in the horizontal direction, the upper select gate of the upper select transistor, the lower select gate of the lower select transistor, and the control gates of the memory cell transistors; and
   the variable resistive pattern is adjacent, in the horizontal direction, the control gates of the memory cell transistors and the lower select gate of the lower select transistor, and is not adjacent, in the horizontal direction, the upper select gate of the upper select transistor.

17. The semiconductor device of claim 11 wherein the variable resistive pattern is a hollow structure having sidewalls and wherein the active pillar is at an inner region of the sidewalls of the variable resistive pattern.

18. The semiconductor device of claim 17 further comprising a pad of single crystal material between the active pillar and the substrate, wherein:
   the pad of single crystal material is adjacent, in the horizontal direction, the lower select gate of the lower select transistor;
   the active pillar is adjacent, in the horizontal direction, the control gates of the memory cell transistors and the upper select gate of the upper select transistor; and
   the variable resistive pattern is adjacent, in the horizontal direction, the control gates of the memory cell transistors, and is not adjacent, in the horizontal direction, the lower select gate of the lower select transistor and the upper select gate of the upper select transistor.

19. The semiconductor device of claim 17 further comprising a pad of single crystal material between the active pillar and the substrate, wherein:
   the pad of single crystal material is adjacent, in the horizontal direction, the lower select gate of the lower select transistor;
   the active pillar is adjacent, in the horizontal direction, the control gates of the memory cell transistors and the upper select gate of the upper select transistor; and
   the variable resistive pattern is adjacent, in the horizontal direction, the control gates of the memory cell transistors and the upper select gate of the upper select transistor, and is not adjacent, in the horizontal direction, the lower select gate of the lower select transistor.

20. The semiconductor device of claim 17, wherein:
   the active pillar is adjacent, in the horizontal direction, the lower select gate of the lower select transistor the control gates of the memory cell transistors and the upper select gate of the upper select transistor; and
   the variable resistive pattern is adjacent, in the horizontal direction, the control gates of the memory cell transistors, and is not adjacent, in the horizontal direction, the lower select gate of the lower select transistor and the upper select gate of the upper select transistor.

21. The semiconductor device of claim 17, wherein:
   the active pillar is adjacent, in the horizontal direction, the lower select gate of the lower select transistor the control gates of the memory cell transistors and the upper select gate of the upper select transistor; and
   the variable resistive pattern is adjacent, in the horizontal direction, the control gates of the memory cell transistors and the upper select gate of the upper select transistor, and is not adjacent, in the horizontal direction, the lower select gate of the lower select transistor.

22. The semiconductor device of claim 17, wherein:
   the active pillar is adjacent, in the horizontal direction, the lower select gate of the lower select transistor the control gates of the memory cell transistors and the upper select gate of the upper select transistor; and the variable resistive pattern is adjacent, in the horizontal direction, the lower select gate of the lower select transistor and the control gates of the memory cell transistors, and is not adjacent, in the horizontal direction, the upper select gate of the upper select transistor.

* * * * *